United States Patent
Ohtani et al.

(10) Patent No.: US 7,420,211 B2
(45) Date of Patent: Sep. 2, 2008

(54) WIRING LINE AND MANUFACTURE PROCESS THEREOF, AND SEMICONDUCTOR DEVICE AND MANUFACTURING PROCESS THEREOF

(75) Inventors: Hisashi Ohtani, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 222 days.

(21) Appl. No.: 10/968,238

(22) Filed: Oct. 18, 2004

(65) Prior Publication Data

US 2005/0056837 A1     Mar. 17, 2005

Related U.S. Application Data

(62) Division of application No. 10/356,976, filed on Feb. 3, 2003, now Pat. No. 6,809,021, which is a division of application No. 09/465,083, filed on Dec. 16, 1999, now Pat. No. 6,545,359.

(30) Foreign Application Priority Data

| Dec. 18, 1998 | (JP) | ................................ 10-376007 |
| Dec. 18, 1998 | (JP) | ................................ 10-376008 |
| Dec. 28, 1998 | (JP) | ................................ 10-372753 |

(51) Int. Cl.
*H01L 29/04* (2006.01)
*H01L 29/15* (2006.01)

(52) U.S. Cl. .............................. 257/72; 257/59; 257/72; 257/758; 257/775; 257/750; 438/22; 438/128

(58) Field of Classification Search ................. 257/72, 257/59, 758, 775, 750, E29.273; 438/22, 438/128
See application file for complete search history.

(56) References Cited

U.S. PATENT DOCUMENTS 4,433,470 A     2/1984   Kameyama et al. ......... 438/323

(Continued)

FOREIGN PATENT DOCUMENTS

JP          02-012859          1/1990

(Continued)

OTHER PUBLICATIONS

Hatano, M. et al, "A Novel Self-Aligned Gate-Overlapped LDD Poly-Si TFT with High Reliability and Performance," IEDM 97, pp. 523-526, (1997).

(Continued)

*Primary Examiner*—Kenneth Parker
*Assistant Examiner*—Joseph Nguyen
(74) *Attorney, Agent, or Firm*—Cook Alex Ltd.

(57) ABSTRACT

To provide a technique for manufacturing a wiring line having a low resistance and a high heat resistance so as to make an active matrix type display device larger and finer. The wiring line is constructed of a laminated structure of a refractory metal, a low resistance metal and a refractory metal, and the wiring line is further protected with an anodized film. As a result, it is possible to form the wiring line having the low resistance and the high heat resistance and to form a contact with an upper line easily.

82 Claims, 25 Drawing Sheets

U.S. PATENT DOCUMENTS

| | | | |
|---|---|---|---|
| 5,247,190 A | 9/1993 | Friend et al. | 257/40 |
| 5,305,519 A | 4/1994 | Yamamoto et al. | 29/852 |
| 5,323,042 A | 6/1994 | Matsumoto | 257/350 |
| 5,359,219 A | 10/1994 | Hwang | 257/351 |
| 5,399,502 A | 3/1995 | Friend et al. | 437/1 |
| 5,412,240 A | 5/1995 | Inoue et al. | 257/347 |
| 5,430,320 A | 7/1995 | Lee | 257/412 |
| 5,482,871 A | 1/1996 | Pollack | 437/21 |
| 5,567,966 A | 10/1996 | Hwang | 257/347 |
| 5,594,569 A | 1/1997 | Konuma et al. | 349/122 |
| 5,627,345 A | 5/1997 | Yamamoto et al. | 174/265 |
| 5,631,478 A | 5/1997 | Okumura | 257/211 |
| 5,643,826 A | 7/1997 | Ohtani et al. | 437/88 |
| 5,648,277 A | 7/1997 | Zhang et al. | 437/21 |
| 5,734,187 A | 3/1998 | Bohr et al. | 257/377 |
| 5,798,559 A | 8/1998 | Bothra et al. | 257/522 |
| 5,866,484 A | 2/1999 | Muto | 438/738 |
| 5,879,982 A | 3/1999 | Park et al. | 438/241 |
| 5,923,962 A | 7/1999 | Ohtani et al. | 438/150 |
| 5,937,321 A | 8/1999 | Beck et al. | 438/622 |
| 5,946,799 A | 9/1999 | Yamamoto et al. | 29/852 |
| 6,015,997 A | 1/2000 | Hu et al. | 257/412 |
| 6,016,000 A | 1/2000 | Moslehi | 257/522 |
| 6,030,904 A * | 2/2000 | Grill et al. | 438/781 |
| 6,075,292 A | 6/2000 | Noguchi | 257/758 |
| 6,088,596 A * | 7/2000 | Kawakami et al. | 455/466 |
| 6,096,630 A | 8/2000 | Byun et al. | 438/592 |
| 6,100,573 A | 8/2000 | Lu et al. | 257/508 |
| 6,118,163 A | 9/2000 | Gardner et al. | 257/412 |
| 6,133,628 A | 10/2000 | Dawson | 257/698 |
| 6,166,396 A | 12/2000 | Yamazaki | 257/59 |
| 6,175,156 B1 | 1/2001 | Mametani et al. | 257/758 |
| 6,198,133 B1 | 3/2001 | Yamazaki et al. | 257/347 |
| 6,246,118 B1 | 6/2001 | Buynoski | 257/758 |
| 6,281,552 B1 | 8/2001 | Kawasaki et al. | 257/350 |
| 6,495,857 B2 | 12/2002 | Yamazaki | 257/59 |
| 6,545,359 B1 * | 4/2003 | Ohtani et al. | 257/758 |
| 6,787,444 B2 * | 9/2004 | Gardner | 438/618 |
| 2001/0001496 A1 | 5/2001 | Yamazaki | 257/347 |
| 2005/0007329 A1 | 1/2005 | Hiroki et al. | |

FOREIGN PATENT DOCUMENTS

| | | |
|---|---|---|
| JP | 02-237039 | 9/1990 |
| JP | 03-194938 | 8/1991 |
| JP | 4-369271 | 12/1992 |
| JP | 5-102483 | 4/1993 |
| JP | 07-130652 | 5/1995 |
| JP | 7-130652 | 5/1995 |
| JP | 07-135318 | 5/1995 |
| JP | 07-226515 | 8/1995 |
| JP | 07-263589 | 10/1995 |
| JP | 07-335900 | 12/1995 |
| JP | 8-078329 | 3/1996 |
| JP | 08-078329 | 3/1996 |
| JP | 09-045927 | 2/1997 |
| JP | 09-172070 | 6/1997 |
| JP | 10-91640 * | 4/1998 |
| JP | 10-092576 | 4/1998 |
| JP | 10-135468 | 5/1998 |
| JP | 10-135469 | 5/1998 |
| JP | 10-178095 | 6/1998 |
| JP | 10-247735 | 9/1998 |
| WO | WO 90/13148 | 11/1990 |

OTHER PUBLICATIONS

Schenk, H. et al, "Polymers for Light Emitting Diodes," EURODISPLAY '99, Proceedings of the 19th International Display Research Conference, Berlin, Germany Sep. 6-9, pp. 33-37, (1999).

U.S. Appl. No. 09/464,189 (pending) to Ohtani et al filed Dec. 16, 1999, including specification, claims, abstract, drawings and PTO filing receipt.

\* cited by examiner n CHANNEL TFT   p CHANNEL TFT   CONTACT PORTION

GATE-OVERLAPPED LDD   NON-GATE-OVERLAPPED LDD

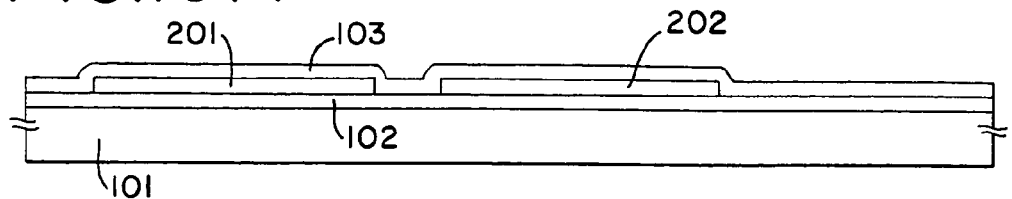
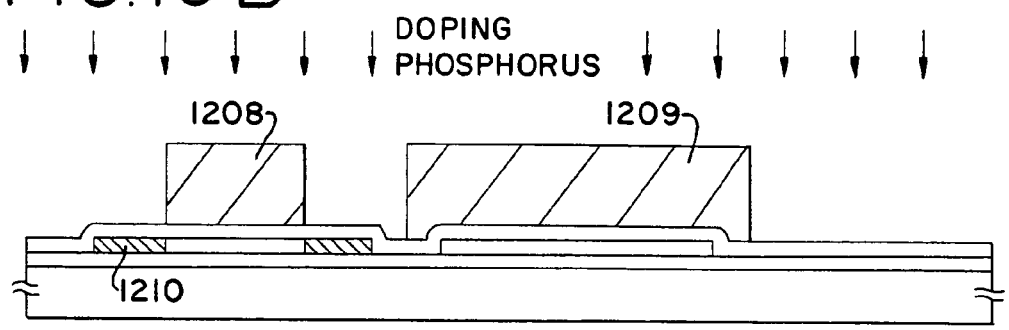
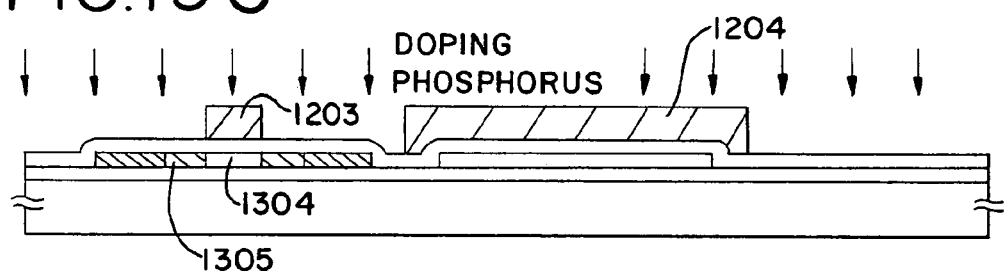
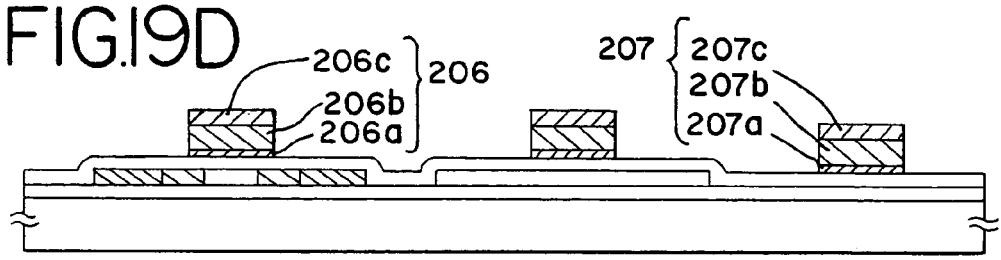
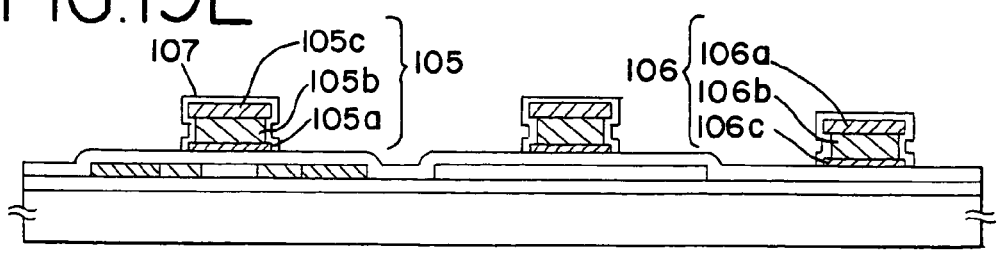

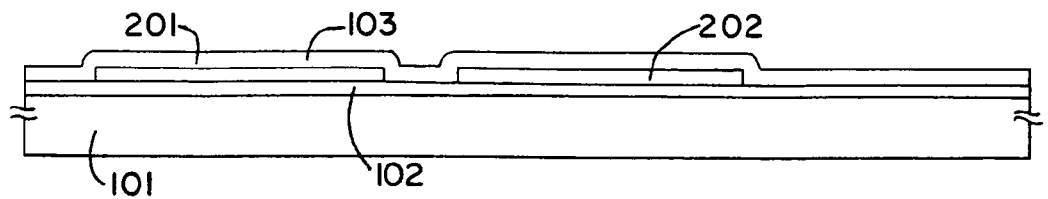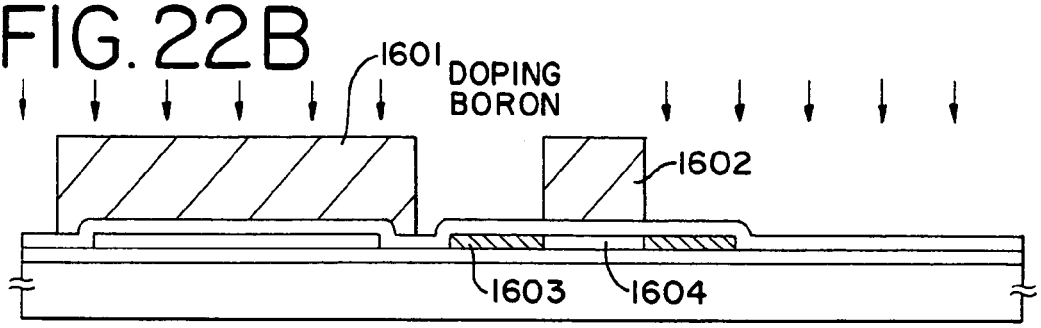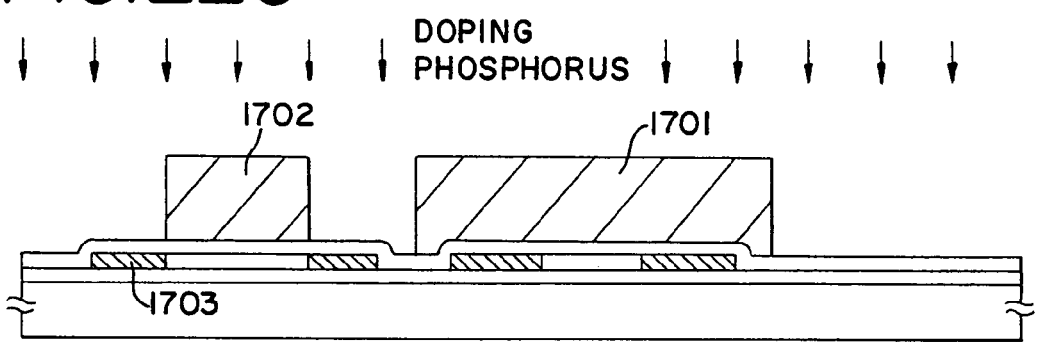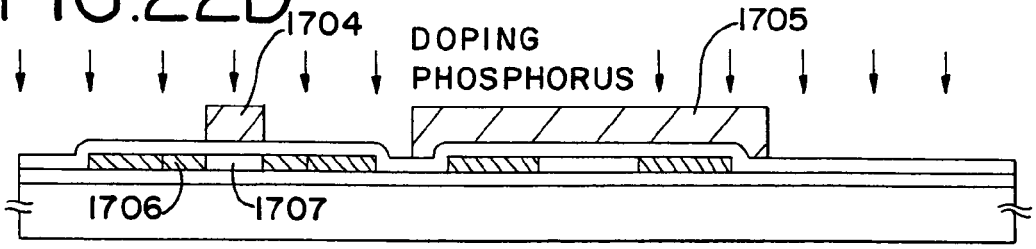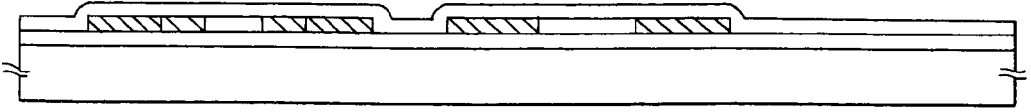

WIRING LINE AND MANUFACTURE PROCESS THEREOF, AND SEMICONDUCTOR DEVICE AND MANUFACTURING PROCESS THEREOF

This application is a divisional of U.S. application Ser. No. 10/356,976, filed on Feb. 3, 2003 now U.S. Pat. No. 6,809,021 which is a divisional of U.S. application Ser. No. 09/465,083, filed on Dec. 16, 1999 (now U.S. Pat. No. 6,545,359 issued Apr. 8, 2003).

BACKGROUND OF THE INVENTION

1. Field of the Invention

The present invention relates to a semiconductor device including a thin film transistor (TFT) and a device manufacture process thereof, and a contact structure (or a connection structure) of the wiring line in a semiconductor device and a contact forming process thereof. The semiconductor device of the invention includes not only an element such as a thin film transistor (TFT) or a MOS transistor but also a display device including a semiconductor circuit composed of such insulated gate type transistors, and an electrooptical device such as an image sensor. In addition, the semiconductor device of the invention includes an electronic device having such display device and electrooptical device.

2. Related Art

The thin film transistor (as will be called the "TFT") can be formed over a transparent glass substrate so that its application and development to the active matrix type display device has been positively proceeded. In the active matrix type display device, an electric field to be applied to liquid crystals is controlled in a matrix shape by a plurality of pixels arranged in the matrix shape thereby to realize a highly fine image display. The TFT utilizing a crystalline semiconductor film can achieve a high mobility so that a highly fine image display can be realized by integrating functional circuits over a common substrate.

The active matrix type display device requires more TFTs as many as one million for the pixels as the resolution of the screen becomes finer. If the functional circuits are added, the more TFTs are required to retain the reliabilities and stable actions of the individual TFTs so that the liquid crystal display device may stably act.

The specifications required of the actual liquid crystal display device (as also called the "liquid crystal panel") are so strict that both the pixels and the drivers have to retain high reliabilities for the normal operations of all pixels. Especially when the driver circuit is troubled, the pixels of one column (or row) cause malfunctions to invite a defect called the "line defect". If one pixel is troubled, on the other hand, this trouble is called the "point defect".

Most of the aforementioned line defect and point defect are caused by the malfunctions of the TFTs.

On the other hand, the material used for wiring these TFTs is exemplified by Al, Ta or Ti, of which aluminum having a low resistivity is frequently used. However, aluminum has a low resistance but has a drawback of a low heat resistance.

When the TFT is manufactured by using aluminum as the material for the gate line (including the gate electrode), a projection such as the hillock or whisker has been formed by the heat treatment to cause the malfunction of the TFT or lower the TFT characteristics. On the other hand, the aluminum atoms are caused by the heat treatment to diffuse into a gate insulating film and a channel forming region to cause the malfunction of the TFT or lower the TFT characteristics.

On the other hand, our Unexamined Published Japanese Patent Application No. 7-135318 which corresponds to a U.S. Pat. No. 5,648,277 has disclosed the TFT structure in which the periphery of a gate line is protected with an oxide film (or an alumina film) by using a thin film (as also called the "aluminum alloy") composed mainly of aluminum as the gate line. When the TFT structure of the Japanese Patent Application is adopted, it is possible to prevent formation of the projection such as the hillock or whisker, but it is difficult to remove a barrier type anodized film (or an anodized film using a neutral electrolyte) formed over a gate electrode and to form a contact between the gate electrode and a lead-out electrode. Therefore, a malfunction is invited by the poor contact between the gate electrode and the lead-out electrode. In the peripheral drive circuit, on the other hand, a temperature rise or the like is caused by a large-current operation so that a reliable contact is also demanded.

On the other hand, the contact can be formed by using a special etchant, as called the "chromium-mixed acid (an etchant prepared by mixing an aqueous solution of chromic acid, phosphoric acid, nitric acid, acetic acid and water) as one for selectively removing only the barrier type anodized film formed over the gate electrode. However, the process using a heavy metal chromium, as may be detrimental to human bodies, is not industrially desirable. On the other hand, the etchant to take place of that chromium-mixed acid is not found at present.

On the other hand, the TFT utilizing a poly-silicon film is still inferior in the reliability to the MOSFET (a transistor formed over a single-crystalline semiconductor substrate) to be used in the LSI. So long as this weak point is not eliminated, moreover, there has been widely accepted a viewpoint that it is difficult to form the LSI circuit with the TFT.

SUMMARY OF THE INVENTION

The invention has been conceived in view of the problems thus far described and has an object to provide a technique for manufacturing a wiring line of a low resistance and a high heat resistance so as to make the active matrix type display device larger and finer.

Another object of the invention is to provide a contact structure which provides an excellent ohmic contact between a first wiring line and a second wiring line without a noxious etchant such as the chromium-mixed acid.

Still another object of the invention is to provide a highly reliable semiconductor device including a semiconductor circuit which has such contact structure and which is formed of TFTs proud of a reliability equivalent to or higher than that of MOSFETs.

In order to solve the above-specified problems, the invention has a main construction in which a gate line (including a gate electrode) made of only aluminum in the prior art is give a laminated structure of a refractory metal, a metal of low resistivity and a refractory metal and in which the gate line is protected by an anodized film. By utilizing the invention, it is possible to form a gate line having a low resistance and a high heat resistance and to form a contact with the gate line easily.

According to a first construction of the invention to be disclosed herein, there is provided a wiring line comprising a multi-layered film in which a first conductive layer, a second conductive layer and a third conductive layer are laminated in the recited order, wherein the surfaces of the first conductive layer, the second conductive layer and the third conductive layer are oxidized to form oxide films, and wherein the second conductive layer has a width different from those of the first conductive layer and the third conductive layer.

In the aforementioned construction, the oxide film of the first conductive layer, the oxide film of the second conductive layer and the oxide film of the third conductive layer are of the barrier type.

In each of the aforementioned constructions, on the other hand, the third conductive layer is made of a valve metal.

In the aforementioned constructions, on the other hand, the second conductive layer is made of a material composing aluminum or titanium as its main component.

According to the construction on the manufacture process for practicing the invention, on the other hand, there is provided a process for manufacturing a wiring line, comprising the steps of forming a multi-layered film in which a first conductive layer, a second conductive layer and a third conductive layer are laminated in the recited order;

patterning the multi-layered film to form a wiring line; and anodizing the wiring line;

wherein at the anodizing step, the first conductive layer, the second conductive layer and the third conductive layer are anodized in the same forming solution, and wherein the second conductive layer has a width different from those of the first conductive layer and the third conductive layer.

The aforementioned construction is characterized in that the wiring line (including an electrode) is constructed of a laminated structure of three or more layers. Moreover, this wiring line is protected with an anodized film.

In order to solve the aforementioned problems, on the other hand, the invention provides as its main construction of a semiconductor device in which a first wiring line has a laminated structure of three or more layers and which has a contact structure (of a first wiring line and a second wiring line) realizing an excellent ohmic contact. By utilizing the invention, it is possible to form the first wiring line having a low resistance and a high heat resistance and to form the contact between the first wiring line and the second wiring line easily.

According to the construction of the invention to be disclosed herein, there is provided a semiconductor device comprising:

a first wiring line including a multi-layered film in which a first conductive layer, a second conductive layer and a third conductive layer are laminated in the recited order;

an insulating film covering the first wiring line; and a second wiring line formed over the insulating film and electrically connected with the first wiring line, wherein in order to connect the first wiring line and the second wiring line, there is formed a contact hole extending through the insulating film and the third conductive layer and exposing the second conductive layer at its bottom portion, and wherein the second wiring line and the exposed second conductive layer contact with each other.

According to another construction of the invention, on the other hand, there is provided a semiconductor device comprising:

a first wiring line including a multi-layered film in which a first conductive layer, a second conductive layer and a third conductive layer are laminated in the recited order;

an insulating film covering the first wiring line; and a second wiring line formed over the insulating film and electrically connected with the first wiring line, wherein in order to connect the first wiring line and the second wiring line, there is formed a contact hole extending through the insulating film and exposing the third conductive layer at its bottom portion, and wherein the second wiring line and the exposed third conductive layer contact with each other.

According to another construction of the invention, on the other hand, there is provided a semiconductor device comprising:

a first wiring line including a multi-layered film in which a first conductive layer, a second conductive layer and a third conductive layer are laminated in the recited order;

an insulating film covering the first wiring line; and a second wiring line formed over the insulating film and electrically connected with the first wiring line, wherein the first wiring line is covered at its surface with the oxide films of the individual conductive layers constructing the multi-layered film, wherein in order to connect the first wiring line and the second wiring line, there is formed a contact hole extending through the insulating film, the oxide film of the first wiring line and the third conductive layer and exposing the second conductive layer at its bottom portion, and wherein the second wiring line and the exposed second conductive layer contact with each other.

According to another construction of the invention, on the other hand, there is provided a semiconductor device comprising:

a first wiring line including a multi-layered film in which a first conductive layer, a second conductive layer and a third conductive layer are laminated in the recited order;

an insulating film covering the first wiring line; and a second wiring line formed over the insulating film and electrically connected with the first wiring line, wherein the first wiring line is covered at its surface with the oxide films of the individual conductive layers constructing the multi-layered film, wherein in order to connect the first wiring line and the second wiring line, there is formed a contact hole extending through the insulating film and the oxide film of the first wiring line and exposing the third conductive layer at its bottom portion, and wherein the second wiring line and the exposed third conductive layer contact with each other.

In each of the aforementioned constructions, the third wiring line is made of a material containing a valve metal as its main component.

In each of the aforementioned constructions, the oxide film of the second conductive layer is an anodized film of the barrier type.

According to another construction of the invention, on the other hand, there is provided a semiconductor device comprising:

a first wiring line including a multi-layered film in which a first conductive layer, a second conductive layer and a third conductive layer are laminated in the recited order;

an insulating film covering the first wiring line; and a second wiring line formed over the insulating film and electrically connected with the first wiring line, wherein the first wiring line is oxidized at its side portion so that the second conductive layer composing the multi-layered film is covered at its side portion with the oxide film, wherein in order to connect the first wiring line and the second wiring line, there is formed a contact hole extending through the insulating film, the oxide film of the first wiring line and the third conductive layer and exposing the second conductive layer at its bottom portion, and wherein the second wiring line and the exposed second conductive layer contact with each other.

In each of the aforementioned constructions, on the other hand, the first wiring line is the gate line of a thin film transistor.

According to the construction on a manufacture process for practicing the invention, on the other hand, there is provided a process for manufacturing a semiconductor device, comprising the steps of:

forming a multi-layered film in which a first conductive layer, a second conductive layer and a third conductive layer are laminated in the recited order;

patterning the multi-layered film to form a first wiring line;

forming an insulating film covering the first wiring line;

forming a contact hole extending through the insulating film and reaching the first wiring line; and forming over the insulating film a second wiring line electrically connected with the first wiring line through the contact hole, wherein the contact hole extends through the third conductive layer and exposes the second conductive layer at its bottom portion, and wherein the second wiring line contacts with the second conductive layer.

According to another construction of the invention on the manufacture process, on the other hand, there is provided a process for manufacturing a semiconductor device, comprising the steps of:

forming a multi-layered film in which a first conductive layer, a second conductive layer and a third conductive layer are laminated in the recited order;

patterning the multi-layered film to form a first wiring line;

forming an insulating film covering the first wiring line;

forming a contact hole extending through the insulating film and reaching the first wiring line; and forming over the insulating film a second wiring line electrically connected with the first wiring line through the contact hole, wherein the second conductive layer is exposed at the bottom portion of the contact hole to bring the second wiring line into close contact with the second conductive layer.

According to another construction of the invention on the manufacture process, on the other hand, there is provided a process for manufacturing a semiconductor device, comprising the steps of:

forming a multi-layered film in which a first conductive layer, a second conductive layer and a third conductive layer are laminated in the recited order;

patterning the multi-layered film to form a first wiring line;

anodizing the first wiring line to form on its surface the anodized films of the individual conductive layers composing the multi-layered film;

forming an insulating film covering the first wiring line;

forming a contact hole extending through the insulating film and reaching the first wiring line; and forming over the insulating film a second wiring line electrically connected with the first wiring line through the contact hole, wherein the contact hole extends through the anodized film of the third conductive layer and the third conductive layer and exposes the third conductive layer at its bottom portion, and wherein the second wiring line contacts with the third conductive layer.

According to another construction of the invention on the manufacture process, on the other hand, there is provided a process for manufacturing a semiconductor device, comprising the steps of:

forming a multi-layered film in which a first conductive layer, a second conductive layer and a third conductive layer are laminated in the recited order;

patterning the multi-layered film to form a first wiring line;

anodizing the first wiring line to form on its surface the anodized films of the individual conductive layers composing the multi-layered film;

forming an insulating film covering the first wiring line;

forming a contact hole extending through the insulating film and reaching the first wiring line; and forming over the insulating film a second wiring line electrically connected with the first wiring line through the contact hole, wherein the contact hole extends through the anodized film of the third conductive layer and exposes the third conductive layer, and wherein the second wiring line contacts with the exposed third conductive layer.

According to another construction of the invention, on the other hand, there is provided a semiconductor device comprising a CMOS circuit including an n-channel thin film transistor and a p-channel thin film transistor, wherein the CMOS circuit includes a gate line intersecting the semiconductor layer of the n-channel thin film transistor and the semiconductor layer of the p-channel thin film transistor through a gate insulating film, wherein the gate line includes a multi-layered film in which a first conductive layer, a second conductive layer and a third conductive layer are laminated in contact with the gate insulating film, wherein the semiconductor layer of the p-channel thin film transistor has a p-type impurity region non-overlapping the gate line, wherein the semiconductor layer of the n-channel thin film transistor includes: a channel forming region; a first n-type impurity region; a second n-type impurity region interposed between the channel forming region and the first n-type impurity region and contacting with the channel forming region; and a third n-type impurity region interposed between the first n-type impurity region and the second n-type impurity region, wherein the second n-type impurity region and the third n-type impurity region have a lower n-type impurity concentration than that of the first n-type impurity region, wherein the second n-type impurity region overlaps the gate line through the gate insulating film, and wherein the third n-type impurity region does not overlap the gate line.

In each of the constructions, the third conductive layer is a film containing a valve metal as its main component.

According to the construction on the manufacture method for practicing the invention, there is provided a process for manufacturing a semiconductor device, comprising the steps of:

forming a semiconductor layer;

forming an insulating film in contact with the semiconductor layer;

forming a first photoresist mask contacting with the insulating film and intersecting the first semiconductor layer;

firstly doping the semiconductor layer heavily with an n-type impurity through the first photoresist mask;

forming a second photoresist mask narrower in the channel length direction than the first photoresist mask;

secondly doping the semiconductor layer lightly with an n-type impurity through the second photoresist mask; and forming a gate electrode intersecting the semiconductor layer through the insulating film, wherein the gate electrode is formed of a multi-layered film in which a first conductive layer, a second conductive layer and a third conductive layer are laminated in the recited order from the insulating film side.

According to another construction of the invention on the manufacture process, on the other hand, there is provided a process for manufacturing a semiconductor device, comprising the steps of:

forming a first semiconductor layer and a second semiconductor layer;

forming an insulating film in contact with the first semiconductor layer and the second semiconductor layer;

forming a first photoresist mask contacting with the insulating film and intersecting the first semiconductor layer;

firstly doping the first semiconductor layer heavily with an n-type impurity through the first photoresist mask;

forming a second photoresist mask narrower in the channel length direction than the first photoresist mask;

secondly doping the first semiconductor layer lightly with an n-type impurity through the second photoresist mask;

forming a third photoresist mask contacting with the insulating film and intersecting the second semiconductor layer;

thirdly doping the second semiconductor layer heavily with a p-type impurity through the third photoresist mask; and forming a gate electrode intersecting the semiconductor layer through the insulating film, wherein the gate electrode is formed of a multi-layered film in which a first conductive layer, a second conductive layer and a third conductive layer are laminated in the recited order from the insulating film side.

In the foregoing constructions, the "valve metal" implies a metal indicating a valve action in which a barrier type anodized film passes a cathode current but not an anode current (Table of Electrochemistry, 4th Edition, P. 370, edited by Association of Electrochemistry, Maruzen, 1985).

The valve metal to be used in the invention is represented by tantalum (Ta), niobium (Nb), hafnium (Hf) or zirconium (Zr). Of these, it has been confirmed that tantalum can be anodized with the same electrolyte as that for a thin film containing aluminum as its main component so that it is suitable for the invention. It is also possible to use a tantalum alloy such as molybdenum-tantalum (MoTa).

If the aforementioned construction is applied to the active matrix type liquid crystal display device, on the other hand, the first wiring line corresponds to a gate line for feeding a gate signal to a plurality of TFTs, and the second wiring line corresponds to one (as will be called the "upper line") for transmitting a signal from the outside to the gate line.

Herein, the gate electrode is one intersecting the semiconductor layer across the gate insulating film and one for forming a depletion layer by applying an electric field to the semiconductor layer. In other words, the portion in the gate line, as intersecting the semiconductor layer across the gate insulating film, is the gate electrode.

Herein, moreover, the portion contacting with the gate electrode in the upper line formed over the layer insulating film is the lead-out electrode.

The invention is characterized in that the wiring line (including the electrode) is given a laminated structure of three or more layers. Herein: the lowermost layer indicates the first conductive layer; the uppermost layer indicates the third conductive layer; and the layer between the first conductive layer and the third conductive layer indicates the second conductive layer.

BRIEF DESCRIPTION OF THE DRAWINGS

FIGS. 19A to 19E are explanatory diagrams of a process for manufacturing a TFT of Embodiment 13;

FIGS. 22A to 22E are explanatory diagrams of a process for manufacturing a TFT of Embodiment 16;

DESCRIPTION OF THE PREFERRED EMBODIMENTS

An embodiment of the invention will be described with reference to FIGS. 1A to 1D (showing an example in which the invention is applied to a semiconductor device provided with a TFT).

Figure 1A:
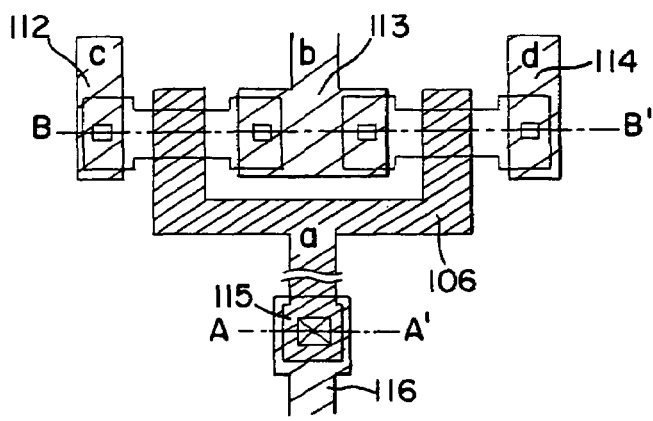
FIGS. 1A to 1D are explanatory diagrams presenting a top plan view, a circuit diagram and sectional views of a CMOS circuit of Embodiment 1.

In FIG. 1A, reference numeral 106 designates a gate wiring line, and numeral 116 designates an upper wiring line. The invention provides a technique relating to a contact structure of the gate line 106 and the upper line 116, and a process for manufacturing the structure.

Figure 1B:
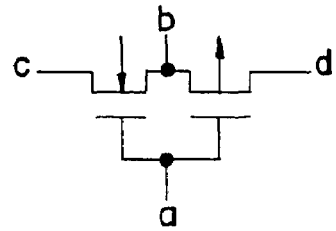
Figure 1C:
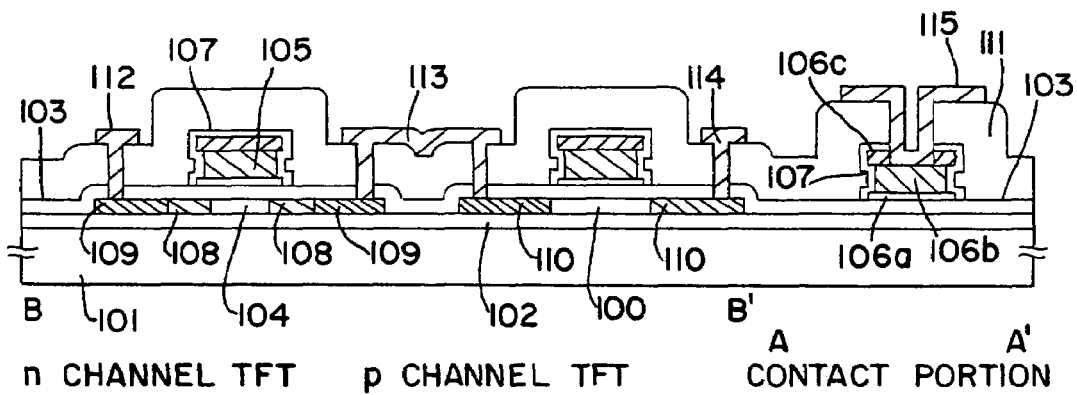

A section taken along line A-A' of FIG. 1A is presented in FIG. 1C. In FIG. 1C: numeral 101 designates a substrate; numeral 102 a underlying film; and numeral 103 a gate insulating film. This gate insulating film 103 is overlain by a multi-layered structure covered with an oxide film 107.

In an interlayer insulating film 111, the oxide film over the gate line and the uppermost layer (i.e., a third conductive layer 106c) of the gate line, there is opened a contact hole having a bottom portion, to which a second conductive layer 106b is partially exposed. With a lead-out electrode 115, there is electrically connected the second conductive layer 106b through the contact hole, to conduct and connect the wiring lines. The lead-out electrode 115 extends to an upper line 116.

The material to be used for the aforementioned third conductive layer 106c is properly selected from the valve metal materials having a predetermined heat resistance because it is exposed at a subsequent step to a high temperature (e.g., 400° C. or higher).

On the other hand, the material to be used for the aforementioned second conductive layer 106b is selected from a material for allowing the second conductive layer 106b to function effectively as an etching stopper when the third conductive layer is etched. Because of an exposure to a high temperature at a subsequent step, moreover, the second conductive layer 106b is formed over a highly refractory first conductive layer 106a. In order to improve the heat resistance, moreover, the second conductive layer 106b is preferably protected at its side portion by the oxide film 107.

Moreover, the interlayer insulating film 111 is formed to cover the gate line 106, and a contact hole is formed at a contact portion with the gate line. For forming the contact hole, the dry-etching method is used to remove the interlayer insulating film 111, the oxide film 107 and the third conductive layer 106c sequentially in the recited order. At the contact portion with the gate line 106 of the invention, when the third conductive layer 106c is to be selectively removed, because a conductive material having a low etching rate is selected as the second conductive layer 106b, the second conductive layer 106b acts as a stopper to stop the etching.

Here, the third conductive layer 106c may be left unremoved depending upon the etching condition, but this will not raise a factor to lessen the effects of the invention in the least.

When the contact hole is formed, the upper line 116 of a metallic conductive material is formed to realize the ohmic contact with the second conductive layer 106b. Here, the contact is also made with the third conductive layer 106c but only at the section of the third conductive layer so that it is estimated to make little contribution to the ohmic contact.

Thus, it is the most characteristic feature of the invention that the gate line 106 is given a laminated structure of three or more layers so that the satisfactory contact hole can be formed with a high yield by the dry-etching method to realize the ohmic contact reliably. In other words, the process can be made unnecessary for using any etchant such as the chromium-mixed acid that is detrimental to human bodies, so that it is remarkably effective for the industry.

On the other hand, the TFT structure is characterized by practicing the invention. A sectional view of the TFT portion of FIG. 1A, as taken along line B-B', is presented in FIG. 1C.

The TFT portion shown in FIG. 1C includes an n channel TFT and a p channel TFT of a simplified CMOS circuit. Either TFT (Thin Film Transistor) is formed by patterning a semiconductor layer of a crystalline semiconductor film in a predetermined shape over the underlying film 102 formed over the substrate 101.

The n channel TFT of the CMOS circuit is composed of a channel forming region 104, an LDD region (as will be called as "lightly doped region" or "n⁻ region") 108, and a first impurity region (n⁺ region) 109. Here, the LDD region 108 overlaps the gate electrode not wholly but only partially through the gate insulating film 103. In other words, the LDD region 108 realizes a state in which the portion overlapping the gate electrode (or a second impurity region) and the other portion (or a third impurity region) are compounded.

Moreover, the gate insulating film 103 is provided over the channel forming region 104, above which a gate electrode 105 is provided in contact with the gate insulating film above the channel forming region. On the surface of the gate electrode, there is provided the oxide film 107, which is covered with the interlayer insulating film 111.

On the other hand, the gate electrode has a laminated structure of three or more layers, of which a first conductive layer 105a functions as a blocking layer for preventing a substance composing a second conductive layer 105b from diffusing through the gate insulating film 103 into a semiconductor layer, especially, the channel forming region 104.

In the p channel TFT, on the other hand, there are provided as the semiconductor layer a first impurity region (or p⁺ region) 110 and a channel forming region 100. On the other hand, the p channel TFT has the same structure as that of the n channel TFT excepting the semiconductor layer and the wiring lines.

On the other hand, reference numerals 112, 113 and 114 individually designate source wiring lines or drain wiring lines made of a conductive film and are formed of the same material and in the same layer as those of the lead-out electrode 115 shown in FIG. 1C.

The invention thus constructed will be described in detail in connection with the embodiments to be explained in the following.

Here will be described the embodiments of the invention, but it is understood that the invention should not be limited to those embodiments.

Embodiment 1

The embodiments of the invention will be described in detail with reference to FIGS. 1A to 1D, FIGS. 2A to 2E, FIGS. 3A to 3E, FIGS. 4A to 4B and FIGS. 5A to 5B. On the semiconductor device having the contact structure according to the invention, here will be described one example of the structure. The semiconductor device according to the invention is provided over a common substrate with a peripheral drive circuit portion and a pixel matrix circuit portion. In order to facilitate illustration of this embodiment, the CMOS circuit constructing a portion of the peripheral drive circuit portion is shown in FIGS. 1A to 1D, and the pixel TFT (or the n channel TFT) constructing a portion of the pixel matrix circuit portion is shown in FIGS. 4A and 4B.

FIG. 1A is a diagram corresponding to a top plan view of FIG. 1C. In FIG. 1A, a portion taken along broken line A-A' corresponds to a sectional structure of the contact portion of the CMOS circuit, and a portion taken along broken line B-B' corresponds to a sectional structure of the TFT of FIG. 1C. On the other hand, FIG. 1B is a simplified equivalent circuit diagram of the CMOS circuit.

In FIG. 1C, either the TFT (Thin Film Transistor) is formed by patterning a semiconductor layer of a crystalline semiconductor film in a predetermined shape over the underlying film 102 formed over the substrate 101.

The n channel TFT of the CMOS circuit is composed, as the semiconductor layer, of the channel forming region 104, the LDD regions 108 formed in contact with the two sides of the channel forming region, and the first impurity regions (or the $n^+$ region) formed in contact with the LDD regions 108. The first impurity regions (or the $n^+$ region) 109 function as the source region and drain region of the TFT. Moreover, the gate insulating film 103 is formed over the channel forming region 104, and the gate electrode 105 is formed in contact with the gate insulating film over the channel forming region. On the surface of the gate electrode, there is formed the anodized film 107, which is covered with the interlayer insulating film 111. And, the source line 112 or the drain line 113 is connected with the $n^+$ region 109. These are covered with the (not-shown) passivation film.

On the other hand, the p channel TFT are provided with the first impurity regions (or the $p^+$ regions) 110 and the channel forming region 100 as the semiconductor layer. The p channel TFT is not provided with the lightly doped impurity region for the LDD structure. The p channel TFT intrinsically has a high reliability, although it may naturally be provided with the lightly doped impurity region. It is, therefore, preferable that the p channel TFT takes a characteristic balance with the n channel TFT by earning the ON current. Especially in the case of application to the CMOS circuit, it is important to take that characteristic balance. However, no problem will arise even if the LDD structure is applied to the p channel TFT. With the $p^+$ regions 110, moreover, there is connected the source line 114 or the drain line 113. This line is covered with the (not-shown) passivation film. The p channel TFT has the same structure as that of the n channel TFT but for the semiconductor layer and the wiring lines.

At the contact portion between the gate line of the CMOS circuit and the lead-out electrode 115, on the other hand, the underlying film 102 and the gate insulating film 103 are laminated over the substrate 101. Over the gate insulating film, moreover, there is provided the gate line 106 including the gate electrode 105 of the n channel TFT and the p channel TFT. In this embodiment, the gate line is constructed, as in the gate electrode, of the three-layered structure composed of the first conductive layer 106a, the second conductive layer 106b and the third conductive layer 106c. Moreover, the lead-out electrode 115 makes an excellent contact with the second conductive layer 106b of the gate electrode. This contact is covered with the (not-shown) passivation film.

On the other hand, FIG. 4A is a diagram corresponding to the top plan view of FIG. 4B. In FIG. 4A, the portion taken along dotted line A-A' corresponds to the sectional structure of the pixel matrix circuit of FIG. 4B.

The n channel TFT, as formed in the pixel matrix circuit shown in FIGS. 4A and 4B, basically has the same structure as that of the n channel TFT of the CMOS circuit as far as the portion provided with the interlayer insulating film. Here, an interlayer insulating film 410 of FIG. 4B corresponds to the interlayer insulating film 111 of FIG. 1. In FIG. 4: numeral 400 designates a substrate; numeral 401 an underlying film; numerals 402 and 406 first impurity regions; numeral 404 a channel forming region; numerals 403 and 405 LDD regions; numeral 408 a gate electrode; and numeral 409 an oxide film.

Moreover, there are provided wiring lines 411 and 412 to be connected with the first impurity region, and there is also provided a passivation film 413 covering them. Over the passivation film, there are formed a second interlayer insulating film 414 and a black mask 415. Over these, there is formed a third interlayer insulating film 416, which is connected with a pixel electrode 417 formed of a transparent conductive film of ITO or $SnO_2$. The black mask covers the pixel TFT and forms a retentive capacity with the pixel electrode.

This embodiment is exemplified by the transmission type LCD, to which the invention should not be especially limited. For example, a reflection type LCD could be manufactured by using a metallic material having a reflectivity as the material for the pixel electrode and by changing the patterning of the pixel electrode or by adding/eliminating several steps suitably.

Here in this embodiment, the gate line of the pixel TFT of the pixel matrix circuit is given the double gate structure. In order to reduce the dispersion of the OFF current, however, there may be adopted a multi-gate structure such as a triple gate structure. In order to improve the aperture ratio, on the other hand, there may be adopted a single gate structure.

In this embodiment, as described above, the gate electrode 105 is constructed of the three-layered structure composed of the first conductive layer 105a, the second conductive layer 105b and the third conductive layer 105c. The embodiment is additionally characterized by the structure that the LDD region provided in the semiconductor layer through the gate insulating film and the region where the gate electrode contacts with the gate insulating film are partially overlapping, and is further characterized by the manufacture process.

One example of the manufacture process will be described with reference to FIGS. 2A to 2E, 3A to 3E and 5A to 5B.

First of all, there is prepared the substrate 101 having an insulating surface. This substrate 101 can be exemplified by an insulating substrate such as a glass substrate, a quartz substrate or a crystal glass. In this embodiment, there is used a non-alkali glass substrate, as represented by the Corning 1737 glass substrate. Next, there is provided the underlying insulation film (as will be called the "underlying film") for improving the electric characteristics of the TFT by blocking the diffusion of impurities from the substrate 101. The material for the underlying film 102 can be exemplified by a silicon oxide film, a silicon nitride film a silicon nitride-oxide film ($SiO_xN_y$) or their laminated film within a thickness range of 10 to 500 nm. The forming means can be exemplified by the thermal CVD method, the plasma CVD method, the sputtering method or the vacuum thermal CVD method. If it is unnecessary to improve the electric characteristics of the TFT, however, the construction may be provided without any underlying film. In this embodiment, the underlying film 102 of a silicon oxide film is formed to have a thickness of 200 nm by the plasma CVD method.

If the aforementioned underlying film is formed on the substrate surface, the substrate 101 can also be exemplified by a ceramic substrate, a stainless substrate, a metal substrate (a tantalum substrate, a tungsten substrate or a molybdenum substrate, for example), a semiconductor substrate or a plastic substrate (a polyethylene terephthalate substrate, for example).

Figure 5A:
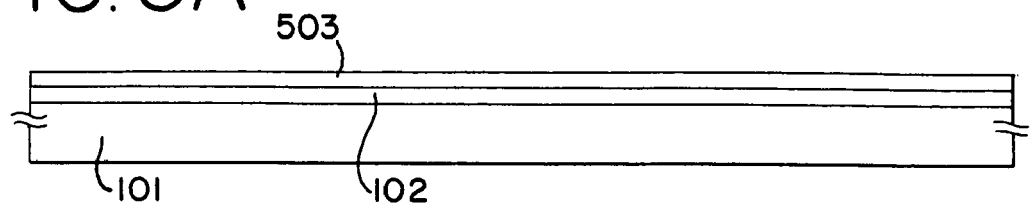
FIGS. 5A and 5B are explanatory diagrams presenting substrate sections of a crystallizing step of Embodiment 1.

Next, an amorphous semiconductor film is formed. This amorphous semiconductor film can be exemplified by an amorphous semiconductor film containing silicon such as an amorphous silicon film, an amorphous semiconductor film having microcrystals, a microcrystalline silicon film, an amorphous germanium film, an amorphous silicon-germanium film, as expressed by $Si_xGe_{1-x}$ (0<x<1), or their laminated film within a thickness range of 10 to 100 nm, preferably 15 to 60 nm. The means for forming the amorphous semiconductor film can be exemplified by the thermal CVD method, the plasma CVD method, the vacuum thermal CVD method or the sputtering method. In this embodiment, an amorphous silicon film 503 having a thickness of 50 nm is formed by the plasma CVD method (FIG. 5A).

Figure 5B:
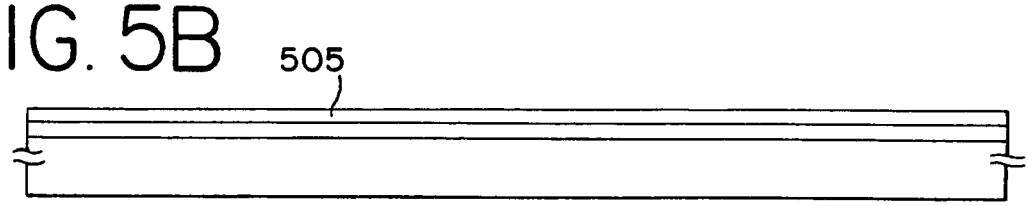

Next, the amorphous semiconductor film is crystallized to form the crystalline semiconductor film. When the amorphous semiconductor film has a hydrogen concentration as high as several tens %, for example, it is preferable to perform a treatment (at a temperature of 400 to 500° C.) for reducing the hydrogen concentration before the crystallization. In this embodiment, a heat treatment of 500° C. for 2 hours is performed to reduce the hydrogen content of the amorphous silicon film to 5 atoms % or less. The crystallization can be exemplified by any known means such as the heat crystallization, the crystallization using the irradiation with an infrared ray or ultraviolet ray, the crystallization using the irradiation with a laser beam, a heat crystallization using a catalytic element, or their combination. In this embodiment, a crystalline silicon film 505 is formed by condensing a pulse oscillation type KrF excimer laser beam linearly to irradiate the amorphous silicon film 503 (FIG. 5B).

On the other hand, an impurity may be added to the amorphous semiconductor film before or after the aforementioned crystallization, to control the threshold value of the TFT may be added. In this case of the threshold value control, for example, a control insulating film (having a thickness of 100 to 200 nm) may be formed over the amorphous semiconductor, and boron may be added within such a concentration range (e.g., $1\times10^{15}$ to $1\times10^{17}$ atoms/cm$^3$ in the SIMS analysis) as can control the threshold value, followed by a step of removing the control insulating film.

Figure 2A:
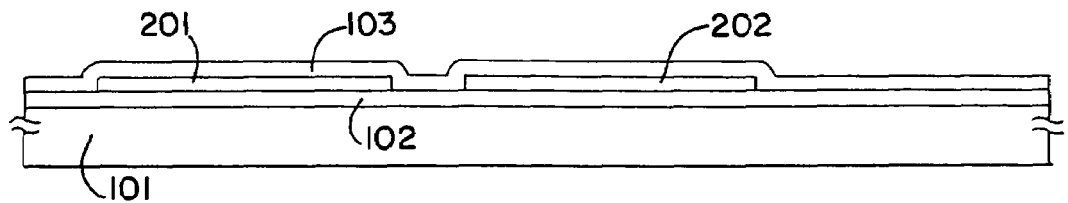
FIGS. 2A to 2E are explanatory diagrams of a process for manufacturing a TFT of Embodiment 1.
Figure 2B:
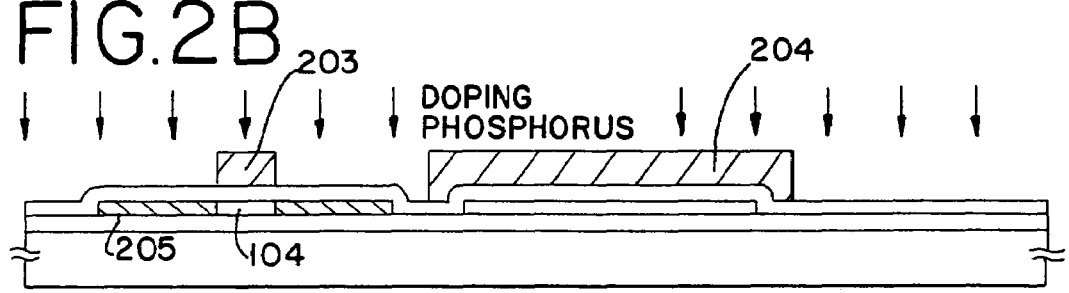

The crystalline silicon film 505 thus formed is patterned to form island semiconductor layers (or active layers) 201 and 202 shown in FIG. 2A.

Next, the gate insulating film 103 is formed over the semiconductor layers 201 and 202. This gate insulating film 103 can be exemplified by a silicon oxide film, a silicon nitride film, a silicon nitride-oxide film ($SiO_xN_y$), an organic resin film (e.g., a BCB (BenzoCycloButene) film), or their laminated film within a thickness range of 50 to 400 nm. The method of forming gate insulating film 103 can be exemplified by the thermal CVD method, the plasma CVD method, the vacuum thermal CVD method, the sputtering method and the application method. In this embodiment, a silicon oxide film having a thickness of 120 nm is formed by the plasma CVD method. Here, this embodiment is exemplified by an example in which the semiconductor layer is patterned after the crystallization, however, the invention should not be especially limited to it, and for example, the semiconductor layer may be patterned after the gate insulating film has been formed.

Next, the photoresist film is patterned to form a resist mask 204 for covering the region to form the p channel TFT and a resist mask 203 for covering a portion of the n channel TFT, and by using the resist masks 203 and 204 the semiconductor layer 201 is doped with an n-type impurity. This adding method can be exemplified by the ion implantation method or the ion doping method. This n-type impurity acts as a donor for silicon or germanium, The n-type impurity is exemplified by an element of the 15th group, typically by phosphorus (P) or arsenic (As). In this embodiment, the impurity for adding the n-type is exemplified by phosphorus and is added to the semiconductor layer 201 through the gate insulating film by the ion doping method using phosphine ($PH_3$). An impurity region 205 thus formed leads to form the LDD regions 108 of the n channel TFT, as will be described hereinafter. Therefore, this region is given a phosphorus concentration of $1\times10^{16}$ to $1\times10^{19}$ atoms/cm$^3$, typically $1\times10^{17}$ to $1\times10^{18}$ atoms/cm$^3$, or $1\times10^{18}$ atoms/cm$^3$ in this embodiment. On the other hand, the region, as covered with the resist mask 203, forms the channel forming region 104 because it is not doped with the impurity at the doping step of FIG. 2B. In other words, the length of the channel forming region of the n channel TFT is determined by that resist mask 203. On the other hand, this resist mask 203 is shorter in the channel length direction than the width of a gate electrode to be formed later. Therefore, the impurity regions (or the –regions) can be formed under a gate electrode to be formed later.

Next, the resist masks 203 and 204 are removed, and an activation treatment is performed to form an activated impurity regions. The impurity element, as added to the semiconductor layer, has to be activated by the laser annealing method or the heat treatment. This activation step may be practiced after the step of adding impurities for forming the source region and the drain region, but it is effective to perform the activation by the heat treatment at this stage because the impurity regions overlapping the gate electrode to be formed later is activated.

Figure 2C:
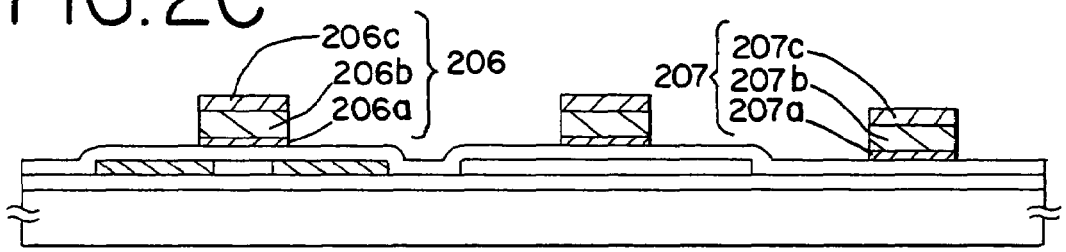

Next, there is formed a gate line 207 including a gate electrode 206 having a multi-layered structure over the gate insulating film 103 (FIG. 2C). The means for forming the gate line 207 is formed by the producing a conductive laminated film having a thickness range of 10 to 1,000 nm. preferably 30 to 400 nm employing sputtering method, the evaporation method, the thermal CVD method or the plasma CVD method. Then, by patterning the film by the known patterning technique. On the other hand, the gate line is set to have a width of 0.1 to 10 μm (typically 0.2 to 5 μm). At this time, all of the gate lines formed are connected with each other for a subsequent anodizing step.

The invention is characterized in that the gate line 207 (including the gate electrode 206) is made of the laminated structure having three or more layers. Here, the sectional shape of the gate line is desirably formed into a tapered shape for an excellent coverage.

A first conductive layer 207a can be formed of a material containing a valve metal such as tantalum (Ta), hafnium (Hf), niobium (Nb) or zirconium (Zr) as its main component (having a composition of 50% or more). However, the first conductive layer has to be exemplified by a material which can serve as a blocking layer for blocking the diffusion of the elements composing the gate line material. Therefore, the material of the first conductive layer is preferably selected from materials having a melting point of 600° C. or higher, preferably 1,000° C. or higher. Other materials can be n type silicon or silicide comprising phosphorus.

A second conductive layer 207b can be formed of a material containing aluminum (Al), titanium (Ti), copper (Cu), chromium (Cr), tungsten (W) or molybdenum (Mo) as its main component (having a composition of 50% or more). Another index for selecting the material for the second conductive layer is that the material for the second conductive layer is desired to have a resistivity as low as possible or a sheet resistance lower than at least that of the first conductive layer 206a. This is because the connection between the gate line and the upper line is made by the second conductive layer. Therefore, the optimum material for forming the second conductive layer 207b contains aluminum (Al) as its main component.

A third conductive layer 207c can be formed of a material containing a valve metal such as tantalum (Ta), hafnium (Hf), niobium (Nb) or zirconium (Zr) as its main component (having a composition of 50% or more). Here, the material for the third conductive layer 207c is desired to have a sufficient etching ratio to that of the second conductive layer 207b because the connection between the gate line and the upper line is made by the second conductive layer. At the dry etching step using the $CHF_3$ gas, for example, the material which contains tantalum (Ta) as its main component (having a composition of 50% or more) is suitable for the third conductive layer because it has a sufficient etching ratio with aluminum.

Figure 2D:
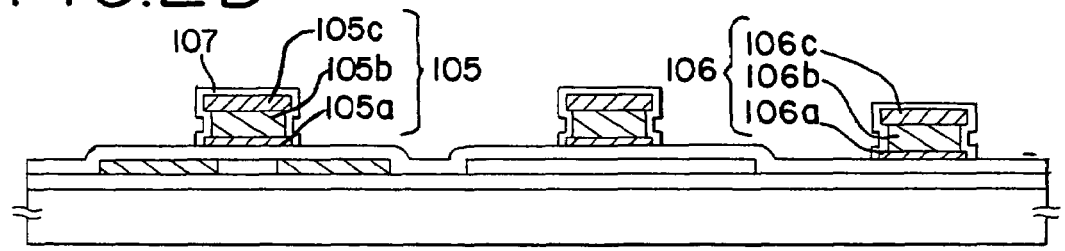

As the first conductive layer, the second conductive layer and the third conductive layer, for example, there can be selected a combination such as Ta, Al, Ta; TaN, Al, Ta; MoTa, Al, Ta; or Ta, Ti, Ta. In this embodiment, the gate line 207 is achieved by laminating the three-layered structure of the first conductive layer 207a (Ta: 20 nm), the second conductive layer 207b (Al: 200 nm) and the third conductive layer 207c (Ta: 130 nm), by the sputtering method and by patterning the structure. Here in this embodiment, it is sufficient that: the first conductive layer has a thickness range of 5 to 50 nm; the second conductive layer has a thickness range of 5 to 300 nm; and the third conductive layer has a thickness range of 5 to 300 nm (FIG. 2D). Although not shown, the gate insulating film is slightly etched when the gate line is patterned by the dry etching method.

Next, the anodizing step is performed to form the oxide film 107 on the side portion of the second conductive layer 207b. Depending upon the material selected for the gate line, however, an oxide film is formed on the surfaces of the first conductive layer and the second conductive layer. The anodization is performed in a neutral electrolyte, for example with an electrolyte (at a liquid temperature of 10° C.), which is prepared by neutralizing an ethylene glycol solution containing 3 % of tartaric acid with aqueous ammonia, by using the gate line as the anode and platinum as the cathode. Here, the anodization has to be conditioned to leave the third conductive layer so that the third conductive layer may neither be almost oxidized nor may be formed an alumina film over the second conductive layer.

The anodized film thus obtained has a dense film quality so that it can be prevented from being separated or hillock even it is subjected to the doping step or the heat treatment. In order to retain the heat resistance of the wiring lines, it is desired that the film having a thickness of 10 nm or more, preferably 30 nm or more is formed on the side portion of the second conductive layer. In this embodiment, with the formation voltage of 40 V, the anodized film of 60 nm is formed on the side portion of the second conductive layer (FIG. 2D). In this embodiment, the oxidation proceeds into the aluminum so that the electrode takes the shape shown in FIG. 2D. Here in FIG. 2D, the oxide film 107 has different composites but is shown as a single film for simplification the gate line after the anodization is designated by 106, and the gate electrode by 105. The first conductive layer after the anodization is designated by 105a and 106a; the second conductive layer by 105b and 106b; and the third conductive layer by 105c and 106c.

Next, the photoresist film is patterned to form a resist mask 209 for covering the region to form the p channel TFT and a resist mask 208 for covering a portion of the n channel TFT, and by using the resist masks 208 and 209 the semiconductor layer is secondly doped with an impurity for the n type. (FIG. 2E) This resist mask 208 is wider in the channel length direction than the gate electrode 105. On the other hand, the length of the first impurity region (or the n⁺ region) by that resist mask 208. Here, at the aforementioned doping step, the semiconductor layer is doped with phosphorus through the overlying gate insulating film. A first impurity regions 210 thus formed forms the source region and drain region of the n channel TFT, as will be described hereinafter. Therefore, this region is set to have a phosphorus concentration of $1\times10^{19}$ to $1\times10^{21}$ atoms/cm³, representatively $1\times10^{20}$ to $5\times10^{20}$ atoms/cm³, and $5\times10^{20}$ atoms/cm³ in this embodiment. Thus, the first impurity regions (or the n⁺ region) are formed.

Figure 2E:
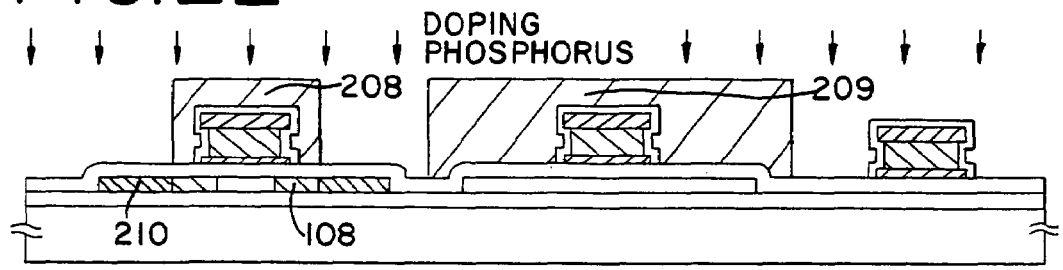

In the region which has not been doped with phosphorus at the doping step of FIG. 2E, on the other hand, the region overlapping the gate electrode 105 will be called the "second impurity region", and the region not overlapping the gate electrode 105 will be called the "third impurity region". Here, the second impurity region and the third impurity region are –region and have a lower phosphorus concentration than that of the first impurity region being n⁺ region.

Next, after removal of the resist masks 208 and 209, the photoresist film is patterned to form a resist mask 211 for covering the region to form the n channel TFT, and the semiconductor layer 202 is exclusively doped with an impurity of p type by using the gate electrode as the mask. This doping method can be exemplified by the ion implantation method or the ion doping method. This p type impurity acts as an acceptor for silicon or germanium. The p type impurity is exemplified by an element of the 13th group, typically by boron (B). In this embodiment, the semiconductor layer 202 is doped with boron (B) as the p type impurity through the gate insulating film by the ion doping method using diborane ($B_2H_6$). A first impurity region (or the p⁺ region) 212 thus formed provides the source region or drain region of the p channel TFT, as will be described hereinafter. This region has a boron concentration exemplified by $1\times10^{19}$ to $1\times10^{21}$ atoms/cm³ and by $5\times10^{20}$ atoms/cm³ in this embodiment.

Figure 3A:
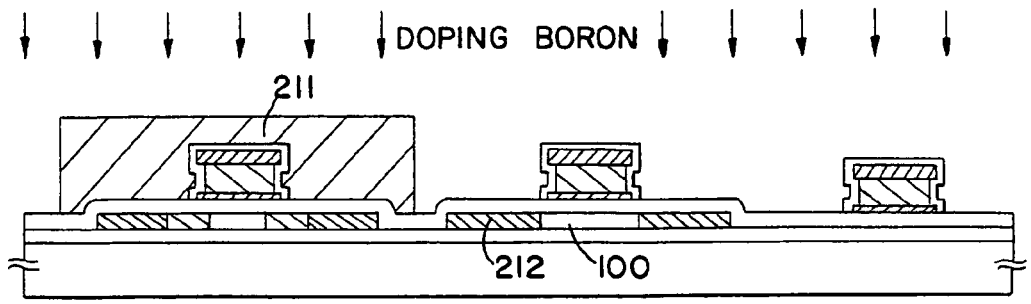
FIGS. 3A to 3E are explanatory diagrams of the process for manufacturing the TFT of Embodiment 1.
Figure 4A:
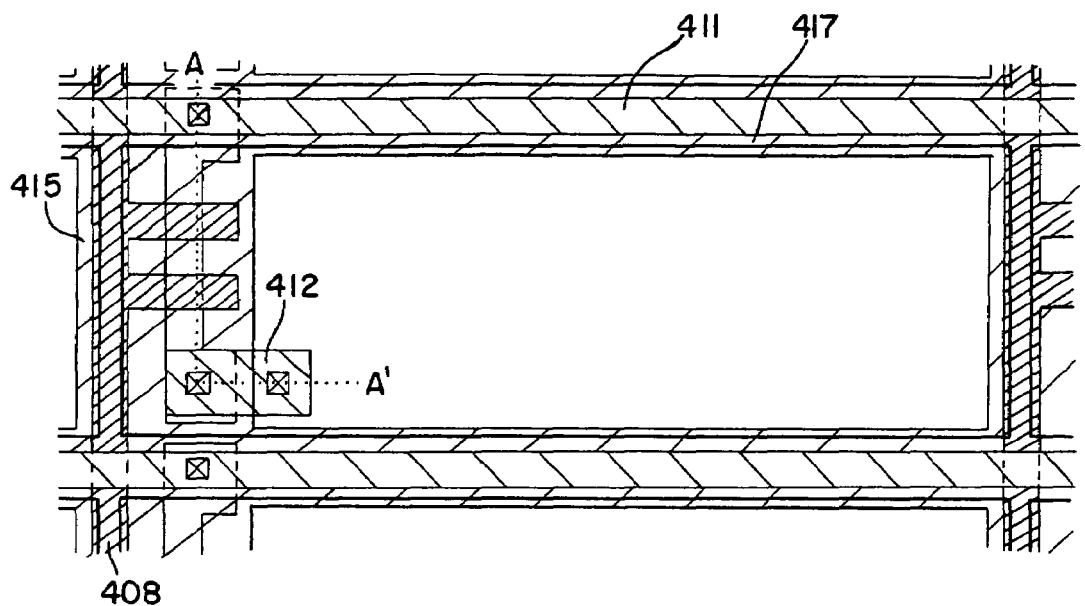
FIGS. 4A and 4B are explanatory diagrams presenting a top plan view and a sectional view of a pixel matrix circuit of Embodiment 1.
Figure 4B:
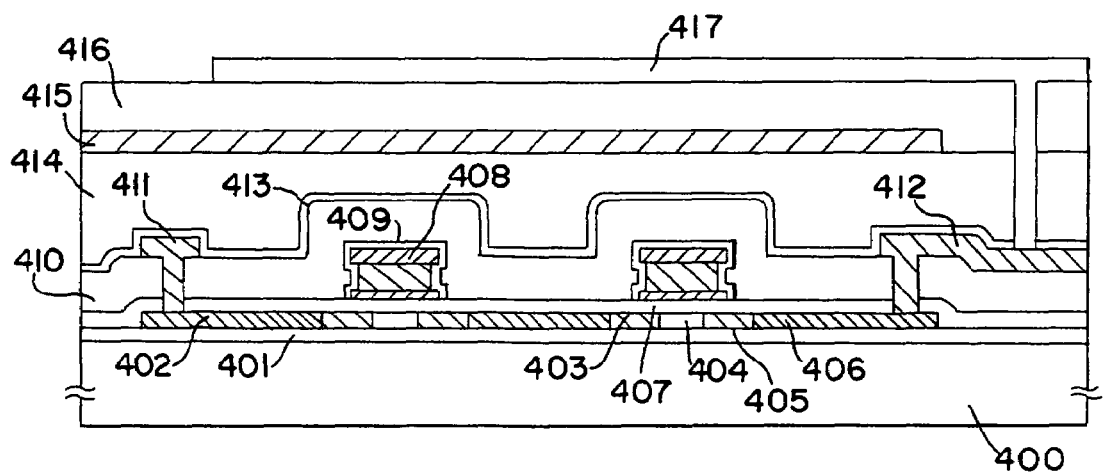

On the other hand, the region just below the gate electrode is not doped with the boron to define the channel forming region 100 of the p channel TFT (FIG. 3A).

In this embodiment, after the impurity adding step for forming the n⁺ region, the impurity adding step for forming the p⁺ region is performed. This step sequence may be reversed such that the impurity adding step for forming the n⁺ region is performed after the impurity adding step for forming the p⁺ region.

Figure 3B:
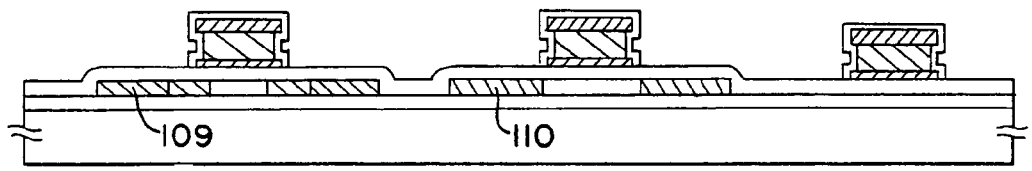

Next, the resist mask 211 is removed, and an activation step (or a heat treatment at 300 to 700° C.) to activate the impurity element, as added to give the semiconductor layer the n type or p type effectively, is performed to form the activated first impurity region (n⁺ region) 109 and first impurity region (p⁺ region) 110 (FIG. 3B). In this embodiment, the activation is effected by a heat treatment at 500° C. for 2 hours in a hydrogen atmosphere. In this embodiment, aluminum is used for the second conductive layers 105b and 106b for constructing the gate line and the electrode. Since the second conductive layer is sandwiched between the first conductive layer and the third conductive layer and is covered on its side portion with the dense anodized film, however, it is possible to suppress the occurrence of the hillock and the diffusion of the element aluminum into another region even if the heat treatment is made. Here, the activation can be exemplified not only by the heat treatment but also by the optical annealing with a laser or an infrared lamp.

Next, the gate line connected with one wiring line for the anodization, although not shown, is etched out to form the gate line and the gate electrode of a desired shape.

Figure 3C:
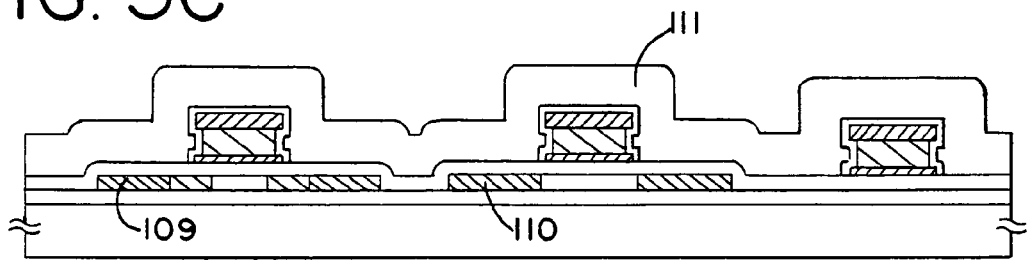

Next, the interlayer insulating film is formed covering the n channel TFT and the p channel TFT. This interlayer insulating film 111 can be exemplified by a silicon oxide film, a silicon nitride film, a silicon oxide-nitride film, an organic resin film (e.g., a polyimide film or a BCB film) or their laminated film. In this embodiment, the interlayer insulating film is given a two-layered structure in which the silicon nitride film is formed to a thickness of 50 nm first and in which the silicon oxide film is formed to a thickness of 950 nm, although not shown (FIG. 3C).

Figure 3D:
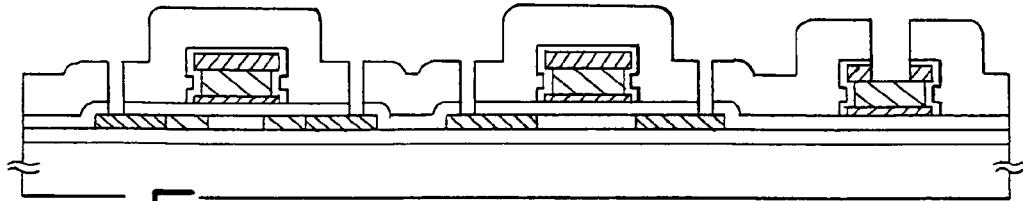

After the interlayer insulating film 111 was formed, it is then patterned to form the contact hole which is as deep as to reach the first impurity regions 109, 110 (the source region and the drain region) of the individual TFTs. At the same time, a contact hole is formed to make a contact between the upper line and the gate line 106 (FIG. 3D).

At the aforementioned manufacture step, when the contact hole for making the contact between the lead-out electrode and the gate line is to be formed, the upper face of the gate line is covered in the prior art with the anodized film comprising alumina using the neutral electrolyte so that the anodized film is difficult to be etched off by the ordinary method. Since the gate line 106 of the invention is covered at its upper face with the anodized film of the third conductive layer comprising tantalum, however, this anodized film can be easily removed by the dry etching of a fluorine compound e.g., $CHF_3$. Moreover, the second conductive layer comprising aluminum has a remarkably low etching rate in dry etching of the fluorine compound e.g., $CHF_3$, so that it sufficiently functions as the etching stopper. At this etching time, however, it is necessary to take care so that the first impurity region of the TFT may not be overetched.

With the gate line having such laminated structure of three or more layers, the excellent ohmic contact can be made between the upper line and the gate line thereby to prevent the contact failure. On the other hand, the second conductive layer is made of the material containing aluminum of a low heat resistance as its main component, but the anodized film is added to the side. In addition, the second conductive layer is provided with the third conductive layer in contact with its upper face and the third conductive layer in contact with its lower face. Even if the doping step and the heat treatment are added at the subsequent step, therefore, it is possible to prevent the film separation or the hillock.

When the contact hole reaching the source region or the drain region and the contact hole for making the contact between the lead-out electrode and the gate line are to be simultaneously formed as in this embodiment, however, it is necessary for the practicer to properly adjust the thickness of the gate insulating film and the thickness of the anodized film formed over the gate line. In the dry etching using the $CHF_3$ gas, the etching rate of the silicon oxide which constitutes the gate insulating film is three times as high as that of tantalum oxide. When the gate insulating film has a thickness of 120 nm, therefore, the anodized film formed over the gate line is left unless its thickness is made no more than 40 nm. A caution is necessary for preventing the resultant failure in the ohmic contact.

Figure 3E:
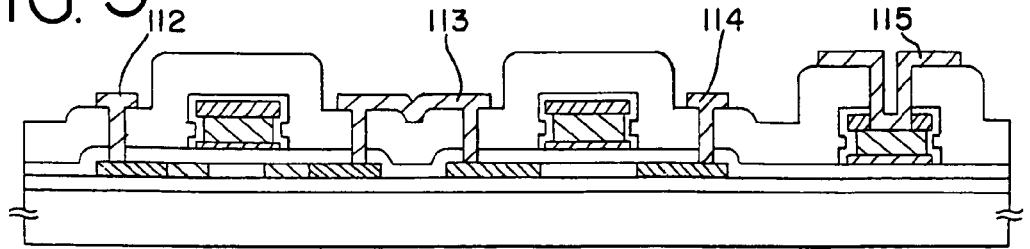

Next, there are formed the source lines (or the source electrodes) 112 and 114, the drain line (or the drain electrode) 113 and the upper line 116 (or the lead-out electrode 115). In this embodiment, Although not shown, these electrodes 112, 113 and 114 are formed by patterning the film of the three-layered structure in which the titanium film (having a thickness of 100 nm), the titanium containing aluminum film (having a thickness of 300 nm) and the titanium film (having a thickness of 150 nm) are continuously formed by spattering method (FIG. 3E). Finally, the heat treatment is performed in the hydrogen atmosphere to hydrogenated the entirety. At this stage, the CMOS circuit (including the n channel TFT and the p channel TFT), as shown in FIG. 1C, is completed.

After the state of FIG. 3E was established, there is formed the passivation film (silicon nitride film) 413 having a thickness of 0.2 to 0.4 μm. After this passivation film was formed, the second interlayer insulating film 414 made of an organic resin is formed to have a thickness of about 2 μm. In this embodiment, a polyimide which is thermally polymerized after applied to a substrate is baked at 300° C.

Next, the black mask 415 is formed of a titanium film, and the third interlayer insulating film 416 is formed thereover. Then, the second layer insulating film and the third layer insulating film are selectively etched to form the contact hole reaching the drain line 412 thereby to form the pixel electrode 417. Thus, the pixel matrix circuit is completed.

After the state of FIG. 4B was established, an orientation film (of polyimide in this embodiment) is formed. On the substrate on the opposite side, there are formed the transparent conductive film and the orientation film. This orientation film is rubbed, after having been formed, to orient the liquid crystal molecules in parallel at a predetermined pre-tilt angle.

The substrate, in which the pixel matrix circuit and the CMOS circuit were formed through the aforementioned steps, and the counter substrate are adhered to each other through a sealing member and a spacer by the well-known cell assembling step. After this, liquid crystal material is injected into the gap between two substrates opposed to each other and is sealed up with a sealing agent. Thus, the liquid crystal panel is completed.

Embodiment 2

In the n channel TFT thus completed by the aforementioned manufacture process, the semiconductor layer has two kinds of lightly doped impurity regions; the region (i.e., the second impurity region) overlapping the gate electrode, and the region (i.e., the third impurity region) not-overlapping the gate electrode. Thus, the n channel TFT has a reliability equivalent to or higher than that of the MOSFET.

In the n channel TFT of this embodiment, as shown in FIG. 1C, the LDD region 108 overlaps the gate electrode not wholly but only partially through the gate insulating film 103.

Figure 1D:
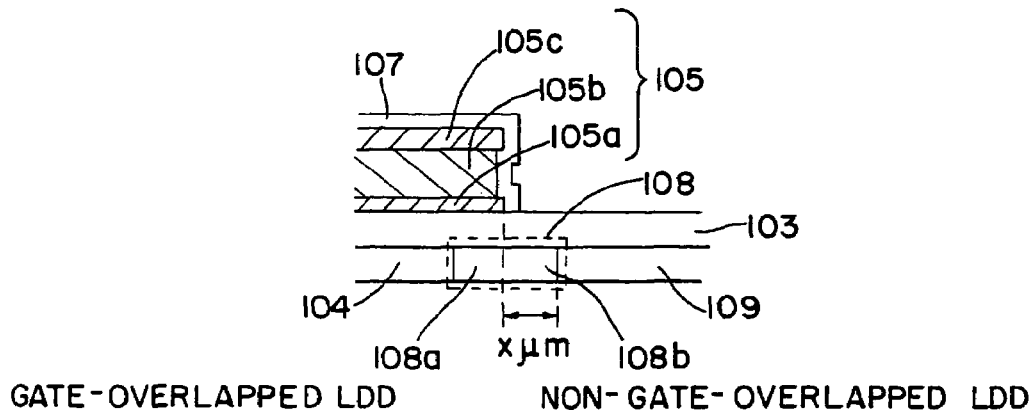

This behavior is shown in FIG. 1D. Here, the reference numerals of FIG. 1D correspond to those of FIG. 1C. As shown in FIG. 1D, the LDD region 108 is discriminated into the portion (i.e., a Gate-overlapped LDD region 108a) in which it overlaps the gate insulating film 103 through the gate electrode 105, and the other portion (i.e., a non-Gate-overlapped LDD region 108b).

In this invention, it is thought preferable that the length of the Gate-overlapped LDD region 108a is set to 0.1 to 2 μm (as represented by 0.3 to 1.5 μm) and that the length of the non-Gate-overlapped LDD region 108b (corresponding to X in FIG. 1D) is set to 0.1 to 2 μm (as represented by 0.3 to 1 μm).

Here, the LDD region 108 has a length of 0.2 to 4 μm, typically 0.6 to 2.5 μm, and a concentration of an n type impurity element (belonging to the 15th group of the periodic table, as represented by phosphorus or arsenic) of $1\times10^{16}$ to $1\times10^{19}$ atoms/cm$^3$, as represented by $1\times10^{17}$ to $5\times10^{18}$ atoms/cm$^3$. On the other hand, the impurity concentration of the first impurity region (i.e., the n$^+$ region) 109 may be set to $1\times10^{19}$ to $1\times10^{21}$ atoms/cm$^3$, as represented by $1\times10^{20}$ to $5\times10^{20}$ atoms/cm$^3$.

On the other hand, the channel forming region 104 is made of an intrinsic semiconductor layer or a semiconductor layer which has been doped in advance with boron in a concentration of $1\times10^{16}$ to $5\times10^{18}$ atoms/cm$^3$. This boron is added to control the threshold voltage and can be replaced by any other element so far as it has the similar effect.

(Advantages of the Thin Film Transistor of the Invention)

The TFT of the invention is characterized by forming in the semiconductor layer the two kinds of LDD regions (lightly doped impurity regions) having the second impurity region (i.e., the Gate-overlapped LDD region) and the third impurity region (i.e., the non-Gate-overlapped LDD region).

Figure 14A:
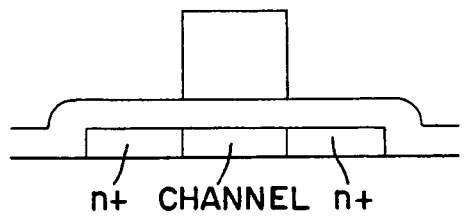
FIGS. 14A to 14H are diagrams illustrating electronic characteristics of various TFT structures.
Figure 14B:
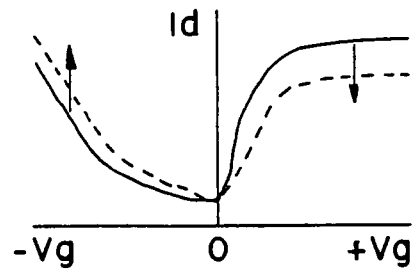
Figure 14C:
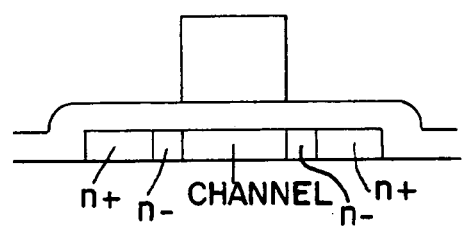
Figure 14D:
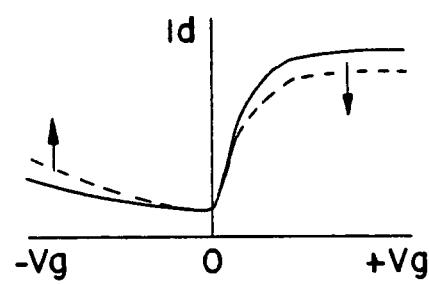
Figure 14E:
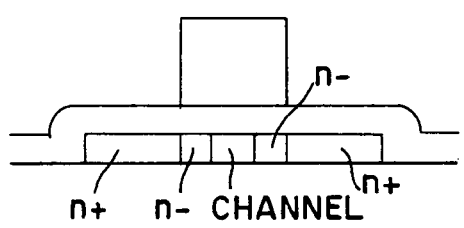
Figure 14F:
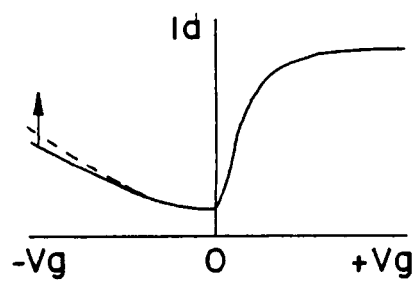

With reference to FIGS. 14A to 14H, the priority of the invention will be described in comparison with the characteristics of the TFT of the related art. FIGS. 14A and 14B illustrate the n channel TFT having no LDD region and its electric characteristics (i.e., the gate voltage Vg versus the drain current Id). Likewise: FIGS. 14C and 14D illustrate the case of the ordinary LDD structure; FIGS. 14E and 14F the case of the so-called "GOLD structure"; and FIGS. 14G and 14H the case of the n channel TFT of the invention.

Here in FIGS. 14A to 14H: letters $n^+$ designate the source region or the drain region; letters channel designate the channel forming region; and letters—designate the non-Gate overlapped LDD region (i.e., the third impurity region). On the other hand, letters Id indicate the drain current, and letters Vg indicate the gate voltage.

With no LDD, as shown in FIGS. 14A and 14B, the OFF current is high, and the ON current (i.e., the drain current when the TFT is ON) and the OFF current are liable to degrade.

By forming the Gate-overlapped LDD, on the other hand, the OFF current is considerably suppressed so that the ON current and the OFF current can also be suppressed. However, the degradation of the ON current cannot be completely suppressed (FIGS. 14C and 14D).

In the TFT structure having only the overlapping type LDD in which the LDD region and the gate electrode overlap (FIGS. 14E and 14F) the suppression of the ON current in the LDD structure of the related art.

In this case, the degradation of the ON current can be sufficiently suppressed, but there arises a problem that the OFF current is rather higher than that of the ordinary non-overlapping LDD structure. The Unexamined Published Japanese Patent Application No. 7-135318 and U.S. Pat. No. 5,648,277 described in Related Art adopt this structure, and the invention has sought for a solving structure while recognizing the problem of the high OFF current.

Figure 14G:
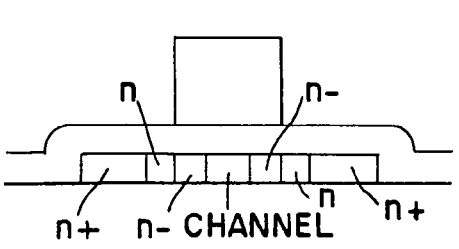
Figure 14H:
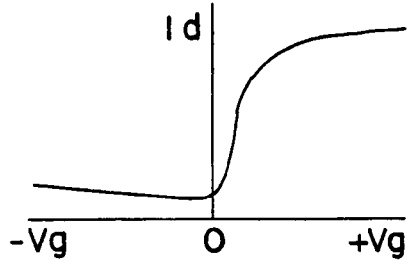

In the structure of the invention, moreover, in the semiconductor layer, as shown in FIGS. 14G and 14H, there are formed the LDD region (or the second impurity region) overlapping the gate electrode and the LDD region (or the third impurity region) non-overlapping the gate electrode. By adopting this structure, the OFF current can be reduced while retaining the effect for suppressing the degradation of the ON current.

We estimates why the OFF current is high in the case of the structure shown in FIGS. 14E and 14F, as follows. When the n channel TFT is in the OFF state, a negative voltage at minus several tens volts is applied to the gate electrode. If, in this state, a positive voltage at plus several tens volts is applied to the drain region, a remarkably large electric field is established at the drain side end portion of the gate insulating film.

At this time, holes are induced in the LDD region to form a current path by the minority carrier to connect the drain region, the LDD region and the channel forming region. It is anticipated that this current path invites an increase in the OFF current.

In order to cut out that current path midway, we have thought it necessary to form another resistor, i.e., the third impurity region (i.e., the LDD region) at a position not-overlapping the gate electrode. This embodiment relates to the thin film transistor having such construction and the circuit using such thin film transistor.

Embodiment 3

This embodiment is exemplified by forming the crystalline semiconductor film, as used as the semiconductor layers 201 and 202 in Embodiment 1, by the thermal crystallization method using a catalytic element. When this catalytic element is used, it is desirable to use the techniques which have been disclosed in Unexamined Published Japanese Patent Applications Nos. 7-130652 and 8-78329. The Unexamined Published Japanese Patent Application No. 7-130652 corresponds to a U.S. Pat. No. 5,643,826.

Figure 6A:
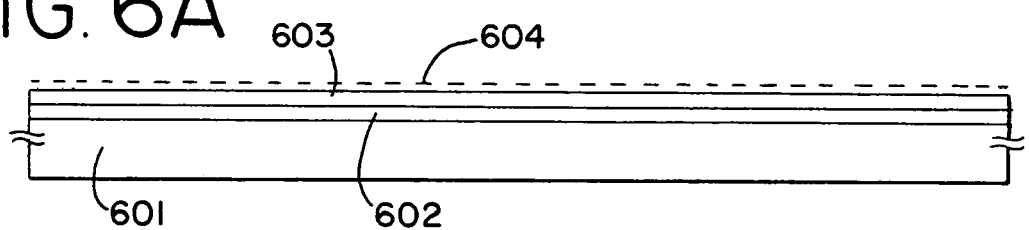
FIGS. 6A and 6B are explanatory diagrams presenting the substrate sections of the crystallizing step of Embodiment 3.
Figure 6B:
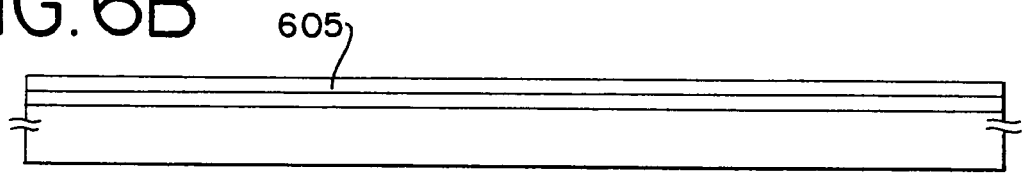

Here, FIGS. 6A and 6B show an example in which the technique disclosed in Unexamined Published Japanese Patent Application No. 7-130652 is applied to the invention. First of all, there is formed over a substrate 601 a silicon oxide film 602, over which an amorphous silicon film (as will also be called the "amorphous silicon") 603 is formed. Moreover, a solution of nickel acetate containing nickel of 10 ppm in weight conversion is applied to form a nickel containing layer 604 (FIG. 6A).

Next, after a dehydrogenating step at 500° C. for 1 hour, a heat treatment at 500 to 650° C. for 4 to 24 hours (550° C. for 14 hours in this embodiment) is performed to form a crystalline silicon film 605. The crystalline silicon film (as will also be called the "poly-silicon") 605 thus obtained exhibits a remarkably excellent crystallinity (FIG. 6B).

On the other hand, the technique, as disclosed in Unexamined Published Japanese Patent Application No. 8-78329, makes it possible to crystallize the amorphous semiconductor film selectively by adding a catalytic element selectively. The case, in which that technique is applied to the invention, will be described with reference to FIGS. 7A and 7B.

First of all, there is formed over a glass substrate 701 a silicon oxide film 702, over which an amorphous silicon film 703 and a silicon oxide film 704 are continuously formed.

Figure 7A:
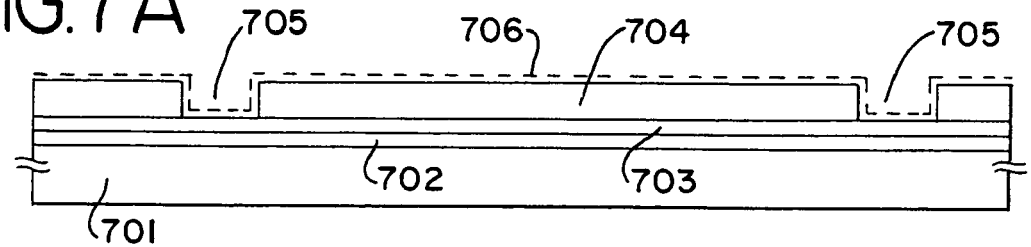
FIGS. 7A and 7B are explanatory diagrams presenting the substrate sections of the crystallizing step of Embodiment 3.
Figure 7B:
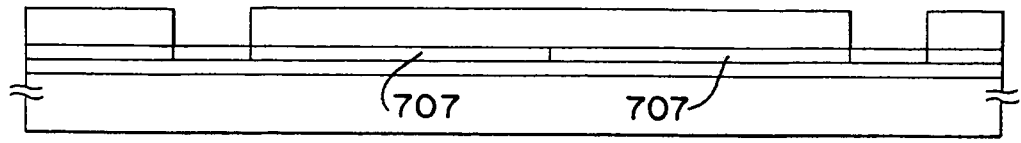

Next, the silicon oxide film 704 is patterned to form an aperture 705 selectively, and a solution of nickel acetate containing nickel of 10 ppm in weight conversion is then applied. As a result, a nickel containing layer 706 is formed to contact with the amorphous silicon film 703 only at the bottom portion of the aperture 705 (FIG. 7A).

Next, a heat treatment at 500 to 650° C. for 4 to 24 hours (at 580° C. for 14 hours in this embodiment) is performed to form a crystalline silicon film 707. In this crystallization process, the portion of the amorphous silicon film, where the nickel contacted, is first crystallized, and this crystallization proceeds laterally. The crystalline silicon film 707 thus formed is aggregated of rod or needle crystals. This results in an arranged crystallinity because the individual crystals have macroscopically grown with a predetermined directivity.

Here, the catalytic element to be used in the aforementioned two techniques may be exemplified not only by nickel (Ni) but also by germanium (Ge), iron (Fe), palladium (Pd), tin (Sn), lead (Pb), cobalt (Co), platinum (Pt), copper (Cu) or gold (Au).

If the crystalline semiconductor film (including the crystalline silicon film and the crystalline silicon-germanium film) is formed and patterned by using the techniques described above, it is possible to form the semiconductor layer of the TFT. The TFT, as manufactured from the crystalline semiconductor film by the technique of this embodiment, can provide excellent characteristics and is therefore demanded to have a high reliability. By adopting the contact structure and the TFT structure of the invention, however, it is enabled to manufacture the TFT which exploits the technique of the invention to the best.

Embodiment 4

This embodiment exemplifies the process for forming the semiconductor layers 201 and 202 to be used in Embodiment 1, wherein the aforementioned catalytic element is removed from the crystalline semiconductor film after this crystalline semiconductor film was formed by the catalytic element by using the amorphous semiconductor film as the initial film, as in Embodiment 3. For this method, this embodiment uses the technique which has been disclosed in Unexamined Published Japanese Patent Applications No. 10-135468 or 10-135469. The Unexamined Published Japanese Patent Application No. 10-135468 corresponds to a U.S. patent application Ser. No. 08/951,193, and the Unexamined Published Japanese Patent Application No. 10-135469 corresponds to a U.S. patent application Ser. No. 08/951,819.

The technique, as disclosed in the aforementioned Applications, is one for removing the catalytic element, as used for crystallizing the amorphous semiconductor film, by using the gettering action of phosphorus after the crystallization. By using this technique, the concentration of the catalytic element in the crystalline semiconductor film can be reduced to $1 \times 10^{17}$ atoms/cm$^3$ or less, preferably to $1 \times 10^{16}$ atoms/cm$^3$.

Figure 8A:
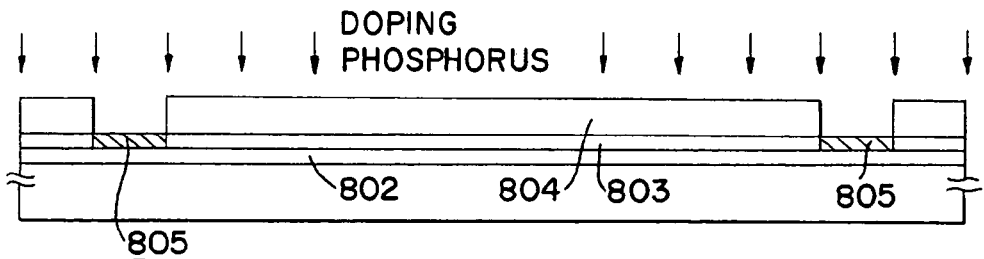
FIGS. 8A and 8B are explanatory diagrams presenting the substrate sections of a gettering step of Embodiment 4.
Figure 8B:
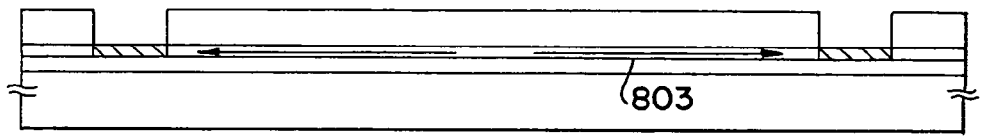

The construction of this embodiment will be described with reference to FIGS. 8A and 8B. Here is used a non-alkali glass substrate, as represented by the Corning 1737 glass substrate. FIG. 8A shows the state in which an underlying film 802 and a crystalline silicon film 803 are formed by using the crystallization technique, as exemplified in Embodiment 2. Moreover, a masking silicon oxide film 804 is formed to have a thickness of 150 nm over the surface of the crystalline silicon film 803 and is patterned to form an aperture thereby to form a region exposing the crystalline silicon film. Moreover, the step of adding phosphorus is performed to form a region 805 in which the crystalline silicon film is doped with phosphorus.

In this state, a heat treatment in a nitrogen atmosphere at 550 to 800° C. for 5 to 24 hours (at 600° C. for 12 hours in this embodiment) is performed so that the region 805 having the crystalline silicon film doped with phosphorus can act as the gettering site to enable the catalytic element remaining in the crystalline silicon film 803 to migrate to the region 805 doped with phosphorus.

By etching off the masking silicon oxide film 804 and the region 805 doped with phosphorus, moreover, it is possible to obtain the crystalline silicon film in which the concentration of the catalytic element used at the crystallization step is reduced to $1 \times 10^{17}$ atoms/cm$^3$ or less. This crystalline silicon film can be used as it is as the semiconductor layer of the TFT of the invention, as exemplified in Embodiment 1.

Embodiment 5

This embodiment presents another embodiment in which the semiconductor layers 201 and 202 and the gate insulating film 103 are formed in the process for manufacturing the TFT of the invention, as exemplified in Embodiment 1.

Here is needed a substrate which has a heat resistance of at least 700 to 1,100° C., and a quartz substrate 901 is used. Moreover, the techniques exemplified in Embodiment 3 and Embodiment 4 are used to form the crystalline semiconductor film and is patterned to form semiconductor layers 902 and 903 so that it may be made into the active layer of the TFT.

Figure 9A:
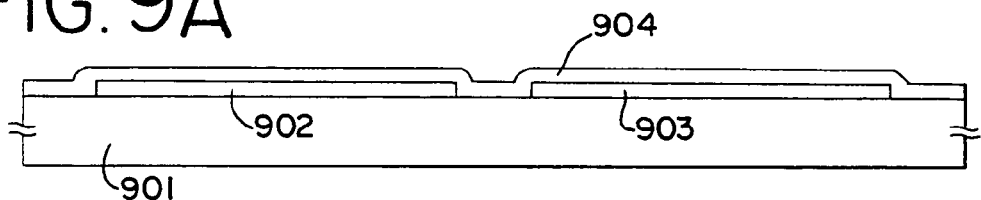
FIGS. 9A and 9B are explanatory diagrams presenting the substrate sections of a gettering step of Embodiment 5.

Moreover, the semiconductor layers 902 and 903 are covered with the gate insulating film 904 of a film containing silicon oxide as its main component. In this embodiment, the silicon nitride-oxide film is formed to a thickness of 70 nm by the plasma CVD method (FIG. 9A).

Figure 9B:
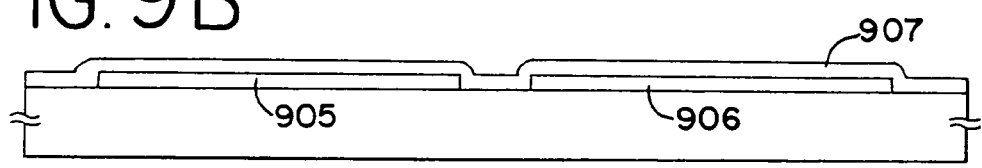

Moreover, a heat treatment is performed in the atmosphere containing halogen (represented by chlorine) and oxygen. This heat treatment is performed at 950° C. for 30 minutes in this embodiment. Here, the treatment temperature may be selected within a range of 700 to 1,100° C., and the treatment period may be selected between 10 minutes to 8 hours (FIG. 9B).

As a result, under the conditions of this embodiment, a thermally oxidized film is formed at the boundary between the semiconductor layers 902 and 903 and a gate insulating film 904 to form a gate insulating film 907.

The gate insulating film 907 thus manufactured by the aforementioned steps has a high breakdown voltage, and the boundary between semiconductor layers 905 and 906 and the gate insulating film 907 is remarkably excellent. In order to achieve the construction of the TFT of the invention, the subsequent steps may follow those of Embodiment 1.

It is naturally arbitrary for the practicer to determine the combination of this embodiment with Embodiment 3 or Embodiment 4.

Embodiment 6

This embodiment presents an embodiment in which the crystalline TFT is manufactured in the sequence of steps different from that of Embodiment 1. Here will be specifically described another mode of the gettering step using phosphorus, as exemplified in Embodiment 4. Here, the basic steps follow those of FIGS. 2A to 2E or FIGS. 3A to 3E, and the description will be made noting only the differences.

First of all, the state of FIG. 3A is established according to the steps of Embodiment 1. However, the thermal crystallization technique, as exemplified in Embodiment 3, is used for forming the semiconductor layer for the active layer of the TFT.

In this embodiment, however, the first impurity region 210 of the n channel TFT and the first impurity region 212 of the p channel TFT are doped with phosphorus in a concentration of $1 \times 10^{19}$ to $1 \times 10^{21}$ atoms/cm$^3$ (preferably $5 \times 10^{20}$ atoms/cm$^3$).

In this embodiment, a heat treatment is performed in this state in the nitrogen atmosphere at 500 to 800° C. for 1 to 24 hours, as exemplified by 600° C. and 12 hours. By this step, the impurity elements added for the n-type and p-type can be activated. Moreover, the catalytic element (nickel in this embodiment), as remained in the aforementioned first impurity region after the crystallization, can be migrated and gettered (or captured) in that region by the action of the phosphorus contained in the aforementioned first impurity region 212. As a result, the nickel can be reduced from the channel forming region to $1 \times 10^{17}$ atoms/cm$^3$ or less.

The subsequent steps follow those of Embodiment 1 so that a semiconductor device can be manufactured.

Here, the construction of this embodiment can be freely combined with any of the constructions of Embodiments 3, 4 and 5.

Embodiment 7

This embodiment presents an example in which the crystalline TFT is manufactured by the steps of a sequence different from that of Embodiment 1. Here will be specifically described a gettering step which is different from that using phosphorus, as exemplified in Embodiment 4. Here, the basis steps follow FIGS. 2A to 2E or FIGS. 3A to 3E, and the description will be made noting only the differences.

Figure 10A:
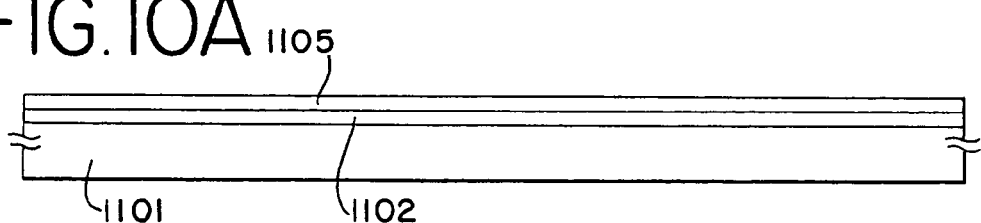
FIGS. 10A and 10B are explanatory diagrams presenting the substrate sections of a gettering step of Embodiment 7.

First of all, the state of FIG. 10A is obtained according to the steps of Embodiment 1. However, the thermal crystallization technique, as presented in Embodiment 3, is used for forming a crystalline silicon film 1105 to form the active layer of the TFT.

Next, a substrate 1101 is dipped in its entirety in a liquid phase (e.g., in a sulfuric acid solution in this embodiment) heated to 300° C., to remove or reduce the nickel used for the crystallization. In this embodiment, the gettering step is performed before the active layer is patterned, but the active layer may be gettered after patterned. Another means for contacting with the sulfuric acid may be exemplified by a method of dripping the heated sulfuric acid solution homogeneously onto the substrate.

Figure 10B:

At this step, the nickel is dissolved into the heated sulfuric acid and is easily removed from the vicinity of the surface. Then, the internal nickel diffuses to the vicinity of the surface having a low concentration so that more nickel is dissolved. By repeating this phenomenon, the nickel having been used for the crystallization is removed or reduced from the crystalline silicon film. By thus performing the treatment to reduce the catalytic element with the liquid phase, the concentration of the catalytic element in a crystalline silicon film 1106 can be reduced to $1 \times 10^{17}$ atoms/cm$^3$ or less, preferably to $1 \times 10^{16}$ atoms/cm$^3$ (FIG. 10B).

Here, in order to enhance the contactability between the sulfuric acid solution and the crystalline semiconductor film, it is desired to remove and clean the natural oxide film or the like in advance from the surface of the crystalline semiconductor film with an etchant or the like containing hydrofluoric acid. Then, it is possible to enhance the gettering efficiency.

On the other hand, this embodiment has been described by taking the nickel as an example, but the aforementioned other catalytic elements are gettered by a similar phenomenon.

The TFT shown in FIGS. 1A to 1D is obtained if the process described in connection with Embodiment 1 is used with the crystalline silicon film 1106 obtained through the steps thus far described.

Here, the construction of this embodiment can be freely combined with any of the constructions of Embodiments 3, 4, 5 and 6.

Embodiment 8

In each of the aforementioned embodiments, in the semiconductor layer of the n channel TFT, the LDD regions of the same width (as taken in the channel length direction) are formed laterally symmetrically across the channel forming region. In this embodiment, an example, in which the invention is applied to the arrangement of another semiconductor layer and to another TFT structure, is shown in FIGS. 11A and 11B.

Figure 11A:
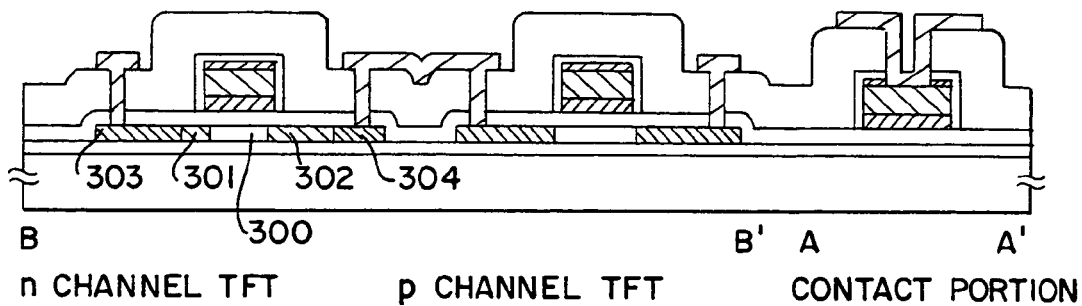
FIGS. 11A and 11B are explanatory diagrams presenting substrate sections of Embodiment 8.

In the semiconductor layer of the n channel TFT of the CMOS circuit, as shown in FIG. 11A, LDD regions 301 and 302 of different widths (as taken in the channel length direction) are formed across the channel forming region. The CMOS circuit shown in FIG. 11A can be manufactured by properly modifying the pattern shapes of the resist mask 203 of FIG. 2B and the resist mask 208 of FIG. 2E of Embodiment 1, as the process for forming the LDD region, in accordance with Embodiment 1. In FIG. 11A, reference numeral 300 designates a channel forming region, and numerals 303 and 304 designate a source region or a drain region.

Figure 11B:
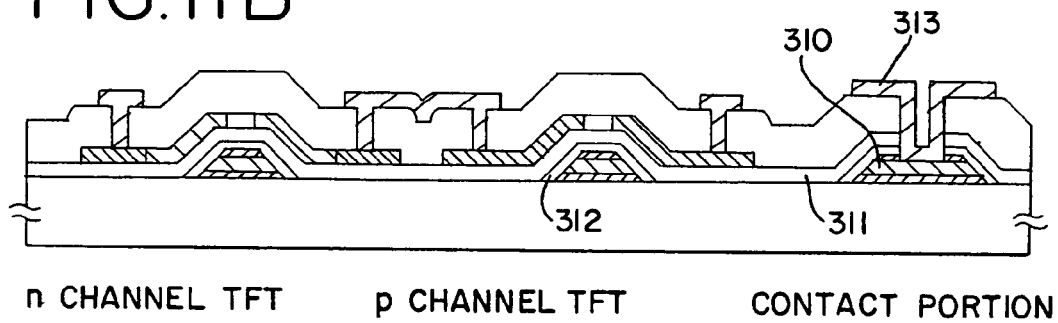

On the other hand, FIG. 11B shows an example in which the invention is applied to an inversely staggered type TFT. As in Embodiment 1, in the contact portion, there are electrically connected an upper line 313 and a second conductive layer 310 of the gate line. In FIG. 11B, numeral 311 designates a gate insulating film, and numeral 312 designates an anodized film. Thus, the invention can be applied independently of the TFT structure.

It is noted that, the construction of this embodiment can be freely combined with any of the constructions of Embodiments 3 through 7.

Embodiment 9

In this embodiment, FIGS. 15A to 15E and FIGS. 16A to 16C show an example in which the semiconductor layer 102 is doped with an impurity the doping step of FIG. 2E of Embodiment 1 as after its surface was exposed by etching the gate insulating film 103 using the gate line as the mask. Here, the basic steps follow those of FIGS. 2A to 2E or FIGS. 3A to 3E, and the description will be made noting only the differences.

Figure 15A:
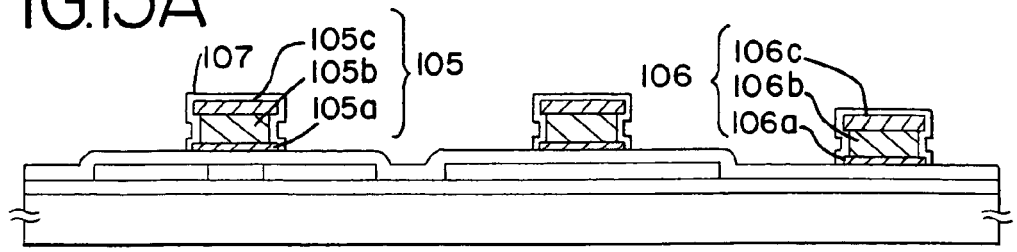
FIGS. 15A to 15E are explanatory diagrams of a process for manufacturing a TFT of Embodiment 9.

This embodiment is identical to Embodiment 1 till the anodization step shown in FIG. 2D. FIG. 15A is a diagram corresponding to that of FIG. 2D. For simplification, there are used the same reference numerals as those of FIG. 2D.

Figure 17A:
FIGS. 17A to 17C are explanatory diagrams presenting TEM photographs of substrate sections of Embodiment 9.
Figure 18A:
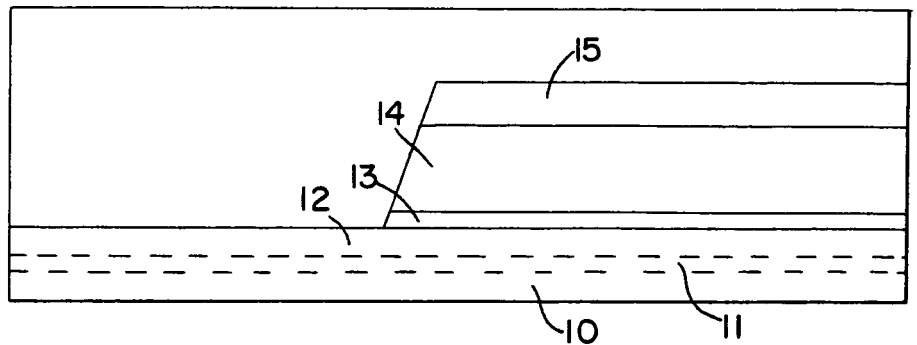
FIGS. 18A to 18C are explanatory diagrams presenting schematic substrate sections of Embodiment 9.

The gate electrode 105 and the gate line 106 are formed according to Embodiment 1. The TEM photograph illustrating the state of a section at this time is presented in FIG. 17A, and a schematic diagram corresponding to FIG. 17A is shown in FIG. 18A. The TEM photograph is an enlarged view of the vicinity of the gate electrode 105.

Figure 17B:
Figure 18B:
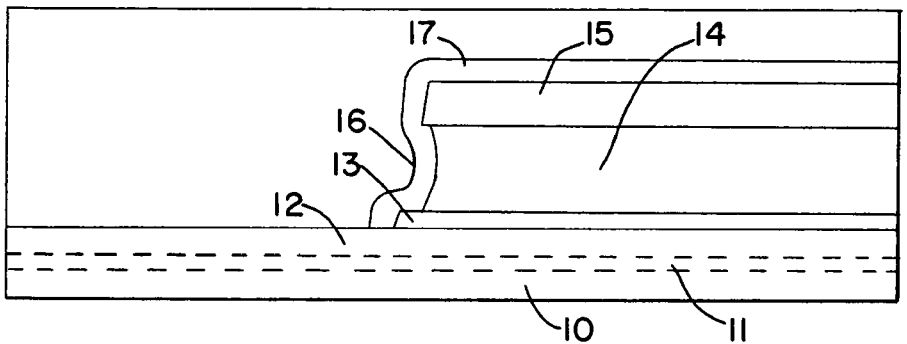

After the step of forming the gate line, moreover, an anodization is performed to establish the state of FIG. 15A. The TEM photograph illustrating the state of a section at this time is presented in FIG. 17B, and a schematic diagram corresponding to FIG. 17B is shown in FIG. 18B.

Figure 15B:
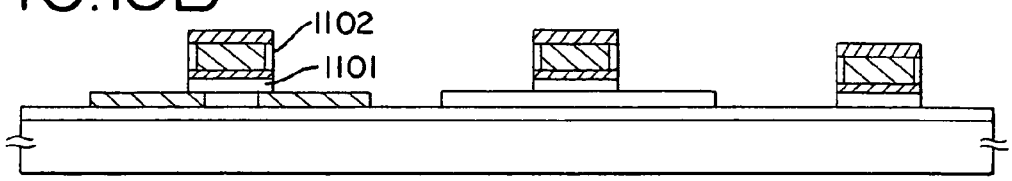
Figure 17C:
Figure 18C:
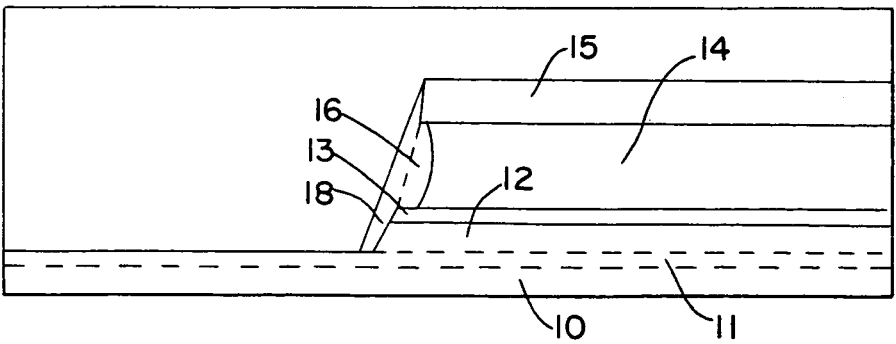

Next, a dry-etching is performed using CHF$_3$ as the reaction gas to remove the gate insulating film 103 selectively by using the gate line 106 as the mask thereby to expose a portion of the semiconductor layer (FIG. 15B). Simultaneously with this, the tantalum oxide film is also removed, but an alumina film 1102 is left. Depending upon the etching conditions, the tantalum may be slightly removed. Here, the etching conditions have to be properly adjusted considering the material and thickness of the gate insulating film and the thickness of the oxide film over the third conductive layer. Otherwise, the semiconductor layer may be over-etched. The numeral 1101 designates the left gate insulating film. The TEM photograph illustrating the state of a section at this time is presented in FIG. 17C, and a schematic diagram corresponding to FIG. 17C is shown in FIG. 18C. Since a reaction product is formed on the side wall of the gate electrode, as shown in FIG. 18C, it is desirably removed but may be left as it is.

Figure 15C:
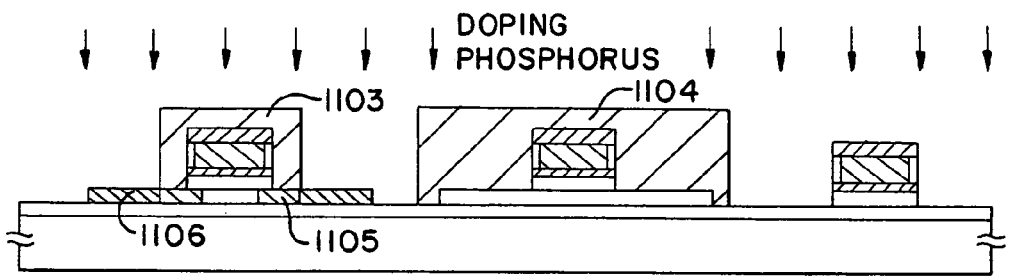

Next, resist masks 1103 and 1104 are formed, and the exposed semiconductor layer is secondly doped with an impurity (e.g., phosphorus) (FIG. 15C). The numeral 1105 designates an LDD region, and the numeral 1106 designates a first impurity region (n$^+$).

Figure 15D:
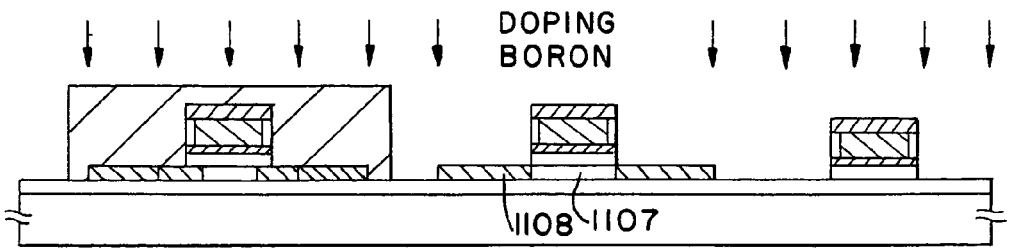

Then, the resist masks 1103 and 1104 are removed to form a resist mask for covering the n channel TFT, and the exposed semiconductor layer is doped with boron as an impurity (FIG. 15D). Numeral 1107 designates the channel forming region, and numeral 1108 designates a first impurity region (p$^+$).

Figure 15E:
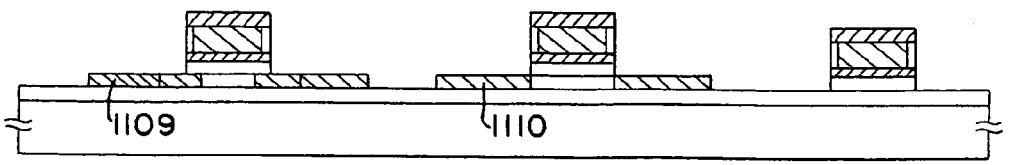
Figure 16A:
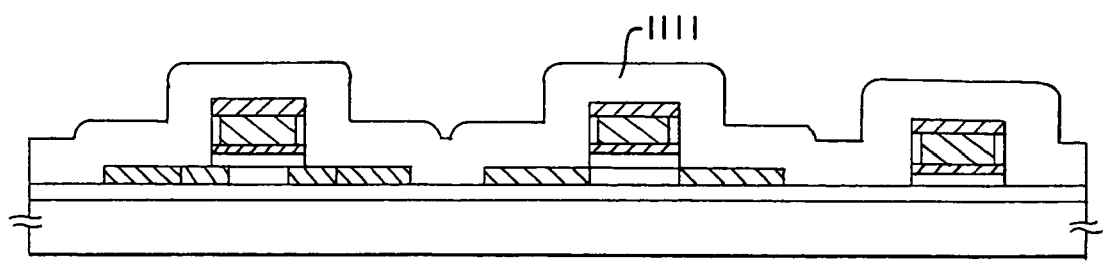
FIGS. 16A to 16C are explanatory diagrams of the process for manufacturing the TFT of Embodiment 9.

Next, the resist mask is removed to perform an activation. In FIG. 15E, numeral 1109 designates the activated first impurity region (n$^+$), and numeral 1110 designates the activated first impurity region (p+). Then, an interlayer insulating film 1111 is formed (FIG. 16A).

Figure 16B:
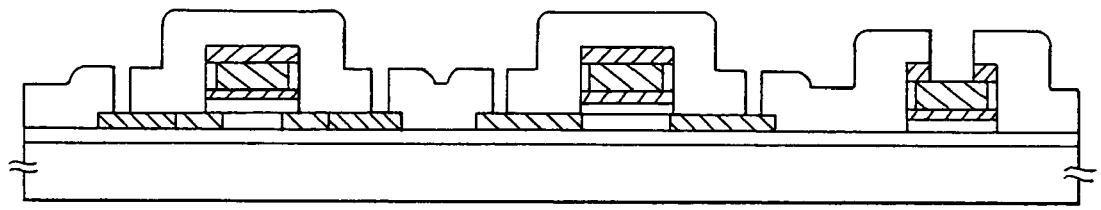

As shown in FIG. 16B, the interlayer insulating film is selectively removed by using the resist mask (not-shown) by the dry-etching using $CF_4$ or $CHF_3$, to form the contact hole reaching the source region or drain region. Simultaneously with this, there is formed the contact hole reaching the second conductive layer of the gate line. Here, a caution has to be employed to prevent the source region and the drain region from being overetched. As compared with Embodiment 1, this embodiment can form the contact hole more easily, because the gate insulating film is removed.

Figure 16C:
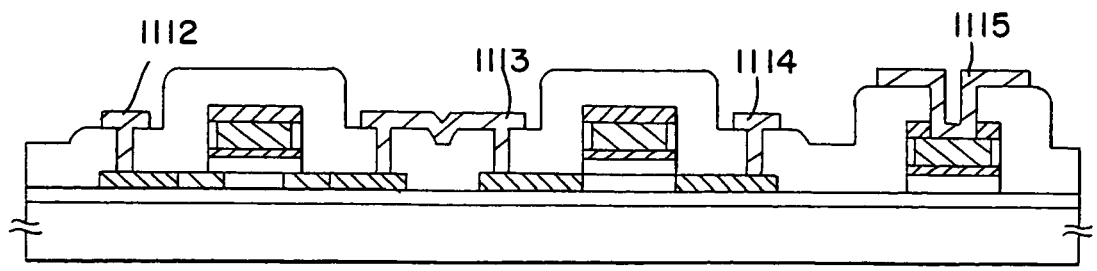

Next, there are formed source lines (or source electrodes) 1112 and 1114, a drain line (or a drain electrode) 1113 and an upper line (or a lead-out line) 1115 (FIG. 16C). Finally, a heat treatment is performed in the hydrogen atmosphere to hydrogenate the entirety. At this stage, there is completed the CMOS circuit (i.e., n channel TFT and the p channel TFT), as shown in FIG. 16C.

Here in FIGS. 18A to 18C: numeral 10 designates an underlying film; numeral 11 a semiconductor layer; numeral 12 a gate insulating film; numeral 13 a tantalum layer; numeral 14 an aluminum layer; numeral 15 a tantalum layer; numeral 16 a non-porous alumina layer; numeral 17 a tantalum oxide; and numeral 18 a reaction product.

It is noted that the construction of this embodiment can be freely combined with any of the constructions of Embodiments 3 through 7.

Embodiment 10

Figure 12:
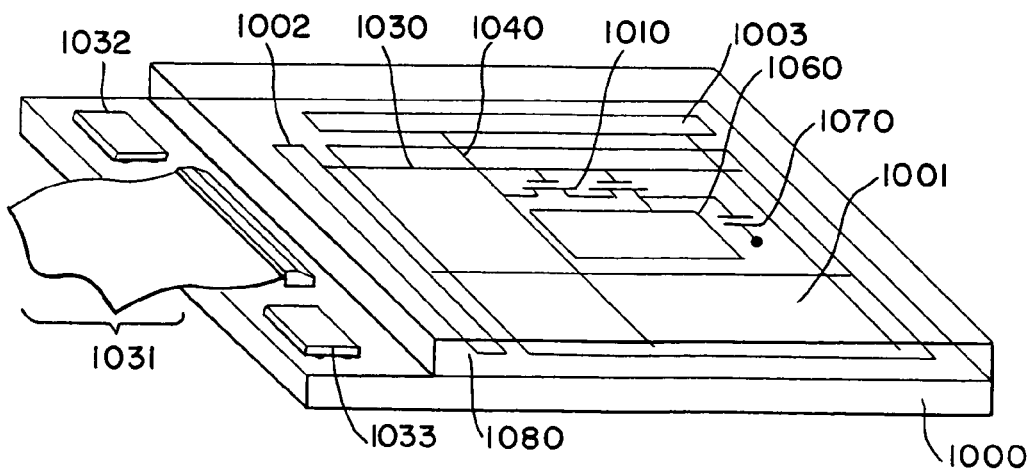
FIG. 12 is a view showing a construction of an active matrix substrate.

In this embodiment, an example of a liquid crystal display device manufactured by the invention is shown in FIG. 12. The process for manufacturing the pixel TFT (or the pixel switching element) and the cell assembling step will be omitted from the detailed description because they may employ the well-known means.

FIG. 12 is a schematic diagram showing an active matrix type liquid crystal panel of this embodiment. As shown in FIG. 12, the active matrix substrate and the counter substrate confront each other and a liquid crystal material is injected between them. The active matrix substrate includes a pixel matrix circuit 1001, a scanning line drive circuit 1002 and a signal line drive circuit 1003, which are formed over a glass substrate 1000.

The scanning line drive circuit 1002 and the signal line drive circuit 1003 are connected via a scanning line 1030 and a signal line 1040, respectively, with the pixel matrix circuit 1001. These drive circuits 1002 and 1003 are constructed mainly of the CMOS circuit.

The pixel matrix circuit 1001 is provided at each row with the scanning line 1030 and at each column with the signal line 1040. In the vicinity of the intersection of the scanning line 1030 and the signal line 1040, there is formed a pixel TFT 1010. This pixel TFT 1010 has a gate electrode connected with the scanning line 1030 and a source connected with the signal line 1040. With the drain, moreover, there are connected a pixel electrode 1060 and a retaining capacity 1070.

On a counter substrate 1080, a transparent conductive film such as an ITO film is formed all over the glass substrate. This transparent conductive film provides a counter electrode to the pixel electrode 1060 of the pixel matrix circuit 1001 so that the liquid crystal material is driven by the electric field which is established between the pixel electrode and the counter electrode. The counter substrate 1080 is provided, if necessary, with an orientation film, a black matrix and a color filter.

On the glass substrate, there are attached IC chips 1032 and 1033 by making use of a face for attaching an FPC 1031. These IC chips 1032 and 1033 are constructed by forming over the silicon substrate a circuit such as a video signal processing circuit, a timing pulse generating circuit, a Y correcting circuit, a memory circuit and an arithmetic circuit.

Although this embodiment has been described by taking the liquid crystal display device, moreover, it is quite natural that the invention could be applied to an EL (Electroluminescence) display device or an EC (Electro-Chromics) display device if the display device is of the active matrix type.

On the other hand, the liquid crystal display device to be manufactured by the invention may be of either the transmission or reflection type. It is arbitrary for the practicer to select either type. Thus, the invention can be applied to all active matrix type electrooptical devices (or semiconductor devices).

Here, when the semiconductor device exemplified in this embodiment is to be manufactured, any of the constructions of Embodiments 1 through 9 may be adopted, and the individual embodiments can be freely used in any combination.

Embodiment 11

The invention can be applied to the entire IC techniques of the related art. In other words, the invention can be applied to all semiconductor circuits that are available at present in the market. For example, the invention can be applied to a microprocessor such as a RISC processor or an ASIC processor integrated over one chip, or a high-frequency circuit for a signal processing circuit, as represented by a liquid crystal driver circuit (e.g., a D/A converter, a Y correcting circuit or a signal dividing circuit) or a portable device (e.g., a portable telephone, a PHS or a mobile computer).

Moreover, the layer insulating film is formed over the MOSFET of the prior art so that a semiconductor device having a three-dimensional structure, in which a semiconductor circuit is manufactured by using the invention, can be realized over the layer insulating film. Thus, the invention can be applied all the semiconductor devices using the LSI at present. More specifically, the invention may be applied to the SOI structure (i.e., the TFT structure using the single-crystalline semiconductor thin film) such as SIMOX, Smart-Cut (i.e., the registered trade mark of SOITEC Inc.) or ELTRAN (i.e., the registered trade mark of Canon Inc.).

On the other hand, the semiconductor circuit such as the microprocessor functions, when mounted on various electronic devices, as a central circuit. As typical electronic devices, there are enumerated a personal computer, a portable type information terminal device and all other household appliances. Also enumerated is a control computer for vehicles (e.g., automobiles or electric trains). The invention can also be applied to such semiconductor devices.

Here, when the semiconductor device exemplified in this embodiment is to be manufactured, any of the constructions of Embodiments 1 through 9 may be adopted, and the individual embodiments can be freely used in any combination.

Embodiment 12

The CMOS circuit or pixel portion, as manufactured by practicing the invention, can be employed in various electrooptical devices (e.g., an active matrix type liquid crystal display, an active matrix type EL display or an active matrix type EC display). In short, the invention can be practiced in all the electronic devices having those electrooptical devices incorporated into their display units.

As these electronic devices, there are enumerated a video camera, a digital camera, a projector (of rear type or front type), a head mount display (e.g., a goggle type display), a car navigation, a car stereo, a personal computer and a portable information terminal (e.g., a mobile computer, a portable telephone or an electronic book). Some of these examples are shown in FIGS. 13A to 13F, 23A to 23D and 24A to 24C.

Figure 13A:
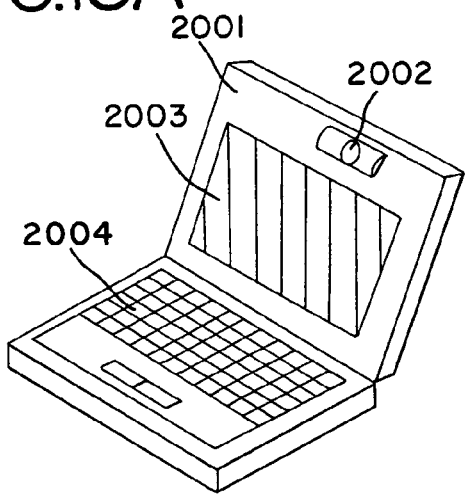
FIGS. 13A to 13F are explanatory diagrams of electronic devices.

FIG. 13A shows a personal computer including a body 2001, an image input unit 2002, a display unit 2003 and a keyboard 2004. The invention can be applied to the image input unit 2002, the display unit 2003 and other signal control circuits.

Figure 13B:
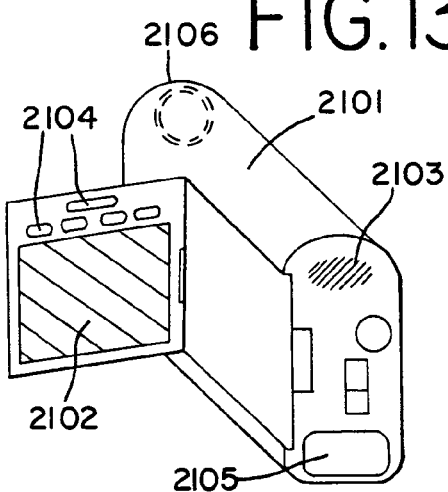

FIG. 13B shows a video camera including a body 2101, a display unit 2102, a voice input unit 2103, a control switch 2104, a battery 2105 and an image receiving unit 2106. The invention can be applied to the display unit 2102 and other signal control circuits.

Figure 13C:
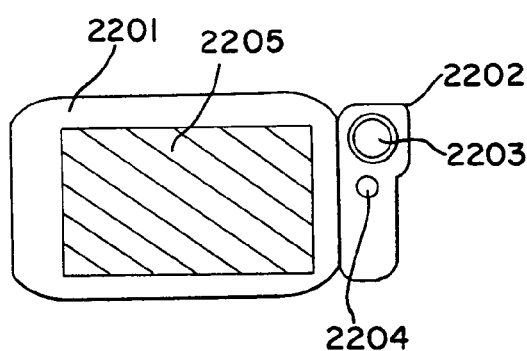

FIG. 13C shows a mobile computer including a body 2201, a camera unit 2202, an image receiving unit 2203, a control switch 2204 and a display unit 2205. The invention can be applied to the display unit 2205 and other signal control circuits.

Figure 13D:
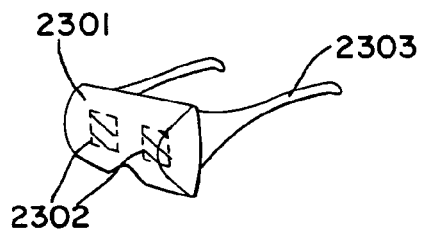

FIG. 13D shows a goggle type display including a body 2301, a display unit 2302 and an arm unit 2303. The invention can be applied to the display unit 2302 and other signal control circuits.

Figure 13E:
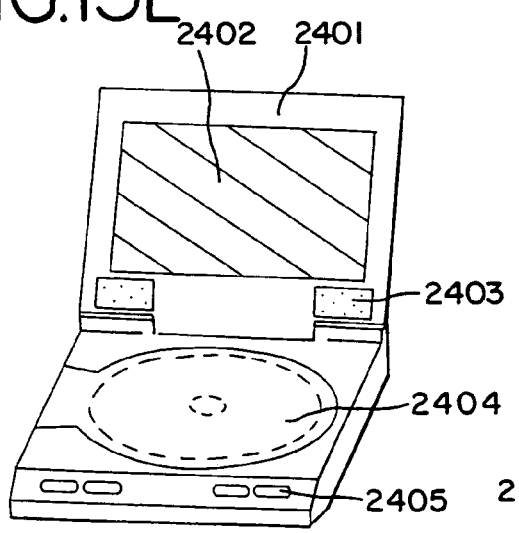

FIG. 13E shows a player using recording media recorded with a program (as will be called the "recording medium") and including a body 2401, a display unit 2402, a speaker unit 2403, recording medium 2404 and a control switch 2405. Here, this player is enabled to play musics, cinemas, games or internets by using the DVD (Digital Versatile Disc) or CD. The invention can be applied to the display unit 2402 and other signal control circuits.

Figure 13F:
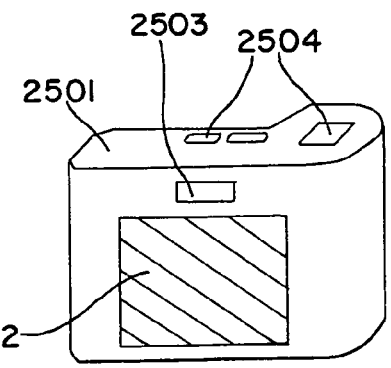

FIG. 13F shows a digital camera including a body 2501, a display unit 2502, an eyepiece unit 2503, a control switch 2504 and a image receiving portion (not-shown). The invention can be applied to the display unit 2502 and other signal control circuits.

Figure 23A:
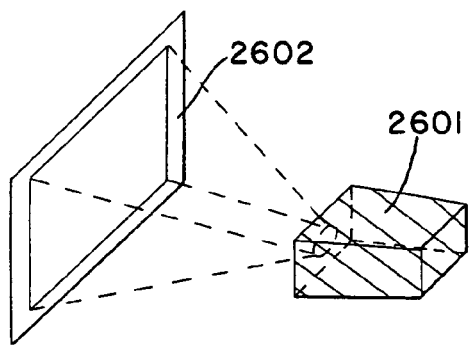
FIGS. 23A to 23D are explanatory diagrams of electronic devices.

FIG. 23A shows a front type projector including a projection unit 2601 and a screen 2602. The invention can be applied to the liquid crystal display unit 2808 shown in FIG. 23C forming a part of the projection unit 2601 and other signal control circuits.

Figure 23B:
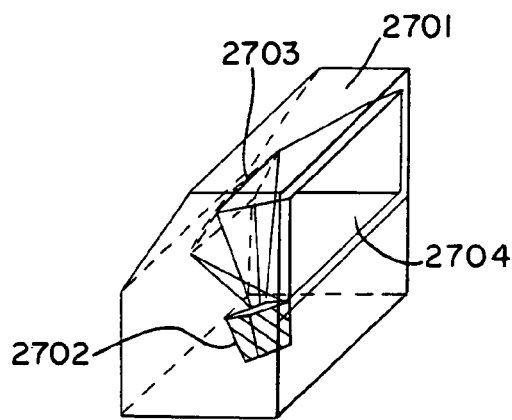

FIG. 23B shows a rear type projector including a body 2701, a projection unit 2702, a mirror 2703 and a screen 2704. The invention can be applied to the liquid crystal display unit 2808 forming a part of the projection unit 2702 and other signal control circuits.

Figure 23C:
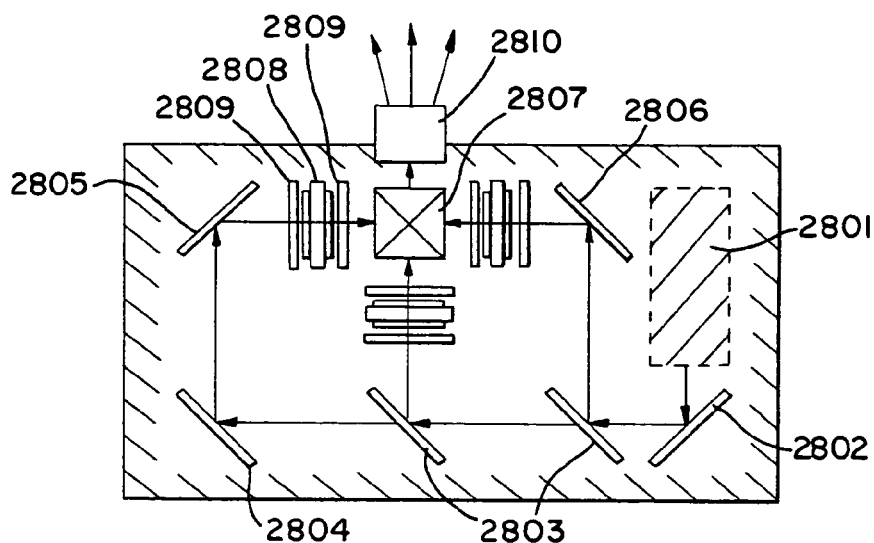

Here, FIG. 23C is a diagram showing one example of the structures of the projection units 2601 and 2702 in FIGS. 23A and 23B. The projection unit 2601 or 2702 includes a light source optical system 2801, mirrors 2802, 2804, 2805 and 2806, a dichroic mirror 2803, a prism 2807, a liquid crystal display unit 2808, a phase difference plate 2809 and a projection optical system 2810. This projection optical system 2810 is constructed of an optical system including a projection lens. This embodiment is exemplified by the three-plate type and should not be limited thereto but may be of a single-plate type. On the other hand, the practicer can properly provide the optical path, as indicated by arrows in FIG. 23C, with an optical system such as an optical lens, a film having a polarizing function, a film for adjusting the phase difference, or an IR film.

Figure 23D:
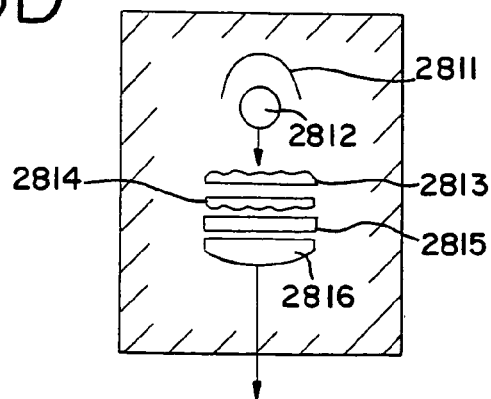

On the other hand, FIG. 23D is a diagram showing one example of the structure of the light source optical system 2801 in FIG. 23C. In this embodiment, the light source optical system 2801 is constructed to include a reflector 2811, a light source 2812, lens arrays 2813 and 2814, a polarizing conversion element 2815 and a condensing lens 2816. Here, the light source optical system shown in FIG. 23D presents only one example, and the invention should not be especially limited thereto. For example, the practicer can properly provide the light source optical system with an optical system such as an optical lens, a film having a polarizing function, a film for adjusting the phase difference, or an IR film.

In the projector shown in FIGS. 23A to 23D, however, there is shown the case using the transmission type electrooptical device but not any example of applications of the reflection type electrooptical device and the EL display device.

Figure 24A:
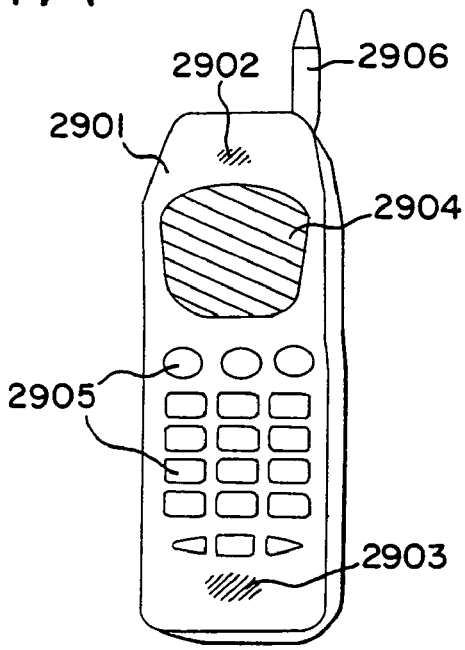
FIGS. 24A to 24C are explanatory diagrams of electronic devices.

FIG. 24A shows a portable telephone including a body 2901, a voice output unit 2902, a voice input unit 2903, a display unit 2904, a control switch 2905 and an antenna 2906. The invention can be applied to the voice output unit 2902, the voice input unit 2903, the display unit 2904 and other signal control circuits.

Figure 24B:
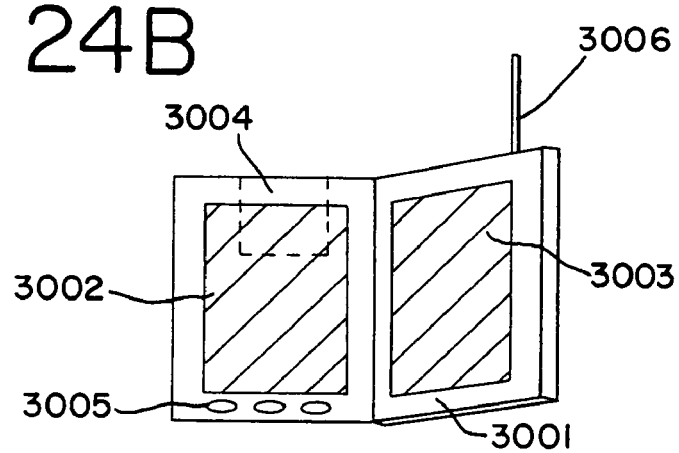

FIG. 24B shows a portable book (an electronic book) including a body 3001, display units 3002 and 3003, a memory 3004, a control switch 3005 and an antenna 3006. The invention can be applied to the display units 3002 and 3003 and other signal circuits.

Figure 24C:
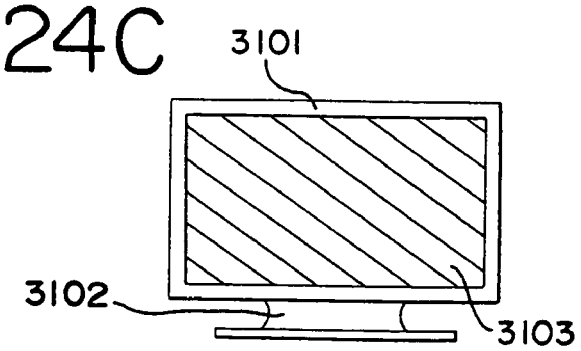

FIG. 24C shows a display device including a body 3101, a support bed 3102 and a display unit 3103. The invention can be applied to the display unit 3103. The display of the invention is advantageous especially for the larger screen such as a display having a diagonal size of 10 inches or more (especially 30 inches or more).

Thus, the invention has a remarkably wide range of application so that it can be applied electronic devices of all fields.

Here, when the semiconductor device exemplified in this embodiment is to be manufactured, any of the constructions of Embodiments 1 through 9 may be adopted, and the individual embodiments can be freely used in any combination. On the other hand, the electrooptical device and the semiconductor circuit, as exemplified in Embodiments 10 and 11, may be combined in such manners.

Embodiment 13

This embodiment follows the basic steps of Embodiment 1, except the doping order from Embodiment 1, so that the description will be made noting only the differences. The portions, as designated by the same reference numerals as those of Embodiment 1, are identical.

First of all, the same state as that of FIG. 2A is established according to Embodiment 1 (FIG. 19A).

Next, there are formed photoresist masks 1208 and 1209 to cover a portion of the n channel TFT and the p channel TFT. This photoresist mask 1208 is wider in the channel length direction than the gate electrode. Then, a step of doping the semiconductor layer 201 with an impurity element for giving the n-type by using the photoresist mask 1208 as the mask is performed to form a first impurity region (or the n$^+$ region) 1210 shown in FIG. 19B. By this photoresist mask 1208, the length of the first impurity region (the n$^+$ region) is determined. The method of adding the impurity element can be exemplified by the ion implantation method or the ion doping method. The impurity for the n type acts as a donor for silicon or germanium. The impurity is exemplified by an element of the 15th group, typically by phosphorus (P) or arsenic (As).

Next, after the photoresist masks 1208 and 1209 have been removed, and the photo mask 1 is used to form photoresist masks 1203 and 1204 to cover a portion (to form the channel forming region) of the n channel TFT or the p channel TFT.

Then, the photoresist mask 1203 is used as the mask to dope the semiconductor layer 201 again with an impurity element for giving it the n type to form an impurity region (n⁻ region) 1305 shown in FIG. 19C. A region 1304, as covered with the photoresist mask 1203 so that it is left undoped with the impurity at the doping step of FIG. 19C, provides a channel forming region of the n channel TFT. On the other hand, the photoresist mask 1203 is narrower in the channel length direction than the gate electrode to be formed later. By this step, an impurity region (or an –region) is formed below the gate electrode formed later.

Next, the photoresist masks 1203 and 1204 are removed to activate (by a heat treatment, a laser annealing treatment or the like) the impurities which were added to the impurity region (n⁻ region) 1305 and the first impurity region (n⁺ region). The activation step is not necessary performed at this stage. However, the impurity region overlapping with the gate electrode to be formed later is able to be activated without considering the heat resisting temperature of the gate electrode, because the gate electrode is not formed yet.

Next, there is formed as in Embodiment 1 the gate electrode 206 having the three-layered structure over the gate insulating film (FIG. 19D). The gate electrode 206 is formed by the well-known patterning technique after the conductive film was laminated by the sputtering method or the like. The length of the gate electrode is set to 0.1 to 10 µm (typically 0.2 to 5 µm). For a later anodization step, however, all the gate lines have to be connected with one wiring line. Here, the sectional shape of the gate electrode is desirably tapered for an excellent coverage.

Next, the anodization is performed to form the anodized film 107 on the side portion of the first conductive layer 105a, on the side portion of the second conductive layer 105b, and over and on the side portion of the third conductive layer 105c (FIG. 19E). The anodization is performed in a neutral electrolyte, for example, with an electrolyte (at a liquid temperature of 10° C.), prepared by neutralizing an ethylene glycol solution containing tartaric acid, with aqueous ammonia, by using the gate line as the anode and platinum as the cathode. The anodized film thus obtained has a dense film quality so that it can be prevented from being separated or generating hillocks even it is subjected to the doping step or the heat treatment. Especially in the embodiment, the second conductive layer is made of a material containing aluminum of low heat resistance as its main component, but the dense anodized film (or the alumina film) is formed on the side so that the heat resistance of the gate electrode is improved remarkably effectively. Here, the thickness of the alumina film necessary for giving the gate electrode the sufficient heat resistance is 10 nm or more, preferably 30 nm or more.

Of the regions doped with phosphorus at the doping step of FIG. 19C, on the other hand, the region overlapping the gate electrode 105 provides the second impurity region, and the region not-overlapping the gate electrode 105 provides the third impurity region.

Here, the concentration of phosphorus in the second impurity region and the third impurity region (n⁻ regions) are lower than that of the first impurity region (n⁺ region).

By the subsequent steps similar to those of Embodiment 1, the CMOS circuit constructing a portion of the peripheral drive circuit, and the pixel TFT constructing a portion of the pixel matrix circuit can be manufactured.

Here, the construction of this embodiment can be freely combined with any of the constructions of Embodiments 1 through 12.

Embodiment 14

In this embodiment, FIGS. 20A to 20E show an example in which an impurity for giving the n type and an impurity for giving the p type are added prior to the step of forming the gate electrode in Embodiment 1. Here, the basic construction follows that of Embodiment 1, and the description will be made noting only the differences.

Figure 20A:
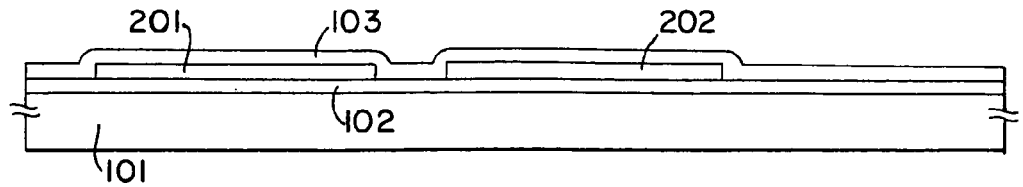
FIGS. 20A to 20E are explanatory diagrams of a process for manufacturing a TFT of Embodiment 14.
Figure 20B:
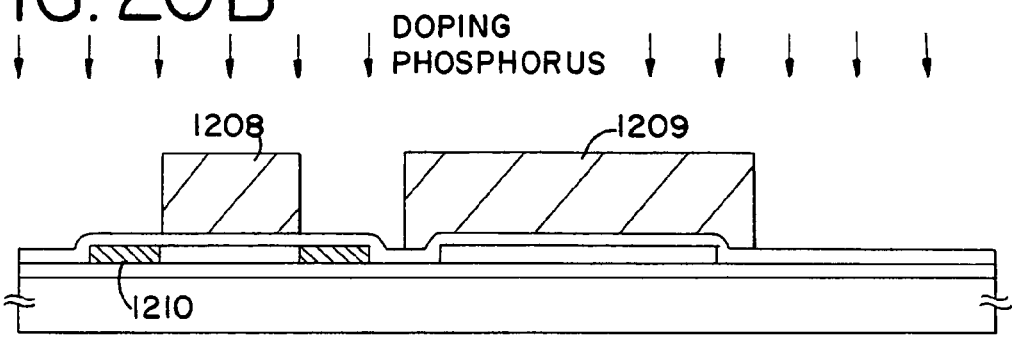

This embodiment is identical to Embodiment 13 till the doping step shown in FIG. 19B. FIG. 20A corresponds to FIG. 2A whereas FIG. 20B corresponds to FIG. 19B, and the same reference numerals are employed.

Figure 20C:
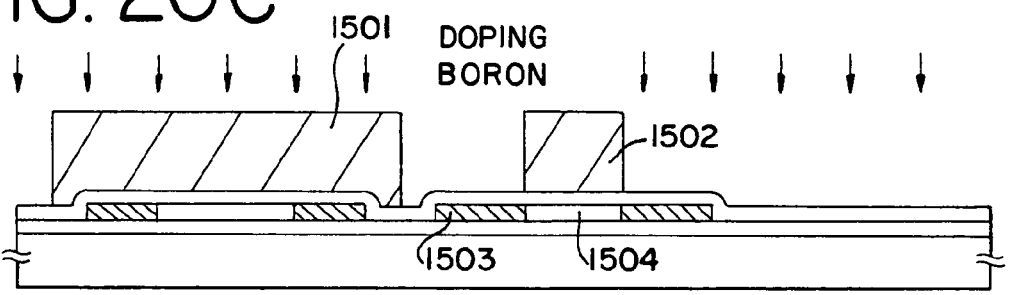

After the state of FIG. 19B was established according to Embodiment 1 and Embodiment 13, the resist masks 1208 and 1209 are removed. Next, the photoresist film is patterned to form a resist mask 1501 to cover the semiconductor layer 201 and a resist mask 1502 to cover a portion of the semiconductor layer 202. By using the resist mask 1502 as the mask, moreover, the semiconductor film 202 is exclusively doped with an impurity for giving the p-type. In this embodiment, the impurity for the p-type is exemplified by boron (B), and the semiconductor layer 202 is doped with the impurity through the gate insulating film by the ion doping method using diborane ($B_2H_6$). A first impurity region 1503 thus formed provides the source region or drain region of a later-described p channel TFT. The concentration of this region is set to $5 \times 10^{20}$ atoms/cm³ in this embodiment. Here, the region just below the resist mask 1502 is not doped with boron to define a channel forming region 1504 of the p channel TFT (FIG. 20C).

Figure 20D:
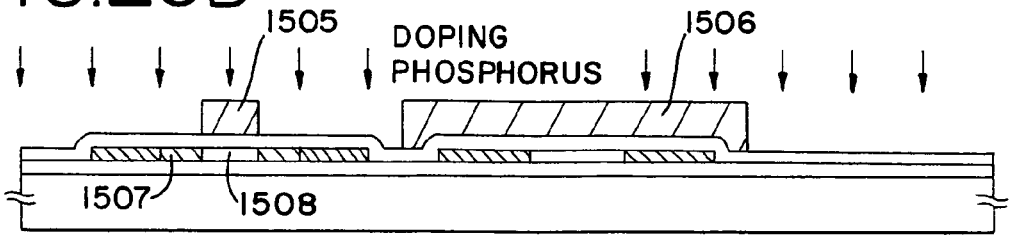

Next, the resist masks 1501 and 1502 are removed. Then, the photoresist film is patterned to form a photoresist mask 1506 to cover the region for forming the p channel TFT and a photoresist mask 1505 to cover a portion of the n channel TFT, and by using the photoresist masks 1505 and 1506 as the mask the semiconductor layer is secondly doped with an impurity for giving the n type. In this embodiment, the impurity for the n type is exemplified by phosphorus, and the semiconductor layer 201 is doped with the impurity through the gate insulating film by the ion-doping method using phosphine ($PH_3$). An impurity region 1507 thus formed provides an LDD region of a later-described n channel TFT. The concentration of phosphorus in the region is set to $1 \times 10^{18}$ atoms/cm³ in this embodiment. Here, the region just below the resist mask 1505 is not doped with boron to define a channel forming region 1508 of the n channel TFT (FIG. 20D).

Figure 20E:
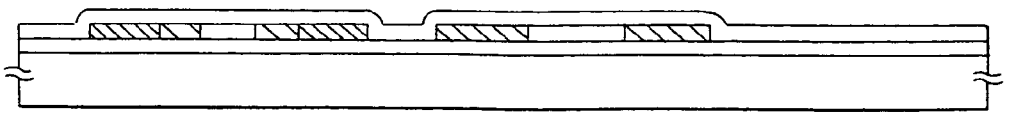

Next, the photoresist masks 1505 and 1506 are removed to perform the activation (FIG. 20E). Since no gate electrode exists at this stage, it is unnecessary to consider the diffusion which may come from the material making the gate electrode, as having raised a problem in the related art. Thus, it is effective to perform the activation by the heat treatment at this stage, that is, prior to the gate electrode forming step.

The subsequent steps may form the gate electrode, the interlayer insulating film, the contact hole, the upper line and so on may be carried out according to the TFT manufacturing method of Embodiment 1 or the ralated art.

Here, the construction of this embodiment can be freely combined with any of the constructions of Embodiments 1 through 12.

Embodiment 15

In this embodiment, FIGS. 21A to 21E show an example in which an impurity for giving the n type and an impurity for giving the p type are added prior to the step of forming the gate electrode in Embodiment 13. Here, the basic construction follows those of Embodiment 1 and Embodiment 13, and the description will be made noting only the differences.

Figure 21A:
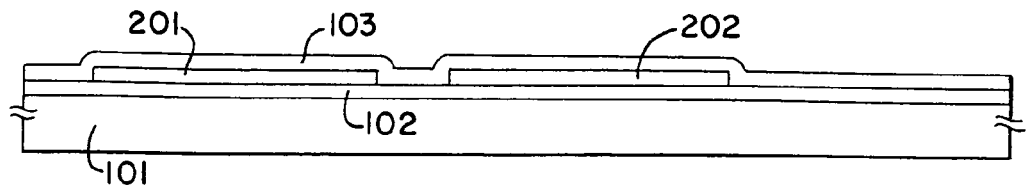
FIGS. 21A to 21E are explanatory diagrams of a process for manufacturing a TFT of Embodiment 15.

This embodiment is identical to Embodiment 1 till the doping step shown in FIG. 2A. FIG. 21A corresponds to FIG. 2A, and the same reference numerals are employed.

Figure 21B:
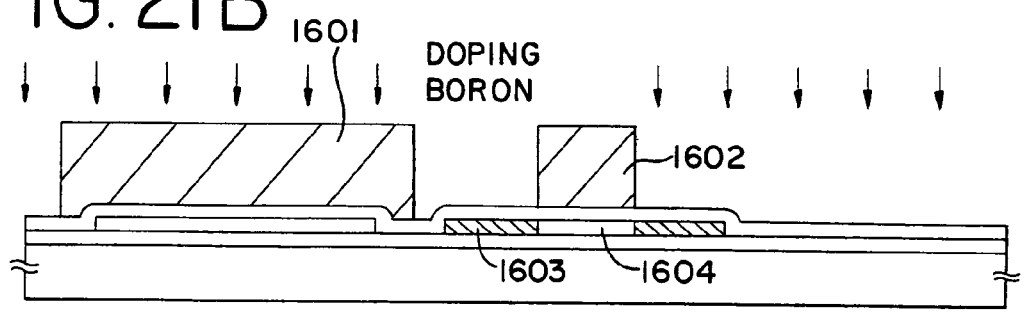

After the state of FIG. 21A was established according to Embodiment 1, the photoresist film is patterned to form a resist mask 1601 to cover the semiconductor layer 201 and a resist mask 1602 to cover a portion of the semiconductor layer 202. By using the resist mask 1602 as the mask, moreover, the semiconductor film 202 is exclusively doped with an impurity for giving the p type. A first impurity region 1603 thus formed provides the source region or drain region of a later-described p channel TFT. The concentration of boron in this region is set to $5 \times 10^{20}$ atoms/cm$^3$ in this embodiment. Here, the region just below the resist mask 1602 is not doped with boron to define a channel forming region 1604 of the p channel TFT (FIG. 21B).

Next, the resist masks 1601 and 1602 are removed. After this, the photoresist film is patterned to form a photoresist mask 1606 to cover the region for forming the p channel TFT and a photoresist mask 1605 to cover a portion of the n channel TFT, and the semiconductor layer 201 is doped with an impurity for giving the n-type by using the photoresist mask 1605 as the mask. An impurity region 1607 thus formed provides an LDD region of later-described n channel TFT. The concentration of phosphorus in this region is set to $1 \times 10^{18}$ atoms/cm$^3$ in this embodiment.

Figure 21C:
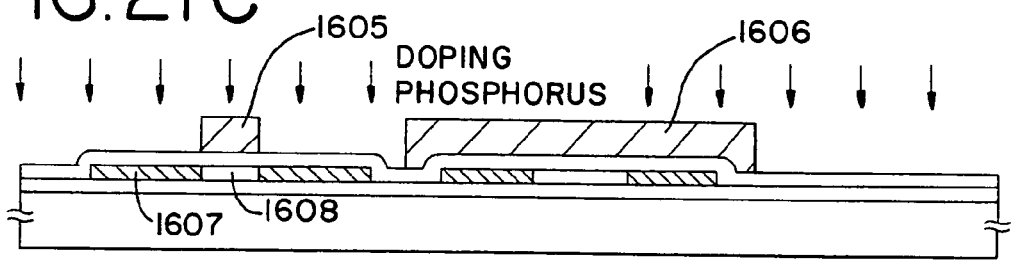

On the other hand, the region just below the photoresist mask 1605 is not doped with phosphorus to define an channel forming region 1608 of the n channel TFT by the photoresist mask 1605 (FIG. 21C).

Next, the resist masks 1605 and 1606 are removed. Then, the photoresist film is patterned to form a photoresist mask 1610 to cover the region for forming the p channel TFT and a photoresist mask 1609 to cover a portion of the n channel TFT, and the semiconductor layer 201 is doped secondly with an impurity for giving the n-type by using the photoresist mask 1609 as the mask. A first impurity region 1611 thus formed leads to form the source region or drain region of a later-described n channel TFT. The concentration of phosphorus of this region is set to $5 \times 10^{20}$ atoms/cm$^3$ in this embodiment.

Figure 21D:
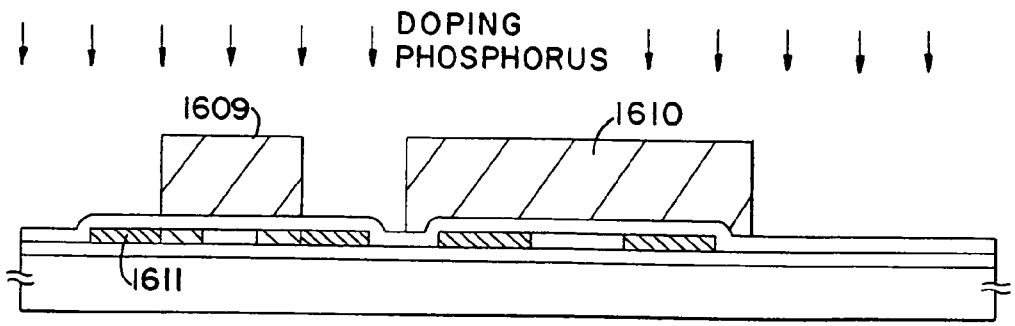

Thus, the first impurity region 1611 and the LDD region are defined by the photoresist mask 1609 (FIG. 21D).

Figure 21E:
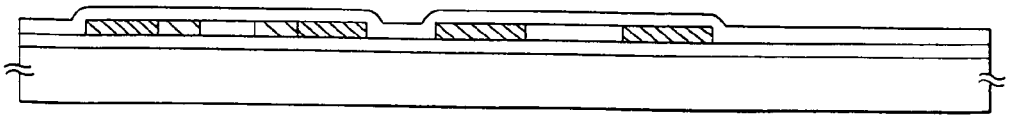

Next, the photoresist masks 1609 and 1610 are removed to perform the activation (FIG. 21E). Since no gate electrode exists at this stage, it is unnecessary to consider the diffusion which may come from the material making the gate electrode, as having raised a problem in the related art. Thus, it is effective to perform the activation by the heat treatment at this stage, that is, prior to the gate electrode forming step.

The subsequent steps may form the gate electrode, the interlayer insulating film, the contact hole, the upper line and so on may be carried out according to the TFT manufacturing method of Embodiment 1 or the related art.

Here, the construction of this embodiment can be freely combined with any of the constructions of Embodiment 1 through 12.

Embodiment 16

In this embodiment, FIGS. 22A to 22E show an example in which the order of adding an impurity for giving the n type and an impurity for giving the p type are different from that of Embodiment 15. Here, the basic construction follows that of Embodiment 15, and the description will be made noting only the differences.

This embodiment is identical to Embodiment 15 till the doping step shown in FIG. 21B. FIG. 22A corresponds to FIG. 21A whereas FIG. 22B corresponds to FIG. 21B, and the same reference numerals are employed.

After the state of FIG. 22B was established according to Embodiment 15, the resist masks 1601 and 1602 are removed. Next, the photoresist film is patterned to form a photoresist mask 1701 to cover the region for forming the p channel TFT and a photoresist mask 1702 to cover a portion of the n channel TFT. By using the photoresist mask 1702 as the mask, the semiconductor film 201 is doped with an impurity for giving the n type. A first impurity region 1703 thus formed provides the source region or drain region of a later-described n channel TFT. The concentration of phosphorus in this region is set to $5 \times 10^{20}$ atoms/cm$^3$ in this embodiment (FIG. 22C).

Next, the resist masks 1701 and 1702 are removed. Then, the photoresist film is patterned to form a photoresist mask 1704 to cover the region for forming the p channel TFT and a photoresist mask 1705 to cover a portion of the n channel TFT, and the semiconductor layer is doped secondly with an impurity for giving the n type by using the photoresist masks 1704 and 1705 as the mask. In this embodiment, phosphorus is used as the impurity for giving the n type, and the semiconductor 201 is doped with the impurity through the gate insulating film by the ion-doping method using phosphine (PH$_3$). An impurity region 1706 thus formed provides an LDD region of a later-described n-channel TFT. The concentration of phosphorus in this region is set to $1 \times 10^{18}$ atoms/cm$^3$ in this embodiment. Here, the region just below the resist mask 1704 is not doped with boron to define a channel forming region 1707 of the n-channel TFT (FIG. 22D).

Next, the photoresist masks 1704 and 1705 are removed to perform the activation (FIG. 22E). Since no gate electrode exists at this stage, it is unnecessary to consider the diffusion which may come from the material making the gate electrode, as having raised a problem in the related art. Thus, it is effective to perform the activation by the heat treatment at this stage, that is, prior to the gate electrode forming step.

The subsequent steps to form the gate electrode, the interlayer insulating film, the contact hole, the upper line and so on may be carried out according to the TFT manufacturing method of Embodiment 1 or the prior art.

Here, the construction of this embodiment can be freely combined with any of the constructions of Embodiments 1 through 12.

Embodiment 17

This embodiment will be described on an example in which the invention is practiced to manufacture an EL (Electro Luminescence) display device.

Figure 25A:
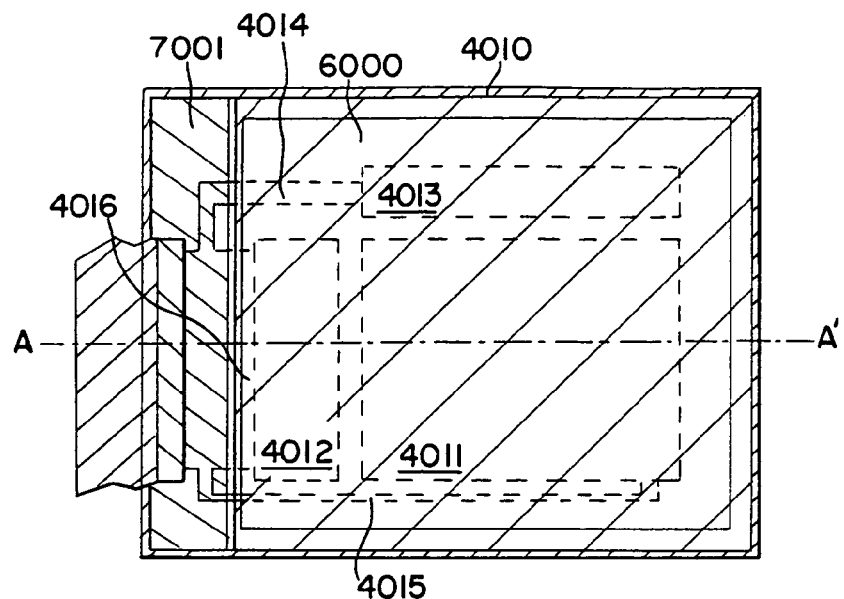
FIGS. 25A and 25B are a top plan view and a sectional view of an EL display device.

FIG. 25A is a top plan view of the EL display device according to the invention. In FIG. 25A: reference numeral 4010 designates a substrate; numeral 4011 a pixel portion; numeral 4012 a source side drive circuit; and numeral 4013 a gate side drive circuit, and these individual drive circuits are led through wiring lines 4014, 4015 and 4016 to an FPC 4017 and connected with external devices.

In this case at this time, a cover member 6000, a sealing member (or housing member) 7000 and a sealing member (or second sealing member) 7001 are provided so as surround at least the pixel portion, preferably the drive circuit and the pixel portion.

Figure 25B:
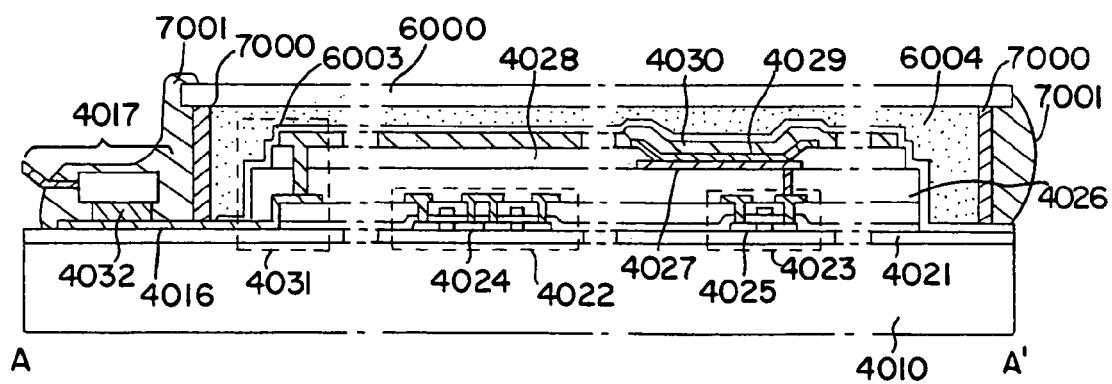

On the other hand, FIG. 25B presents a sectional structure of the EL display device of this embodiment, and there are formed over a substrate 4010 and a surface film 4021 a drive circuit TFT (although here is shown a CMOS circuit in which the n channel TFT and the p channel TFT are combined) 4022 and a pixel portion TFT (although here is shown only a TFT for controlling an electric current to the EL element) 4023. These TFTs may adopt the well-known structure (e.g., the top gate structure or the bottom gate structure).

The invention can be applied to the drive circuit TFT 4022 and the pixel portion TFT 4023.

When the drive circuit TFT 4022 and the pixel portion TFT 4023 are completed according to the invention, there is formed over a layer insulating film (or a flattened film) 4026 of a resin material a pixel electrode 4027 which is made of a transparent conductive film to be electrically connected with the drain of the pixel portion TFT 4023. When the pixel electrode 4027 is the transparent conductive film, the pixel portion TFT is preferably made of a p channel TFT. The transparent conductive film can be made of a compound of indium oxide and tin oxide or a compound of indium oxide and zinc oxide (as will be called the "ITO"). When the pixel electrode 4027 is formed, an insulating film 4028 is formed, and an opening is formed over the pixel electrode 4027.

Next, an EL layer 4029 is formed. This EL layer 4029 may be formed into a single-layer structure or a laminated structure by combining the well-known EL materials (such as a hole injection layer, a hole transport layer, a luminescence layer, an electron transport layer or an electron injection layer) freely. What structure is to be adopted may fall within the well-known technique. On the other hand, the EL materials are divided into low-molecular materials and high-molecular (or polymer) materials. When a low-molecular material is used, the evaporation method is used. When the high-molecular material is used, however, it is possible to use a simple method such as a spin-coating method, the printing method or the ion jet method.

In this embodiment, the EL layer is formed by the evaporation method using a shadow mask. A color display can be made by forming a luminescent layer (e.g., a red luminescent layer, a green luminescent layer and a blue luminescent layer), as can emit optical rays of different wavelengths for the individual pixels, by using the shadow mask. It is also possible to use any of other methods such as a combined method a color conversion layer (CCM) and a color filter, or a combined of method a white luminescent layer and a color filter. Of course, the EL display device can be of the monochromatic emission type.

When the EL layer 4029 is formed, a cathode 4030 is formed thereover. It is desirable to exclude the moisture or oxygen existing in the boundary between the cathode 4030 and the EL layer 4029 as much as possible. Therefore, devices are required for filming the EL layer 4029 and the cathode 4030 continuously in the vacuum or for forming the EL layer 4029 in an inert atmosphere and the cathode 4030 without release to the atmosphere. In this embodiment, the aforementioned filming can be achieved by using a filming device of the multi-chamber type (or the cluster tool type).

Here in this embodiment, the cathode 4030 is exemplified by a laminated structure of a LiF (lithium fluoride) film and an Al (aluminum) film. Specifically, the LiF (lithium fluoride) film having a thickness of 1 nm is formed over the EL layer 4029 by the evaporation method, and the aluminum film having a thickness of 300 nm is formed thereover. Of course, an MgAg electrode, the well-known electrode material, may be used. Moreover, the cathode 4030 is connected with the wiring line 4016 in the region, as indicated by 4031. The wiring line 4016 is a power supply line for supplying a predetermined voltage to the cathode 4030 and is connected with the FPC 4017 through a conductive paste material 4032.

In order to connect the cathode 4030 and the wiring line 4016 electrically in the region indicated by 4031, it is necessary to form a contact hole in the layer insulating film 4026 and the insulating film 4028. This contact hole may be formed during the etching of the interlayer insulating film 4026 (during forming the contact hole for the pixel electrode) and at the etching time of the insulating film 4028 (during forming the opening before the EL layer is formed). On the other hand, the etching of the insulating film 4028 may be extended to the layer insulating film 4026. In this case, if the layer insulating film 4026 and the insulating film 4028 are made of the same resin material, it is possible to improve the shape of the contact hole.

The surface of the EL element thus formed is covered with a passivation film 6003, a filler 6004 and a cover member 6000.

Moreover, a sealing member is so disposed inside of the cover member 7000 and the substrate 4010 as to enclose the EL element portion, and the sealing member (or the second sealing member) 7001 is formed outside of the sealing member 7000.

At this time, the filler 6004 also functions as an adhesive for adhering the cover member 6000. The filler 6004 can be exemplified by PVC (PolyVinyl Chloride), an epoxy resin, a silicone resin, PVB (PolyVinyl Butyral) or EVA (EthyleneVinyl Acetate). If a desiccating agent is disposed in the filler 6004, it can preferably retain the hygroscopic effect.

On the other hand, a spacer may also be contained in the filler 6004. At this time, the spacer may be made of a granular substance of BaO or the like to have the hygroscopic property by itself.

With the spacer, the passivation film 6003 can damp the spacer pressure. Independently of the passivation film, on the other hand, there may be provided a resin film for damping the spacer pressure.

On the other hand, the cover member 6000 can be exemplified by a glass sheet, an aluminum sheet, a stainless steel sheet, an FRP (Fiberglass-Reinforced Plastics) sheet, a PVF (PolyVinyl Fluoride) film, a miler film, a polyester film or an acryl film. When the PVB or EVA is used as the filler 6004, it is preferable to use a sheet having a structure in which an aluminum foil of several tens μm is sandwiched between the PVF films or the miler films.

Depending upon the direction of emission (or the direction of irradiation) from the EL element, however, the cover member 6000 has to be transparent.

On the other hand, the wiring line 4016 is electrically connected with the FPC 4017 through the clearance between the sealing member 7000 and the sealing member 7001 and the substrate 4010. Although the wiring line 4016 has been described herein, the other wiring lines 4014 and 4015 are also electrically connected with the FPC 4017 below the sealing member 7000 and the sealing member 7001 in the same manner.

Embodiment 18

This embodiment will be described with reference to FIGS. 26A and 26B on an example in which an EL display device in a mode different from that of Embodiment 17 is manufactured according to the invention. The portions having the same reference numerals as those of FIGS. 25A and 25B will not be described because they indicate the same portions.

Figure 26A:
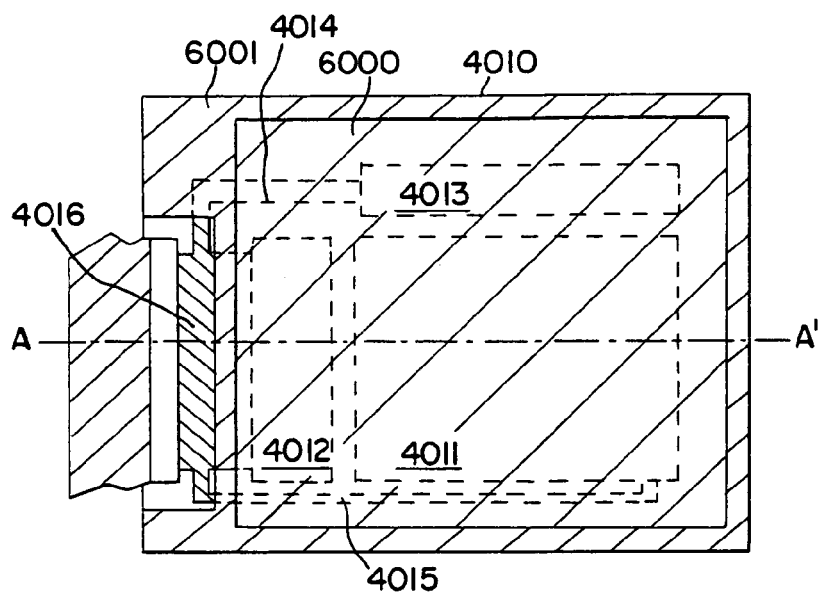
FIGS. 26A and 26B are a top plan view and a sectional view of an EL display device.
Figure 26B:
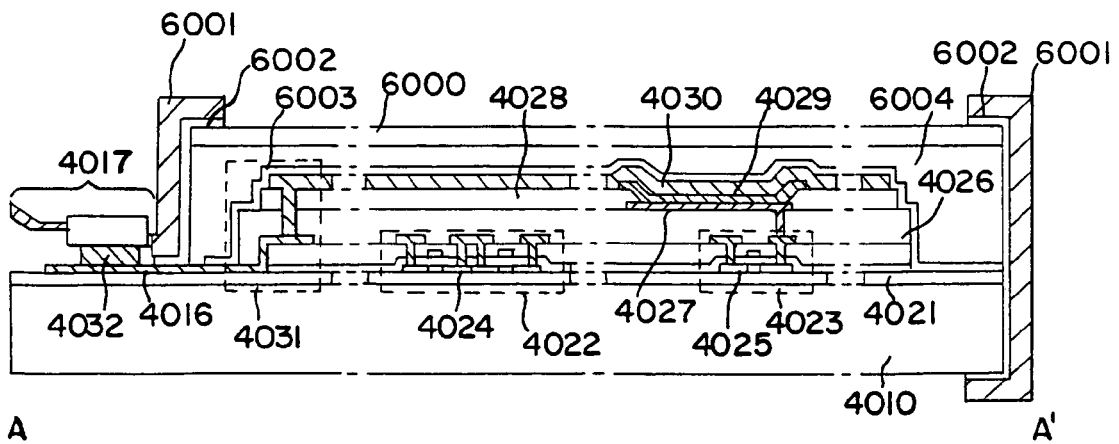

FIG. 26A is a top plan view of the EL display device of this embodiment, and FIG. 26B is a section taken along line A-A' of FIG. 26A.

According to Embodiment 17, the process is proceeded till the forming of the passivation film 6003 is to cover the surface of the EL element.

Then, the filler 6004 is formed to cover the EL element. This filler 6004 also functions as an adhesive for adhering the cover member 6000. The filler 6004 can be exemplified by PVC (PolyVinyl Chloride), an epoxy resin, a silicone resin, PVB (PolyVinyl Butyral) or EVA (EthyleneVinyl Acetate). If a desiccating agent is disposed in the filler 6004, it can preferably retain the hygroscopic effect.

On the other hand, a spacer may also be contained in the filler 6004. At this time, the spacer may be made of a granular substance of BaO or the like to have the hygroscopic property by itself.

With the spacer, the passivation film 6003 can damp the spacer pressure. Independently of the passivation film, on the other hand, there may be provided a resin film for damping the spacer pressure.

On the other hand, the cover member 6000 can be exemplified by a glass sheet, an aluminum sheet, a stainless steel sheet, an FRP (Fiberglass-Reinforced Plastics) sheet, a PVF (PolyVinyl Fluoride) film, a miler film, a polyester film or an acryl film. When the PVB or EVA is used as the filler 6004, it is preferable to use a sheet having a structure in which an aluminum foil of several tens microns is sandwiched between the PVF films or the miler films.

Depending upon the direction of emission (or the direction of irradiation) from the EL element, however, the cover member 6000 has to be transparent.

Next, the cover member 6000 is adhered with the filler 6004, and a frame member 6001 is then attached to cover the side face (or the exposed face) of the filler 6004. The frame member 6001 is adhered by a sealing member (functions as an adhesive) 6002. At this time, the sealing member 6002 is preferably exemplified by a photo-setting resin, but may be a thermoset resin if the heat resistance of the EL layer allows. Here, the sealing member 6002 is desirably made of a material as impermeable to moisture or hydrogen as possible. On the other hand, a desiccating agent may be added to the inside of the sealing member 6002.

On the other hand, the wiring line 4016 is electrically connected with the FPC 4017 through the clearance between the sealing member 6002 and the substrate 4010. Although the wiring line 4016 has been described herein, the other wiring lines 4014 and 4015 are also electrically connected with the FPC 4017 below the sealing member 6002 in the same manner.

Embodiment 19

Figure 27:
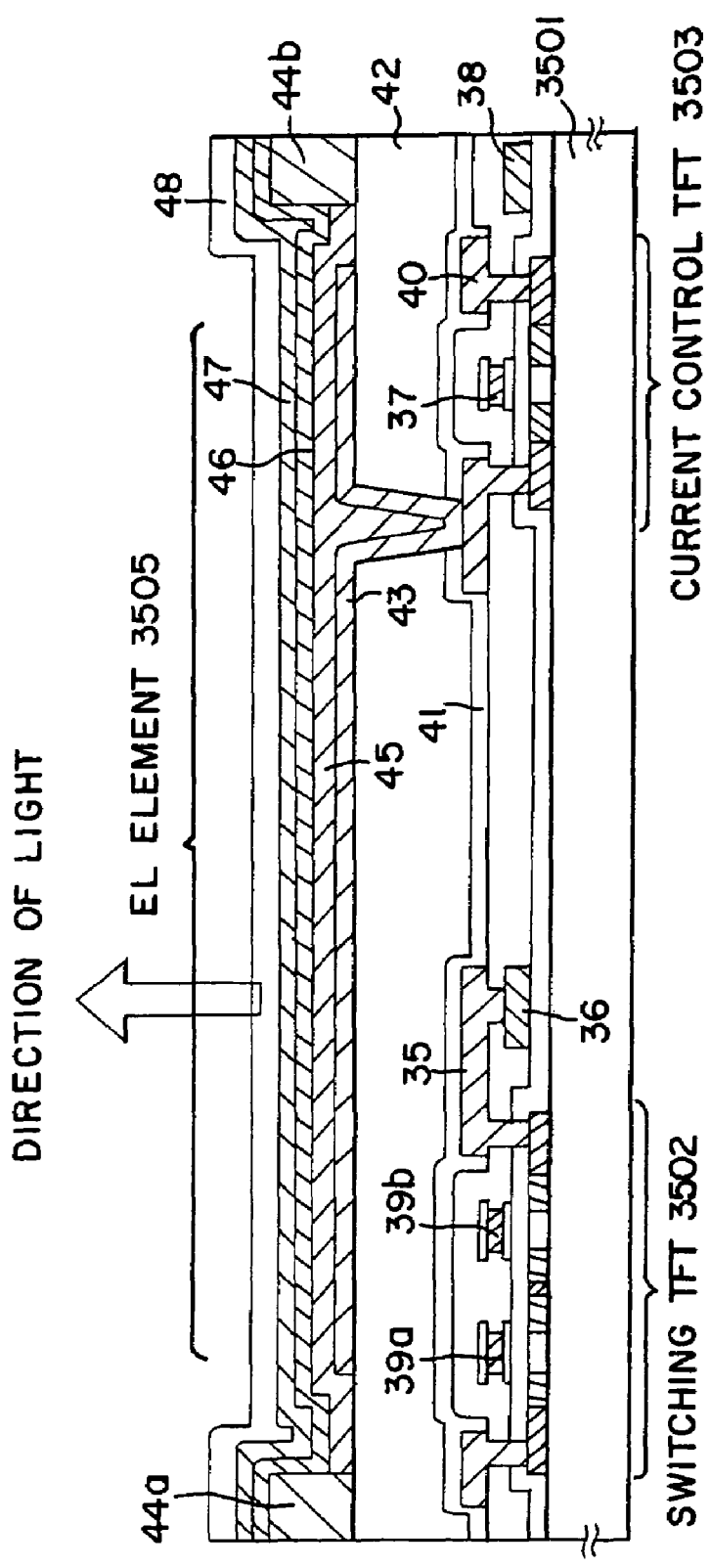
FIG. 27 is a sectional view of a pixel portion of the EL display device.
Figure 28A:
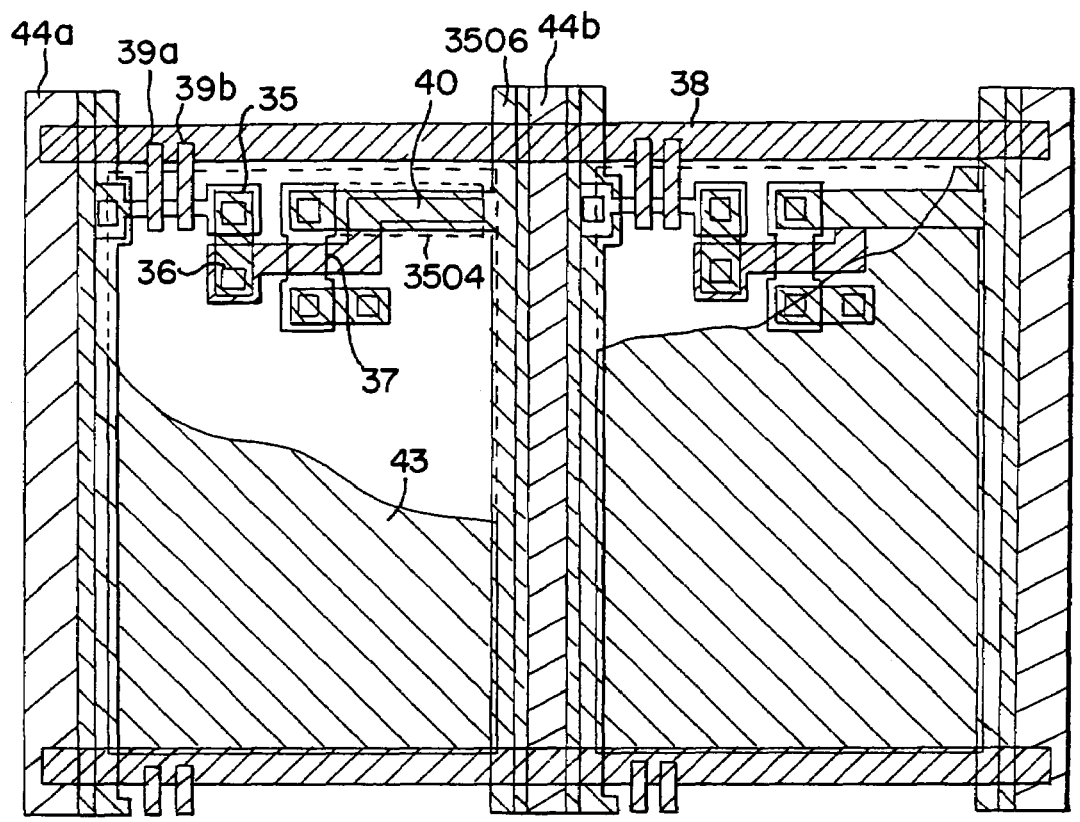
FIGS. 28A and 28B are a top plan view and a circuit diagram of the pixel portion of the EL display device.
Figure 28B:
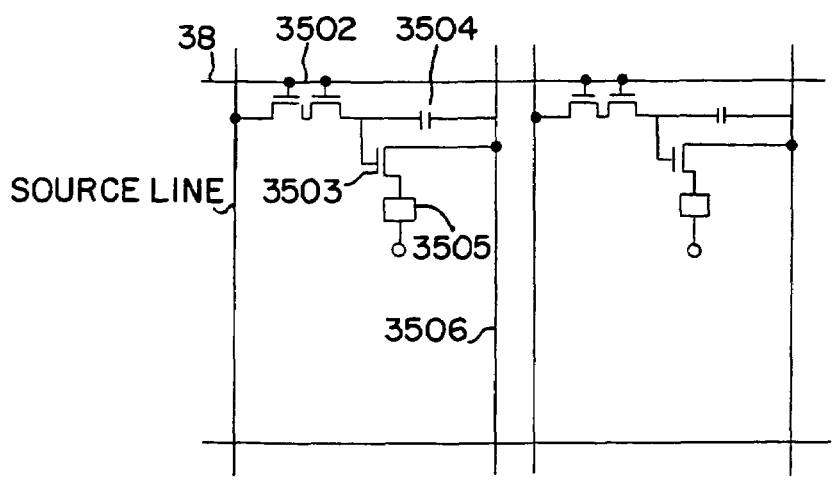

In this embodiment: a more detailed sectional structure of the pixel portion of the EL display device is shown in FIG. 27; an upper face structure is shown in FIG. 28A; and a circuit diagram is shown in FIG. 28B. FIG. 27, FIG. 28A and FIG. 28B share the reference numerals and may be referred to one another.

In FIG. 27, a switching TFT 3502, as formed over a substrate 3501, is formed of the n channel TFT of the invention (see Embodiments 1 through 9 and 13 through 16). This embodiment is given the double-gate structure, the description of which will be omitted because there is no substantial difference in the structure and the manufacture process. However, the double-gate structure provides a structure in which two TFTs are substantially connected in series, and takes an advantage that it can reduce the OFF current value. Here in this embodiment, the structure has the double gates but may have a single gate or multiple gates, e.g., triple or more gates. On the other hand, the structure may be formed by using the p channel TFT of the invention.

On the other hand, a current control TFT 3503 is formed of the n channel TFTs of the invention. At this time, a drain line 35 of the switching TFT 3502 is electrically connected through a wiring line 36 with a gate electrode 37 of the current control TFT. On the other hand, a wiring line 38 is a gate line for connecting gate electrodes 39a and 39b of the switching TFT 3502 electrically.

In this case at this time, it has a very important meaning that the current control TFT 3503 has the structure of the invention. The current control TFT is an element for controlling the current flow through the EL element so that it is highly susceptible to deterioration by the heat or the hot carriers. Against this danger, therefore, the structure of the invention is remarkably effective, in which the LDD region is so formed on the drain side of the current control TFT as to overlap the gate electrode through the gate insulating film.

Although the current control TFT 3503 is shown in this embodiment to have the single-gate structure, on the other hand, there may be adopted the multi-gate structure in which a plurality of TFTs are connected in series. The structure may be further modified such that the plural TFTs are connected in parallel to divide the channel forming region substantially into a plurality thereby to effect the radiation of heat in a high efficiency. This structure is effective for preventing the degradation due to heat.

As shown in FIG. 28A, on the other hand, the wiring line for providing the gate electrode 37 of the current control TFT 3503 is a region, as designated by 3504, and overlaps the drain line 40 of the current control TFT 3503 through the insulating film. At this time, a capacitor is established in the region 3504. This capacitor 3504 functions to hold a voltage to be applied to the gate of the current control TFT 3503. Here, the drain line 40 is connected with a current supply line (or a power source line) 3506 so that it is always fed with a constant voltage.

Over the switching TFT 3502 and the current control TFT 3503, there is formed a first passivation film 41, which is overlaid by a flattening film 42 made of an insulating resin film. It is very important to flatten the step difference of the TFTs by using the flattening film 42. Since the EL layer to be formed layer is extremely thin, an emission failure may occur because of presence of the step. Therefore, the EL layer is desirably flattened, before the pixel electrode is formed, so that it may be made as flat as possible.

On the other hand, numeral 43 designates a pixel electrode (or the cathode of an EL element) which is made of a highly reflective conductive film and electrically connected with the drain of the current control TFT 3503. In this case, an n channel TFT is preferably used as the current control TFT. The pixel electrode 43 is preferably made of a low-resistance conductive film such as an aluminum alloy film, a copper alloy film or a silver alloy film, or their laminated film. Of course, the pixel electrode may have a laminated structure of another conductive film.

On the other hand, a light emitting layer 45 is formed in a channel (corresponding to the pixel) which is formed of banks 44a and 44b made of an insulating film (preferably a resin). Although only one pixel is shown, there may be separately formed light emitting layers corresponding to individual colors of R (red), G (green) and B (blue). An organic EL material for the light emitting layer is exemplified by a π conjugate polymer material. A representative polymer material is exemplified by Poly-Para phenylene Vinylidene (PPV), Poly-Vinyl Carbasole (PVK) or polyfluorene.

Various kind of PPV organic EL materials are available but may be selected from those which are described on, for example, pp. 33 to 37, Euro Display, Proceedings 1999, entitled by "Polymers for Light Emitting Diodes" and edited by H. Shenk, H. Becker, O. Gelsen, E. Kiuge, W. Kreuder, and H. Spreitzer or in Unexamined Published Japanese Patent Application 10-92576.

For the specific light emitting layers: the red light emitting layer may be made of cyano-poly phenylene vinylene; the green light emitting layer may be made of poly-phenylene vinylene; and the blue light emitting layer may be made of poly-phenylene vinylene or poly-alkyl phenylene. The film thickness may be 30 to 150 nm (preferably 40 to 100 nm).

Here, the examples thus enumerated present only organic EL materials to be used for the light emitting layers, but the invention should not be limited to them. The light emitting layer and the charge transfer layer or the charge injection layer may be freely combined to form the EL layer (i.e., the layer for light emissions and for carrier migrations therefor).

For example, this embodiment is exemplified by using the polymer material for the light emitting layer, but a low-molecule organic EL material may be employed. On the other hand, the charge transfer layer or the charge injection layer can be made of an inorganic material such as silicon carbide. These organic EL and inorganic materials can be well-known in the art.

In this embodiment, there is formed an EL layer of the laminated structure in which a hole injection layer 46 made of PEDOT (poly-thiophene) or PAni (poly-aniline) is formed over the light emitting layer 45. Over the hole injection layer 46, moreover, there is formed an anode 47 which is made of a transparent conductive film. In the case of this embodiment, the light produced by the light emitting layer 45 is emitted toward the upper face (i.e., upward of the TFT) so that the anode has to be made transparent. The transparent conductive film can be made of a compound of indium oxide and tin oxide or a compound of indium oxide and zinc oxide. Since the transparent conductive film is formed after the light emitting layer or the hole injection layer of a lower heat resistance was formed, however, it can preferably be formed at a temperature as low as possible.

At the instant when the anode 47 is formed, an EL element 3505 is completed. The EL element 3505, as termed herein, indicates a capacitor which is formed of the pixel electrode (or cathode) 43, the light emitting layer 45, the hole injection layer 46 and the anode 47. Since the pixel electrode 43 has an area substantially equal to that of the pixel, as shown in FIG. 28A, the entire pixel functions as the EL element. Therefore, the light utilizing efficiency is so high that the image display can be bright.

Here in this embodiment, there is formed over the anode 47 a second passivation film 48. This second passivation film 48 is preferably formed of a silicon nitride film or a silicon nitride-oxide film. This is intended to block the EL element from the outside thereby both to prevent the degradation of the organic EL material due to oxidization and to suppress the degassing from the organic EL material. Thus, the reliability of the EL display device is enhanced.

As described hereinbefore, the EL display panel of the invention includes a pixel portion composed of pixels of the structure, as shown in FIG. 27, the switching TFT having a sufficiently low OFF current value, and the current control TFT strong against the hot carrier injection. It is, therefore, possible to provide an EL display panel which can have a high reliability and an excellent image display.

Here, the construction of this embodiment can be practiced in free combination with the constructions of Embodiments 1 through 9 and 13 through 16. On the other hand, it is effective to use the EL display panel of this embodiment as the display portion of the electronic device of Embodiment 12.

Embodiment 20

This embodiment will be described on the structure in which the structure of the EL element 3505 is inverted at the pixel portion described in Embodiment 18. For this description, reference is made to FIG. 29. Here, what is different from the structure of FIG. 27 is the portion of the EL element and the current control TFT, and the description of the remaining portions will be omitted.

Figure 29:
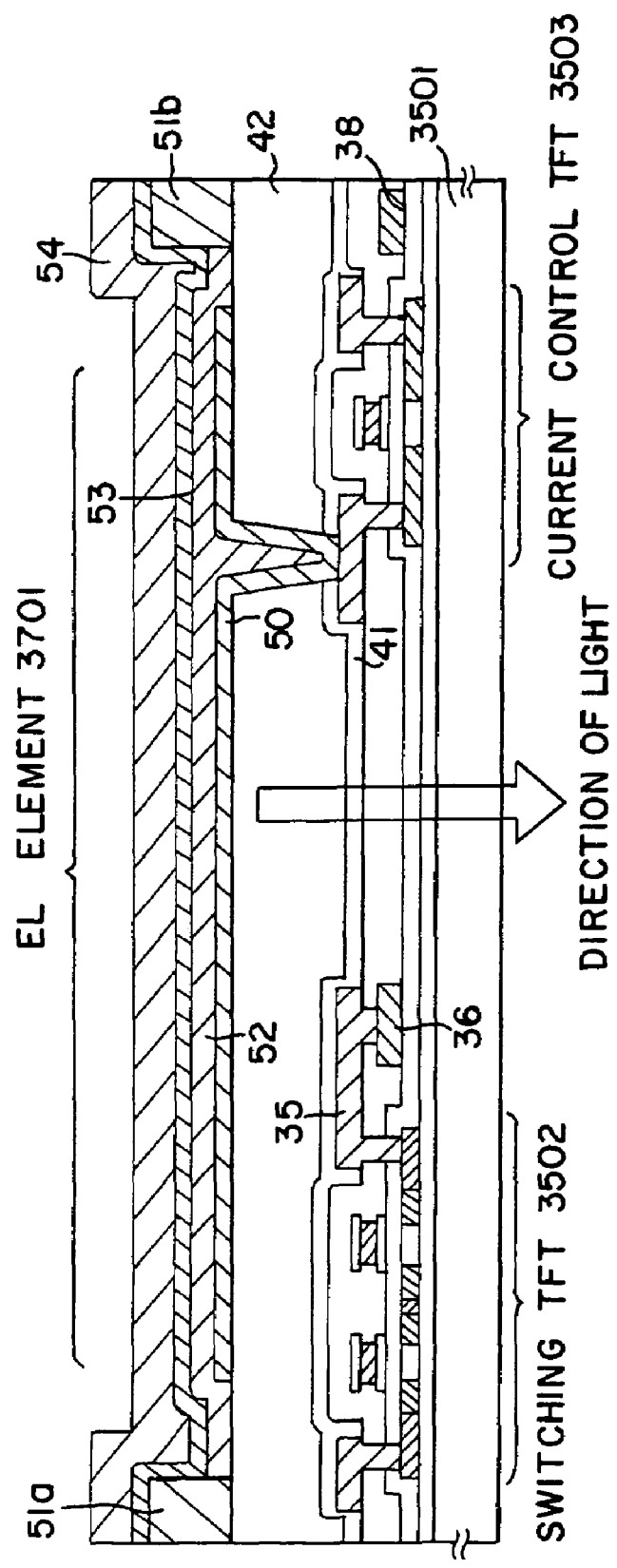
FIG. 29 is a sectional view of the pixel portion of the EL display device.

In FIG. 29, the current control TFT 3503 is manufactured by using the p channel TFT of the invention. The manufacture process may be referred to Embodiments 1 through 9 and 13 through 16.

In this embodiment, a pixel electrode (or anode) 50 is made of a transparent conductive film. Specifically, the transparent conductive film is made of a compound of indium oxide and zinc oxide. Of course, the conductive film may be a compound of indium oxide and tin oxide.

After banks 51a and 51b were formed of an insulating film, moreover, a light emitting layer 52 is formed of poly-vinyl carbasole by applying a solution. Over this light emitting layer 52, there are formed an electron injection layer 53 of potassium acetyl acetate (as expressed by acacK) and a cathode 54 of an aluminum alloy. In this case, the cathode 54 also functions as the passivation film. Thus, an EL element 3701 is formed.

In the case of this embodiment, the light, as produced in the light emitting layer 52, is emitted, as indicated by arrow, toward the substrate over which the TFT is formed.

Here, the construction of this embodiment can be practiced in free combination with the constructions of Embodiments 1 through 9 and 13 through 16. On the other hand, it is effective that the EL display panel of this embodiment is used as the display unit of the electronic device of Embodiment 12.

Embodiment 21

Figure 30A:
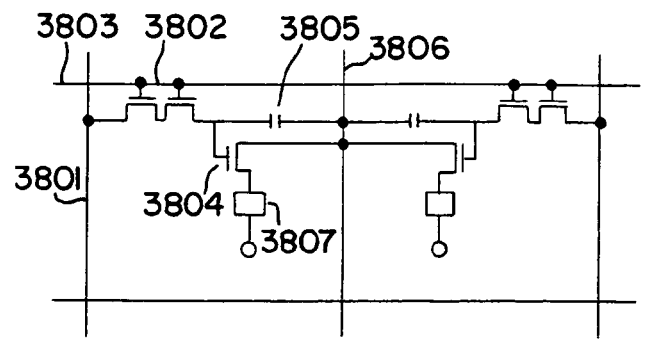
FIGS. 30A to 30C are circuit diagrams of the pixel portion of the EL display device.
Figure 30B:
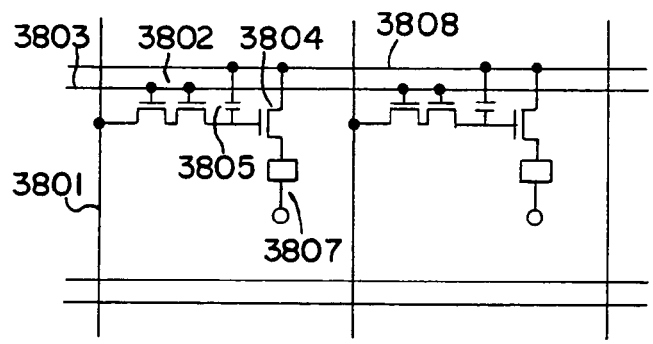
Figure 30C:
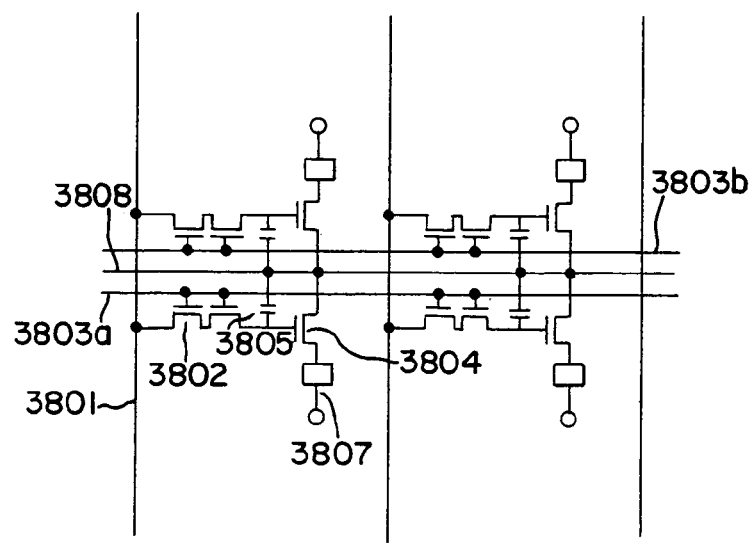

In this embodiment, FIGS. 30A, 30B and 30C show an example in which the pixel has a construction different from that of the circuit diagram shown in FIG. 28B. Here in this embodiment: reference numeral 3801 designates the source line of a switching TFT 3802; numeral 3803 the gate line of the switching TFT 3802; numeral 3804 a current control TFT; numeral 3805 a capacitor; numerals 3806 and 3808 current supply lines; and numeral 3807 an EL element.

FIG. 30A shows an example of the case in which the current supply line 3806 is shared between two pixels. Specifically, this embodiment is characterized in that the two pixels are formed linearly symmetrically with respect to the current supply line 3806. In this case, the number of power supply lines can be reduced so that the pixel portion can be made finer.

On the other hand, FIG. 30B shows an example of the case in which the current supply line 3808 is disposed in parallel with the gate line 3803. Here in FIG. 30B, the structure is made such that the current supply line 3808 and the gate line 3803 do not overlap. If these two lines are formed in different layers, they can be formed to overlap each other through an insulating film. In this case, the power supply line 3808 and the gate line 3803 can share the occupied area so that the pixel portion can be made further finer.

On the other hand, the structure of FIG. 30C is characterized in that the current supply line 3808 is arranged in parallel with the gate lines 3803a and 3803b, as in the structure of FIG. 30B, and in that two pixels are formed linearly symmetrically with respect to the current supply line 3808. It is also effective that the current supply line 3808 is provided to overlap either one of the gate lines 3803a and 3803b. In this case, the number of the power supply lines can be reduced to make the pixel portion further finer.

Here, the construction of this embodiment can be practiced in free combination with the constructions of Embodiments 1 through 9, 13 through 16, 17 and 18. On the other hand, it is effective that the EL display panel having the pixel structure of this embodiment is used as the display portion of the electronic device of Embodiment 12.

Embodiment 22

In FIGS. 28A and 28B exemplifying Embodiment 19, there is provided the structure in which the capacitor 3504 is provided for holding the voltage to be applied to the gate of the current control TFT 3503, but the capacitor 3504 can be omitted. In the case of Embodiment 19, the current control TFT 3503 is exemplified by the n channel TFT of the invention, as in Embodiments 1 through 9 and 13 through 16, so that it has the LDD region overlapping the gate electrode through the gate insulating film. In this overlapping region, there is formed a parasitic capacity which is generally called the "gate capacity". This embodiment is characterized in that the parasitic capacity is positively employed in place of the capacitor 3504.

The capacitance of the parasitic capacity changes with the area in which the gate electrode and the LDD region overlap, so that it is determined by the length of the LDD region contained in the overlapping region.

As in the structures of FIGS. 30A, 30B and 30C of Embodiment 21, on the other hand, the capacity 3805 can be omitted.

Here, the construction of this embodiment can be practiced in free combination with the constructions of Embodiments 1 through 9, 13 through 16 and 17 through 21. On the other hand, it is effective that the EL display panel having the pixel structure of this embodiment is used as the display portion of the electronic device of Embodiment 12.

By the structural improvement of the semiconductor device, as has been described hereinbefore, it is an effect of the invention that an excellent ohmic contact can be easily realized between the wiring lines without using any special etchant such as the chromium-mixed acid.

On the other hand, the invention is characterized in that the wiring line is constructed of the laminated structure of a refractory metal (or valve metal), a metal of a low resistivity and a refractory metal (or valve metal), and in that the wiring line is protected with the anodized film. As a result, it is possible to form a wiring line of a low resistance and a high heat resistance, and to make a contact with the upper wiring line easily.

By adopting the invention, on the other hand, the wiring line of the low resistance and the high heat resistance can be manufactured to make the active matrix type display device larger and finer.

By adopting the invention, on the other hand, it is possible to enhance the reliability of the n channel TFT to be used in all semiconductor devices. As a result, it is possible to enhance the reliabilities of the semiconductor device including the CMOS circuit constructed of TFTs, more specifically, the pixel matrix circuit of the liquid crystal display device and the drive circuit disposed in the periphery of the former. Furthermore, there are also improved the reliability of the semiconductor circuit including the n channel TFTs therein and the electronic device having the liquid crystal display device incorporated thereinto.

What is claimed is:

1. A portable telephone comprising:
a voice output unit:
a voice input unit; and
a display unit,
wherein the display unit comprises:
a semiconductor film formed over a substrate, the semiconductor film having a channel region, a source region and a drain region;
a gate insulating film over the semiconductor film; and
a gate electrode formed over the gate insulating film, the gate electrode having a multi-layered film comprising a first conductive layer, a second conductive layer on the first conductive layer, and a third conductive layer on the second conductive layer,
wherein a width of the second conductive layer is smaller than those of the first and third conductive layers.

2. A portable telephone according to claim 1, wherein the third conductive layer comprises a valve metal.

3. A portable telephone according to claim 1, wherein the second conductive layer comprises a material containing aluminum or titanium as its main component.

4. A portable telephone according to claim 1, wherein the second conductive layer is in contact with the first conductive layer and the third conductive layer is in contact with the second conductive layer.

5. A portable book comprising:
a display unit; and
a control switch,
wherein the display unit comprises:
a semiconductor film formed over a substrate, the semiconductor film having a channel region, a source region and a drain region;
a gate insulating film over the semiconductor film; and
a gate electrode formed over the gate insulating film, the gate electrode having a multi-layered film comprising a first conductive layer, a second conductive layer on the first conductive layer, and a third conductive layer on the second conductive layer,
wherein a width of the second conductive layer is smaller than those of the first and third conductive layers.

6. A portable book according to claim 5, wherein the third conductive layer comprises a valve metal.

7. A portable book according to claim 5, wherein the second conductive layer comprises a material containing aluminum or titanium as its main component.

8. A portable book according to claim 5, wherein the second conductive layer is in contact with the first conductive layer and the third conductive layer is in contact with the second conductive layer.

9. A display device comprising:
a display unit, wherein the display unit comprises:
a semiconductor film formed over a substrate, the semiconductor film having a channel region, a source region and a drain region;
a gate insulating film over the semiconductor film; and
a gate electrode formed over the gate insulating film, the gate electrode having a multi-layered film comprising a first conductive layer, a second conductive layer on the first conductive layer, and a third conductive layer on the second conductive layer, wherein a width of the second conductive layer is smaller than those of the first and third conductive layers.

10. A display device according to claim 9, wherein the third conductive layer comprises a valve metal.

11. A display device according to claim 9, wherein the second conductive layer comprises a material containing aluminum or titanium as its main component.

12. A display device according to claim 9, wherein the second conductive layer is in contact with the first conductive layer and the third conductive layer is in contact with the second conductive layer.

13. A portable telephone comprising:
a voice output unit:
a voice input unit; and
a display unit,
wherein the display unit comprises:
a first wiring line including a multi-layered film comprising a first conductive layer, a second conductive layer on the first conductive layer and a third conductive layer on the second conductive layer;
an insulating film covering the first wiring line;
a second wiring line formed over the insulating him and electrically connected with the first wiring line; and
a contact hole extending through the insulating film and the third conductive layer,
wherein an upper surface of the second conductive layer is exposed at a bottom portion of the contact hole, and
wherein the second wiring line is connected with the upper surface of second conductive layer though the contact hole.

14. A portable telephone according to claim 13, wherein the third conductive layer comprises a valve metal.

15. A portable telephone according to claim 13, wherein the second conductive layer comprises a material containing aluminum or titanium as its main component.

16. A portable telephone according to claim 13, wherein the wiring line is a gate line of a thin film transistor.

17. A portable telephone according to claim 13, wherein the second conductive layer is in contact with the first conductive layer and the third conductive layer is in contact with the second conductive layer.

18. A portable telephone comprising:
a voice output unit:
a voice input unit; and
a display unit,
wherein the display unit comprises:
a first wiring line including a multi-layered film comprising a first conductive layer, a second conductive layer on the first conductive layer and a third conductive layer on the second conductive layer;
an oxide film of The first, second and third conductive layers covering side surfaces and an upper surface of The first wiring line;
an insulating film covering the oxide film;
a second wiring line formed over the insulating film and electrically connected with the first wiring line; and
a contact hole extending through the insulating film, the third conductive layer and the oxide film,
wherein an upper surface of the second conductive layer is exposed at a bottom portion of the contact hole, and
wherein the second wiring line is connected with the upper surface of second conductive layer through the contact hole.

19. A portable telephone according to claim 18, wherein the oxide film of the second conductive layer is formed by anodizing.

20. A portable telephone according to claim 18, wherein the third conductive layer comprises a valve metal.

21. A portable telephone according to claim 18, wherein the second conductive layer comprises a material containing aluminum or titanium as its main component.

22. A portable telephone according to claim 18, wherein the wiring line is a gate line of a thin film transistor.

23. A portable telephone according to claim 18, wherein the second conductive layer is in contact with the first conductive layer and the third conductive layer is in contact with the second conductive layer.

24. A portable telephone comprising:
a voice output unit:
a voice input unit; and
a display unit,
wherein the display unit comprises:
a first wiring line including a multi-layered film comprising a first conductive layer, a second conductive layer on the first conductive layer and a third conductive layer on the second conductive layer;
an insulating film formed over the first wiring line;
a second wiring line formed over the insulating film and electrically connected with the first wiring line; and
a contact hole extending through the insulating film and the third conductive layer,
wherein an upper surface of the second conductive layer is exposed at a bottom portion of the contact hole,
wherein the second wiring line is connected with the upper surface of second conductive layer though the contact hole,
wherein an oxide film is formed on side surfaces of the second conductive layer, and
wherein the second conductive layer has a width different from those of the first conductive layer and the third conductive layer.

25. A portable telephone according to claim 24, wherein the second conductive layer comprises a material containing aluminum or titanium as its main component.

26. A portable telephone according to claim 24, wherein the third conductive layer comprises a material containing a valve metal as its main component.

27. A portable telephone according to claim 24, wherein the first wiring line is a gate line of a thin film transistor.

28. A portable telephone according to claim 24, wherein the second conductive layer is in contact with the first conductive layer and the third conductive layer is in contact with the second conductive layer.

29. A portable telephone comprising:
a voice output unit:
a voice input unit; and
a display unit,
wherein the display unit comprises:
a p-channel thin film transistor formed over a substrate, the p-channel thin film transistor comprising:
a first semiconductor layer having a first channel region, a first source region, and a first drain region;
a first gate line footed over the first semiconductor layer with a first gate insulating film interposed therebetween, and
an n-channel thin film transistor formed over the substrate, the n-channel thin film transistor comprising:
a second semiconductor layer having a second channel region, a second source region, a second drain region, and at least one impurity region between the second channel region and the second source region;

a second gate line formed over the second semiconductor layer with a second gate insulating film interposed therebetween;

wherein the impurity region partly overlaps the second gate line with the second gate insulating film interposed therebetween, and wherein each of the first and second gate lines includes a multi-layered film comprising a first conductive layer in contact with each of the first and second gate insulating films, a second conductive layer on the first conductive layer and a third conductive layer on the third conductive layer, and wherein the impurity region has a lower impurity concentration than that of the second source region.

30. A portable telephone according to claim 29, wherein the third conductive layer comprises a valve metal.

31. A portable telephone according to claim 29, wherein the second conductive layer comprises a material containing aluminum or titanium as its main component.

32. A portable telephone according to claim 29, wherein the wiring line is a gate line of a thin film transistor.

33. A portable book comprising:
a display unit; and
a control switch,
wherein the display unit comprises:
a first wiring line including a multi-layered film comprising a first conductive layer, a second conductive layer on the first conductive layer and a third conductive layer on the second conductive layer;
an insulating film covering the first wiring line;
a second wiring line formed over the insulating film and electrically connected with the first wiring line; and
a contact hole extending through the insulating film and the third conductive layer,
wherein an upper surface of the second conductive layer is exposed at a bottom portion of the contact hole, and
wherein the second wiring line is connected with the upper surface of second conductive layer through the contact hole.

34. A portable book according to claim 33, wherein the third conductive layer comprises a valve metal.

35. A portable book according to claim 33, wherein the second conductive layer comprises a material containing aluminum or titanium as its main component.

36. A portable book according to claim 33, wherein the wiring line is a gate line of a thin film transistor.

37. A portable book according to claim 33, wherein the second conductive layer is in contact with the first conductive layer and the third conductive layer is in contact with the second conductive layer.

38. A portable book comprising:
a display unit; and
a control switch,
wherein the display unit comprises:
a first wiring line including a multi-layered film comprising a first conductive layer, a second conductive layer on the first conductive layer and a third conductive layer on the second conductive layer;
an oxide film of the first, second and third conductive layers covering side surfaces and an upper surface of the first wiring line;
an insulating film covering the oxide film;
a second wiring line formed over the insulating film and electrically connected with the first wiring line; and
a contact hole extending through the insulating film, the third conductive layer and the oxide film,
wherein an upper surface of the second conductive layer is exposed at a bottom portion of the contact hole, and
wherein the second wiring line is connected with the upper surface of second conductive layer through the contact hole.

39. A portable book according to claim 38, wherein the oxide film of the second conductive layer is formed by anodizing.

40. A portable book according to claim 38, wherein the third conductive layer comprises a valve metal.

41. A portable book according to claim 38, wherein the second conductive layer comprises a material containing aluminum or titanium as its main component.

42. A portable book according to claim 38, wherein the wiring line is a gate line of a thin film transistor.

43. A portable book according to claim 38, wherein the second conductive layer is in contact with the first conductive layer and the third conductive layer is in contact with the second conductive layer.

44. A portable book comprising:
a display unit; and
a control switch,
wherein the display unit comprises:
a first wiring line including a multi-layered film comprising a first conductive layer, a second conductive layer on the first conductive layer and a third conductive layer on the second conductive layer;
an insulating film formed over the first wiring line;
a second wiring line formed over the insulating film and electrically connected with the first wiring line; and
a contact hole extending through the insulating film and the third conductive layer,
wherein an upper surface of the second conductive layer is exposed at a bottom portion of the contact hole,
wherein the second wiring line is connected with the upper surface of second conductive layer through the contact hole,
wherein an oxide film is formed on side surfaces of the second conductive layer, and
wherein the second conductive layer has a width different from those of the first conductive layer and the third conductive layer.

45. A portable book according to claim 44, wherein the second conductive layer comprises a material containing aluminum or titanium as its main component.

46. A portable book according to claim 44, wherein the third conductive layer comprises a material containing a valve metal as its main component.

47. A portable book according to claim 44, wherein the first wiring line is a gate line of a thin film transistor.

48. A portable book according to claim 44, wherein the second conductive layer is in contact with the first conductive layer and the third conductive layer is in contact with the second conductive layer.

49. A portable book comprising:
a display unit; and
a control switch,
wherein the display unit comprises:
a p-channel thin film transistor formed over a substrate, the p-channel thin film transistor comprising:
a first semiconductor layer having a first channel region, a first source region, and a first drain region;
a first gate line formed over the first semiconductor layer with a first gate insulating film interposed therebetween, and
an n-channel thin film transistor formed over the substrate, the n-channel thin film transistor comprising:

a second semiconductor layer having a second channel region, a second source region, a second drain region, and at least one impurity region between the second channel region and the second source region;

a second gate line formed over the second semiconductor layer with a second gate insulating film interposed therebetween;

wherein the impurity region partly overlaps the second gate line with the second gate insulating film interposed therebetween, and wherein each of the first and second gate lines includes a multi-layered film comprising a first conductive layer in contact with each of the first and second gate insulating films, a second conductive layer on the first conductive layer and a third conductive layer on the third conductive layer, and wherein the impurity region has a lower impurity concentration than that of the second source region.

50. A portable book according to claim 49, wherein the third conductive layer comprises a valve metal.

51. A portable book according to claim 49, wherein the second conductive layer comprises a material containing aluminum or titanium as its main component.

52. A portable book according to claim 49, wherein the wiring line is a gate line of a thin film transistor.

53. A display device comprising:
a display unit, wherein the display unit comprises:
a first wiring line including a multi-layered film comprising a first conductive layer, a second conductive layer on the first conductive layer and a third conductive layer on the second conductive layer;
an insulating film covering the first wiring line;
a second wiring line formed over the insulating film and electrically connected with the first wiring line; and
a contact hole extending though the insulating film and the third conductive layer,
wherein an upper surface of the second conductive layer is exposed at a bottom portion of the contact hole, and
wherein the second wiring line is connected with the upper surface of second conductive layer through the contact hole.

54. A display device according to claim 53, wherein the third conductive layer comprises a valve metal.

55. A display device according to claim 53, wherein the second conductive layer comprises a material containing aluminum or titanium as its main component.

56. A display device according to claim 53, wherein the wiring line is a gate line of a thin film transistor.

57. A display device according to claim 53, wherein the second conductive layer is in contact with the first conductive layer and the third conductive layer is in contact with the second conductive layer.

58. A display device comprising:
a display unit, wherein the display unit comprises:
a first wiring line including a multi-layered film comprising a first conductive layer, a second conductive layer on the first conductive layer and a third conductive layer on the second conductive layer;
an oxide film of the first, second and third conductive layers covering side surfaces and an upper surface of the first wiring line;
an insulating film covering the oxide film;
a second wiring line formed over the insulating film and electrically connected with the first wiring line; and
a contact hole extending through the insulating film, the third conductive layer and the oxide film,
wherein an upper surface of the second conductive layer is exposed at a bottom portion of the contact hole, and
wherein the second wiring line is connected with the upper surface of second conductive layer through the contact hole.

59. A display device according to claim 58, wherein the oxide film of the second conductive layer is formed by anodizing.

60. A display device according to claim 58, wherein the third conductive layer comprises a valve metal.

61. A display device according to claim 58, wherein the second conductive layer comprises a material containing aluminum or titanium as its main component.

62. A display device according to claim 58, wherein the wiring line is a gate line of a thin film transistor.

63. A display device according to claim 58, wherein the second conductive layer is in contact with the first conductive layer and the third conductive layer is in contact with the second conductive layer.

64. A display device comprising:
a display unit, wherein the display unit comprises:
a first wiring line including a multi-layered film comprising a first conductive layer, a second conductive layer on the first conductive layer and a third conductive layer on the second conductive layer;
an insulating film formed over the first wiring line;
a second wiring line formed over the insulating film and electrically connected with the first wiring line; and
a contact hole extending through the insulating film and the third conductive layer,
wherein an upper surface of the second conductive layer is exposed at a bottom portion of the contact hole,
wherein the second wiring line is connected with the upper surface of second conductive layer through the contact hole,
wherein an oxide film is formed on side surfaces of the second conductive layer, and
wherein the second conductive layer has a width different from those of the first conductive layer and the third conductive layer.

65. A display device according to claim 64, wherein the second conductive layer comprises a material containing aluminum or titanium as its main component.

66. A display device according to claim 64, wherein the third conductive layer comprises a material containing a valve metal as its main component.

67. A display device according to claim 64, wherein the first wiring line is a gate line of a thin film transistor.

68. A display device according to claim 64, wherein the second conductive layer is in contact with the first conductive layer and the third conductive layer is in contact with the second conductive layer.

69. A display device comprising:
a display unit wherein the display unit comprises:
a p-channel thin film transistor formed over a substrate, the p-channel thin film transistor comprising:
a first semiconductor layer having a first channel region, a first source region, and a first drain region;
a first gate line formed over the first semiconductor layer with a first gate insulating film interposed therebetween, and
an n-channel thin film transistor formed over the substrate, the n-channel thin film transistor comprising:
a second semiconductor layer having a second channel region, a second source region, a second drain region, and at least one impurity region between the second channel region and the second source region;

a second gate line formed over the second semiconductor layer with a second gate insulating film interposed therebetween;

wherein the impurity region partly overlaps the second gate line with the second gate insulating film interposed therebetween, and wherein each of the first and second gate lines includes a multi-layered film comprising a first conductive layer in contact with each of the first and second gate insulating films, a second conductive layer on the first conductive layer and a third conductive layer on the third conductive layer, and wherein the impurity region has a lower impurity concentration than that of the second source region.

70. A display device according to claim 69, wherein the third conductive layer comprises a valve metal.

71. A display device according to claim 69, wherein the second conductive layer comprises a material containing aluminum or titanium as its main component.

72. A display device according to claim 69, wherein the wiring line is a gate line of a thin film transistor.

73. A semiconductor device comprising:
a thin film transistor comprising a gate electrode, a gate insulating film over the gate electrode, a semiconductor layer over the gate insulating film;
a first wiring line including the gate electrode, wherein the first wiring includes a multi-layered film comprising a first conductive layer, a second conductive layer on the first conductive layer and a third conductive layer on the second conductive layer;
an insulating film covering the first wiring line;
a second wiring line formed over the insulating film and electrically connected with the first wiring line; and
a contact hole extending through the insulating film and the third conductive layer,
wherein an upper surface of the second conductive layer is exposed at a bottom portion of the contact hole, and
wherein the second wiring line is connected with the upper surface of second conductive layer through the contact hole.

74. A semiconductor device comprising:
a thin film transistor comprising a gate electrode, a gate insulating film over the gate electrode, a semiconductor layer over the gate insulating film;
a first wiring line including the gate electrode, wherein the first wiring includes a multi-layered film comprising a first conductive layer, a second conductive layer on the first conductive layer and a third conductive layer on the second conductive layer;
an insulating film formed over the first wiring line;
a second wiring line formed over the insulating film and electrically connected with the first wiring line; and
a contact hole extending through the insulating film and the third conductive layer,
wherein an upper surface of the second conductive layer is exposed at a bottom portion of the contact hole,
wherein the second wiring line is connected with the upper surface of second conductive layer through the contact hole, and
wherein the second conductive layer has a width different from those of the first conductive layer and the third conductive layer.

75. A semiconductor device according to claim 73, wherein the third conductive layer comprises a valve metal.

76. A semiconductor device according to claim 73, wherein the second conductive layer comprises a material containing aluminum or titanium as its main component.

77. A semiconductor device according to claim 73, wherein the wiring line is a gate line of a thin film transistor.

78. A semiconductor device according to claim 74, wherein the second conductive layer is in contact with the first conductive layer and the third conductive layer is in contact with the second conductive layer.

79. A semiconductor device according to claim 74, wherein the third conductive layer comprises a valve metal.

80. A semiconductor device according to claim 74, wherein the second conductive layer comprises a material containing aluminum or titanium as its main component.

81. A semiconductor device according to claim 74, wherein the wiring line is a gate line of a thin film transistor.

82. A semiconductor device according to claim 74, wherein the second conductive layer is in contact with the first conductive layer and the third conductive layer is in contact with the second conductive layer.

* * * * *